(12) United States Patent
Enright et al.

(10) Patent No.: US 11,277,938 B1
(45) Date of Patent: Mar. 15, 2022

(54) ROBOTICS EMPLOYED IN PROCESSES AND SYSTEMS FOR LIQUID IMMERSION COOLING

(71) Applicant: TMGCore, INC., Plano, TX (US)

(72) Inventors: John David Enright, Plano, TX (US); Jacob Mertel, Plano, TX (US); Taylor Monnig, Plano, TX (US); William Hadala, Plano, TX (US)

(73) Assignee: TMGCore, INC, Plano, TX (US)

(*) Notice: Subject to any disclaimer, the term of this patent is extended or adjusted under 35 U.S.C. 154(b) by 0 days.

(21) Appl. No.: 17/393,207

(22) Filed: Aug. 3, 2021

Related U.S. Application Data

(63) Continuation of application No. 17/321,938, filed on May 17, 2021, which is a continuation of application No. 17/020,500, filed on Sep. 14, 2020, now Pat. No. 11,013,144, which is a continuation-in-part of application No. PCT/US2019/060759, filed on Nov. 11, 2019, and a continuation of application No. 16/576,191, filed on Sep. 19, 2019, now Pat. No. 11,129,298, and a continuation of application No. 16/576,285, filed on Sep. 19, 2019, now Pat. No. 10,617,032, and a continuation of application No. 16/576,405, filed on Sep. 19, 2019, now Pat. No. 10,653,043, and a continuation of application No. PCT/US2019/051924, filed on Sep. 19, 2019, and a (Continued)

(51) Int. Cl.
*H05K 7/20* (2006.01)
*B25J 9/02* (2006.01)
*H01L 23/44* (2006.01)

(52) U.S. Cl.
CPC ............ *H05K 7/203* (2013.01); *B25J 9/026* (2013.01); *H01L 23/44* (2013.01)

(58) Field of Classification Search
CPC ............ H05K 7/203; H05K 7/20809; H05K 7/20236; H05K 7/20772; H05K 7/20818; H05K 7/20318; H05K 7/20327; H05K 7/20272; H05K 7/20836; H05K 7/20381; H05K 7/20281; H05K 7/20309; H05K 7/20936; H05K 7/208; H05K 7/20736; H05K 5/068; G06F 1/20; G06F 2200/201; G06F 1/206; G06F 1/181; H01L 23/44; H01L 23/473; H01L 2225/06589; B25J 11/008; B25J 9/1664; B25J 9/1674; B25J 19/023; B25J 13/089; B25J 9/161; B25J 9/162; B25J 9/1661; B25J 15/0047
USPC ......... 361/699, 700, 701, 679.53, 698, 704, 361/719, 696, 715, 691; 257/714, 257/E23.098, 715, E23.1; 165/104.33, 165/80.4, 104.21, 80.5, 104.19, 80.2, 165/104.27, 104.22, 244, 281, 911
See application file for complete search history.

(56) References Cited

U.S. PATENT DOCUMENTS

| | | | | |
|---|---|---|---|---|
| 9,597,801 B2 * | 3/2017 | Morrill | ................. | B25J 9/0093 |
| 2015/0070846 A1 * | 3/2015 | Shelnutt | ................. | H05K 7/203 361/700 |

(Continued)

*Primary Examiner* — Mandeep S Buttar
(74) *Attorney, Agent, or Firm* — Hunton AK, LLP

(57) ABSTRACT

A two-phase liquid immersion cooling system is described in which heat generating computer components cause a dielectric fluid in its liquid phase to vaporize. Advantageously an absorption/desorption unit is employed having a carbon element and a controller configured to regulate the absorption unit. Robotic components facilitate automation.

13 Claims, 52 Drawing Sheets

Related U.S. Application Data continuation of application No. 16/576,239, filed on Sep. 19, 2019, now Pat. No. 10,624,237, and a continuation of application No. 16/576,309, filed on Sep. 19, 2019, now Pat. No. 10,694,643, and a continuation of application No. 16/576,363, filed on Sep. 19, 2019, now Pat. No. 10,969,842, and a continuation of application No. 16/283,181, filed on Feb. 22, 2019, now Pat. No. 10,477,726, said application No. PCT/US2019/051924 is a continuation of application No. 16/165,594, filed on Oct. 19, 2018, now Pat. No. 11,102,912.

(60) Provisional application No. 62/897,457, filed on Sep. 9, 2019, provisional application No. 62/875,222, filed on Jul. 17, 2019, provisional application No. 62/815,682, filed on Mar. 8, 2019, provisional application No. 62/768,633, filed on Nov. 16, 2018, provisional application No. 62/746,254, filed on Oct. 16, 2018, provisional application No. 62/733,430, filed on Sep. 19, 2018.

(56) References Cited

U.S. PATENT DOCUMENTS

| | | | |
|---|---|---|---|
| 2018/0215041 A1* | 8/2018 | Morrill | B25J 9/1664 |
| 2020/0081439 A1* | 3/2020 | Mukherjee | B25J 15/0047 |

* cited by examiner

ROBOTICS EMPLOYED IN PROCESSES AND SYSTEMS FOR LIQUID IMMERSION COOLING

CROSS-REFERENCE TO RELATED APPLICATIONS

This application is a continuation of U.S. patent application Ser. No. 17/321,938 filed May 17, 2021 which application is a continuation of U.S. patent application Ser. No. 17/020,500, filed Sep. 14, 2020, now U.S. Pat. No. 11,013,144 which is a continuation of PCT/US2019/60759. This application claims priority to PCT/US2019/060759 filed Nov. 11, 2019 and PCT/US2019/051924 filed Sep. 19, 2019 which claims priority to the following U.S. application Ser. No. 16/576,239 filed Sep. 19, 2019, Ser. No. 16/576,309 filed Sep. 19, 2019, Ser. No. 16/576,191 filed Sep. 19, 2019, Ser. No. 16/576,405 filed Sep. 19, 2019, Ser. No. 16/576,285 filed Sep. 19, 2019, and Ser. No. 16/576,363 filed Sep. 19, 2019, 62/897,457 filed Sep. 9, 2019, 62/875,222 filed Jul. 17, 2019, 62/815,682 filed Mar. 8, 2019, Ser. No. 16/283,181 filed Feb. 22, 2019, 62/768,633 filed Nov. 16, 2018, Ser. No. 16/165,594 filed Oct. 19, 2018, 62/746,254 filed Oct. 16, 2019, and 62/733,430 filed Sep. 19, 2018. All of the aforementioned applications are incorporated herein by reference.

FIELD OF THE INVENTION

The present inventions are directed to liquid immersion cooled computing systems, namely liquid immersion cooled computing systems utilizing pressure and/or vapor management.

SUMMARY OF THE INVENTION

Traditional computing and/or server systems utilize air to cool the various components. Traditional liquid or water cooled computers utilize a flowing liquid to draw heat from computer components but avoid direct contact between the computer components and the liquid itself. The development of electrically non-conductive and/or dielectric fluid enables the use of immersion cooling in which computer components and other electronics may be submerged in a dielectric or electrically non-conductive liquid in order to draw heat directly from the component into the liquid. Immersion cooling can be used to reduce the total energy needed to cool computer components and may also reduce the amount of space and equipment necessary for adequate cooling.

In disclosed embodiments of the invention described below, the use of vapor and pressure management systems, as well as power management systems may be utilized, individually or in combination, to create significantly improved computer systems utilizing liquid immersion cooling.

Embodiments of the disclosed inventions relate to a pressure controlled vessel which may be used to house a liquid immersion cooled computing system. In some embodiments, the pressure controlled vessel contains a sufficient quantity of liquid dielectric fluid to substantially immerse heat generating computer components and also contains an atmosphere comprising gaseous dielectric fluid. Embodiments further comprise a condensing system in order to cool and convert gaseous dielectric fluid to liquid dielectric fluid. The disclosed pressure management system allows the disclosed embodiment to operate under a vacuum, thereby reducing the temperature at which dielectric fluid vaporizes and the computing system operates. Disclosed embodiments allow for increased density of computer components and/or computing power due to the improved temperature management system described.

DETAILED DESCRIPTION OF THE INVENTION

Figure 1:
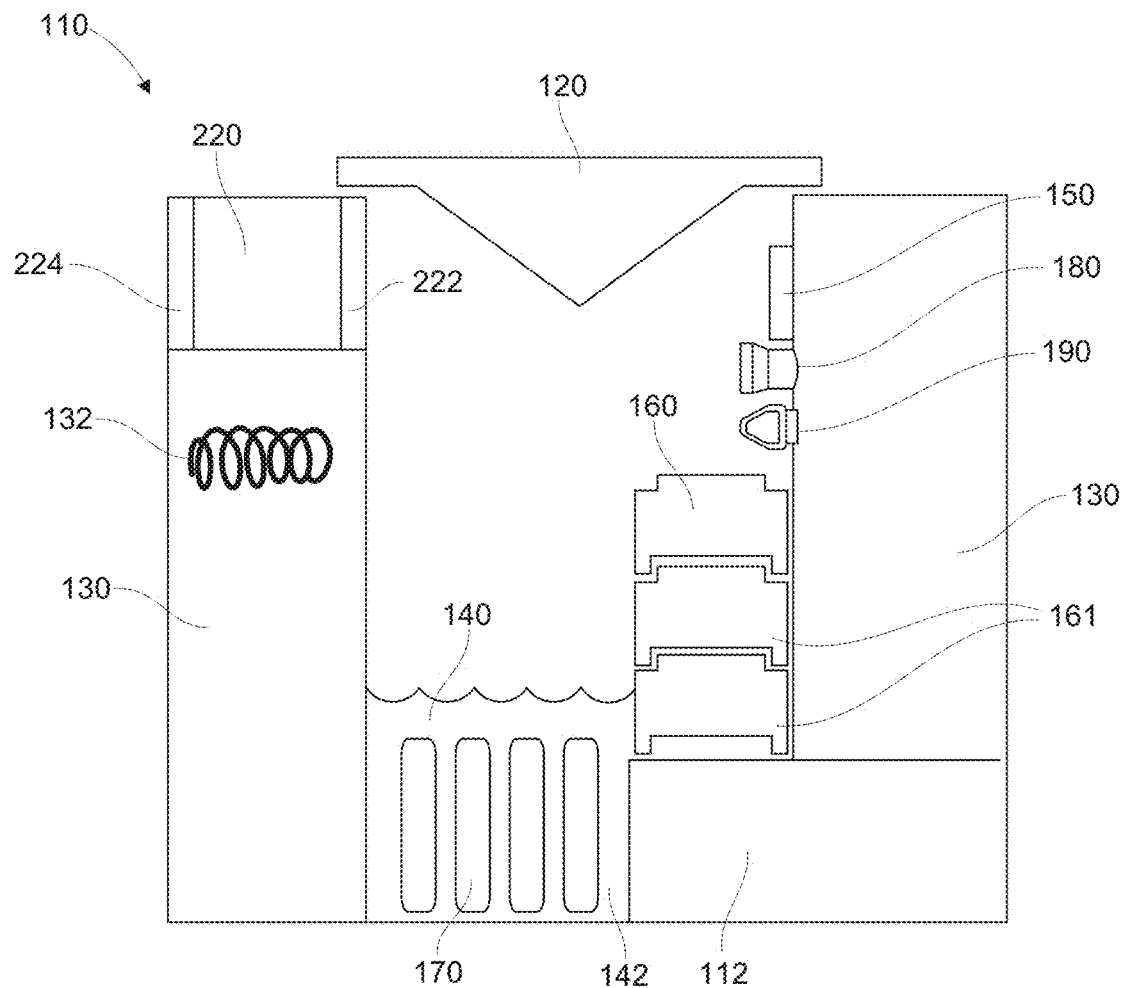
FIGS. 1-2 show a schematic of a pressure controlled vessel according to an example embodiment.

In the following description, certain details are set forth such as specific quantities, sizes, arrangements, configurations, components, etc., so as to provide a thorough understanding of the present embodiments disclosed herein. However, it will be evident to those of ordinary skill in the art that the present disclosure may be practiced without such specific details. In many cases, details concerning such considerations and the like have been omitted inasmuch as such details are not necessary to obtain a complete understanding of the present disclosure and are within the skills of persons of ordinary skill in the relevant art.

The equipment, components, systems, and subsystems of some disclosed embodiments below are described in terms of trade-names. It will be evident to those of ordinary skill in the art that the present disclosure may be practiced with many similar components whether or not such components are developed and/or sold under a particular trade name and that the features and/or limitations associated with a particular trade name components are not necessary to practice the disclosed inventions.

Dielectric Fluid

One aspect of immersion cooling is the use of a thermally conductive, but electrically substantially non-conductive or substantially dielectric fluid. Examples of such fluids include some of the Novec™ series of engineered fluids by 3M™ including Novec 7100, although the described inventions are not limited to any particular dielectric fluid. Some immersion fluids typically have a boiling point at which it is desirable to operate the cooled computer components. All computer components as well as other aspects of the disclosed systems are preferably made of materials which are not soluble and do not otherwise breakdown within the pressure controlled vessel when in contact with the dielectric fluid. In some embodiments, the boiling point of the dielectric fluid at standard atmospheric pressure may be less than about 100° C., or less than about 80° C., or less than about 60° C., or less than about 50° C. or even lower. In some embodiments, the boiling point of the dielectric fluid at standard atmospheric pressure is greater than about 60° C. or greater than about 40° C., or greater than about 30° C. or greater than about 20° C. Certain embodiments of immersion cooling fluids generally have a low vapor pressure. Some embodiments of immersion cooling fluids are fluorocarbons and/or fluorinated ketones. Certain embodiments of dielectric fluid may have a chemical formula of, or similar to, $(CF_3)_2CFCF_2OCH_3$, $C_4F_9OCH_3$, or $CF_3CF_2CF_2CF_2OCH_3$. Certain dielectric fluids comprise hydrofluoro ethers, methoxy-nonaflurobutane.

Other desirable characteristics of immersion cooling fluids include low toxicity, non-flammable, and/or low surface tension. In some embodiments, the immersion cooling fluid does not substantially harm computer components and/or the connections, wires, cables, seals and/or adhesives associated with computer components at the pressures and temperatures utilized for liquid immersion cooling. Some dielectric fluids have a dielectric constant ranging from about 1.8 to about 8 and a dielectric strength of about 15 megavolts per meter (MV/m). In some embodiments, dielectric fluids have a dielectric strength of at least about 5 MV/m, or at least about 8 MV/m, or at least about 10 MV/m, or at least about 12 MV/m. In some embodiments, dielectric fluids have a dielectric strength of at most about 3 MV/m, or at most about 5 MV/m, or at most about 8 MV/m. In disclosed embodiments, any liquid in contact with computer components 170 has a high enough dielectric strength to avoid damaging the computer components at the spacing and conditions of the specific application.

Some dielectric fluids have a critical heat flux of at least about 10 W/cm2, or at least about 15 W/cm2, or at least about 18 W/cm2, or at least about 20 W/cm2. Some dielectric fluids have a critical heat flux of at most about 15 W/cm2, or at most about 10 W/cm2, or at most about 8 W/cm2, or at most about 5 W/cm2.

FIG. 1 shows a schematic of a cooled computing system 110 according to an example embodiment. Embodiments of the disclosed cooled computing system 110 (or computing system, system, vessel, or pressure controlled vessel, all of which can be used interchangeably) may utilize a liquid dielectric fluid 140 to cool computer component 170 by immersing the component into a bath of the fluid. As electricity is passed through the component 170, the component 170 generates heat. As the component 170 heats up, the performance of the component may be reduced or the component may be damaged to the point of failure. It is advantageous to maintain the various computing components at a stable and relatively low temperature. In some embodiments, computer component 170 may be kept at less than about 80° C., or less than about 70° C., or less than about 65° C., or less than about 60° C., or less than about 55° C. In some embodiments, computer component 170 may be maintained at greater than about 60° C., or greater than about 50° C., or greater than about 40° C., or greater than about 35° C., or greater than about 30° C. As the computer component 170 heats up, heat is transferred to the liquid dielectric fluid 140 surrounding the component 170. When the liquid dielectric fluid reaches its boiling point, it will shift from a liquid phase into a gaseous phase and rise out of the liquid bath 142. The components 170 in the bath 142 of dielectric fluid may generally be maintained at about the boiling point of the particular dielectric fluid 140 being used.

Figure 2:
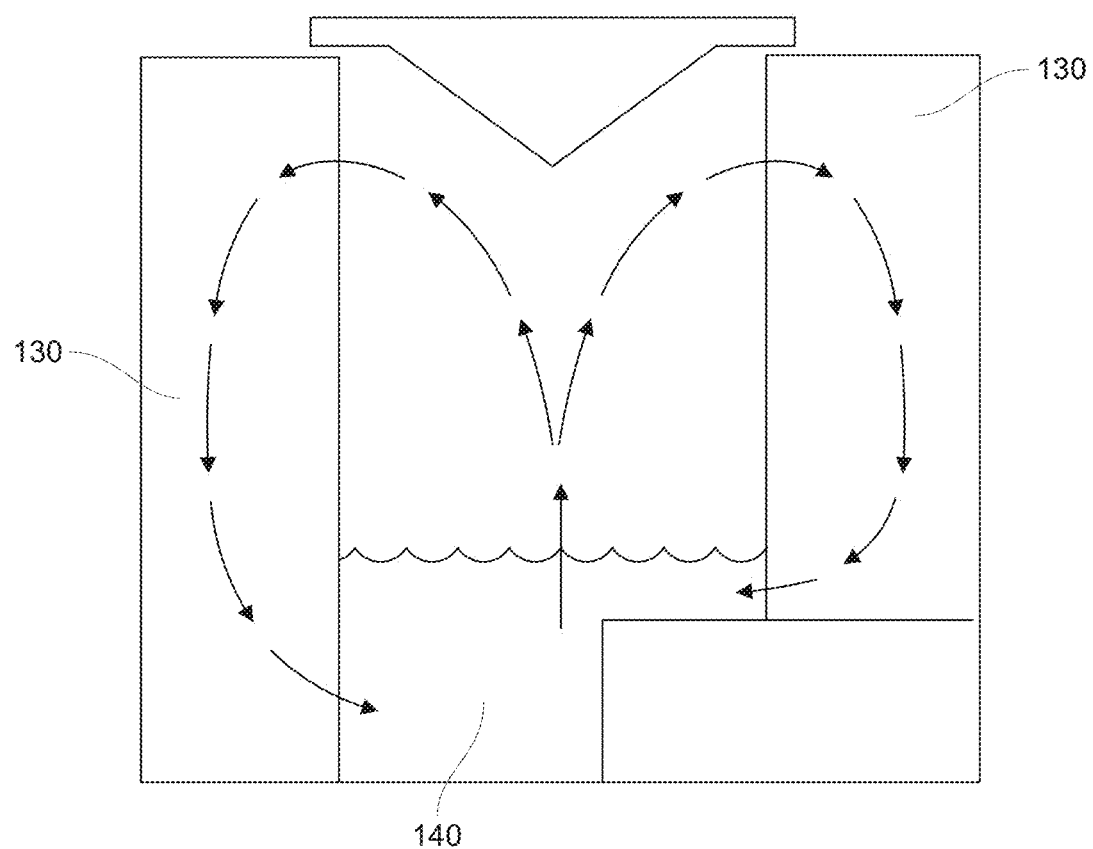

When the liquid dielectric fluid is heated to the point of vaporization at the pressure employed for a given application and becomes a gas, bubbles of the dielectric vapor will rise out of the liquid bath 142 and rise to the top of the system 110. The vapor is then cooled to be point of condensing using condenser 130. Depending on the configuration of the system 110, the heating and cooling of dielectric fluid from liquid phase to vapor phase and back, can create a convection current as shown in FIG. 2.

In some embodiments, computer component 170 will be entirely submerged within liquid dielectric fluid 140 when the system is operating. In other words, the upper portion of the computer component 170 is below the level of the dielectric liquid 140. It will be appreciated that as the heat from computer components causes the dielectric fluid to change from liquid phase to gaseous phase, small bubbles of dielectric fluid vapor will be in contact with the computer components. Such components will still be considered entirely submerged within the liquid phase of the dielectric fluid. In some embodiments, the computer component 170 may be submerged within the liquid phase of the dielectric fluid 140. In one example embodiment, if any portion of a computer component, including but not limited to a motherboard, chip, server, card, blade, any portion of a GPU or CPU, and/or any peripheral component, is in direct contact with the liquid phase of the dielectric fluid 140, the computer component will be considered to be submerged. In certain embodiments, the computer component 170 may be at least partially submerged within the liquid phase of the dielectric fluid 140. If the computer component 170 is not submerged, but is sufficiently cooled by dielectric vapor, the computer component will be considered to be at least partially submerged.

In some existing immersion cooling systems, dielectric fluid must be constantly added to the bath of dielectric fluid as the fluid is consistently boiled off. Failure to add to the dielectric fluid to the bath 142 may result in the level of the dielectric fluid in the bath 142 dropping until components are exposed to the gaseous atmosphere and not adequately cooled. This could result in decreased performance or damage to the component 170.

In some embodiments, there may be multiple operational modes which may be accounted for with a fluid management system relating to the dielectric fluid in its liquid state. These modes may include, (1) Initial filling, which is the process by which dielectric fluid is transferred from a storage system into the vessel; (2) Continuous leveling, which is the process by which additional fluid is added, or excess fluid is removed, to and from the vessel; (3) Unfilling, which is the process by which the fluid is evacuated from the vessel and placed into the storage system; and (4) Operational filtering, which is the process by which the fluid is continually cycled through a filtering system to ensure the removal of any particulates.

In some embodiments, the first three liquid management objectives, i.e., initial filling, continuous leveling and unfilling, may be accomplished through the same overall set of piping, pumps and valves. A dedicated tank for storing liquid coolant may be used for the storage of new and excess fluid which is removed and re-condensed during the vapor management process. A set of pipes and pumps may be used to bring the coolant (or dielectric fluid) from the storage system to the vessel during filling and leveling, and back out of the vessel and into the storage system during unfilling operations.

In some embodiments, the fourth of the liquid management objectives, the operational filtering, may be achieved through a series of skimmers and/or filters. The first stage may be a large particle filter located within the bottom of the vessel. The purpose of this filter is to prevent particles which are too large to be handled by the later stages from entering the rest of the system. The second stage may be a medium particulate filter which sits in-line in the piping system between the first and third stage. This second stage medium particulate filter may use a small barrel style filter to remove particulates that were too small to be removed by the first stage filter but still too large to be handled by the third stage filter. The third stage filter may consist of one or more parallel filters with support for various kinds of filter configurations. In some embodiments, the particular style of filter will be dictated by conducting an analysis of the fluid after it has been exposed and operating with a set of hardware components located within the vessel environment. Differing hardware and/or components are likely to produce differing types of particulates and chemicals which may need to be filtered to ensure the long term life and efficiency of the dielectric fluid.

Pressure Management

In general, immersion cooling fluid must be kept free of dust, water, and/or other contamination. As the computer components 170 are in direct contact with the immersion cooling fluid 140, minor contaminants can result in short circuits or damage to the computer components. Additionally, water or water vapor that may contaminate the dielectric fluid can reduce the dielectric properties, including, but not limited to the dielectric strength, of the fluid as it becomes contaminated. If the dielectric strength of the dielectric fluid is reduced, the computer components may short circuit or be otherwise damaged while in operation. One manner of reducing contamination is to operate an immersion cooling system in an enclosure which is kept at slightly higher or higher than atmospheric pressure.

As the computer components 170 operate, the heat generated from the initial use of the computer components causes some dielectric liquid 140 to vaporize into a gas. If the immersion cooling system is confined within a substantially enclosed housing, this vaporization typically increases the pressure of the atmosphere within the housing. Pressure relief valves, expanding enclosures, and/or other techniques may be used to limit the increasing pressure and/or maintain the pressure within the housing at or only slightly above atmospheric pressure. Maintaining a slight positive pressure in the enclosure may help to reduce the infiltration of dust, water vapor, or other contaminants into the immersion cooling computing system.

Current embodiments utilize an enclosed pressure controlled vessel 110 (or cooled computing system 110) enclosure to contain the computing component 170 and immersion cooling equipment, as well as the associated power supplies, networking connects, wiring connections, and the like within a pressure controlled vessel. In contrast to existing models, the pressure controlled vessel 110 may be maintained at least at a slight vacuum, thereby reducing the boiling point of the dielectric fluid 140 to a temperature below its boiling point at standard atmospheric pressure.

By operating the computing and immersion cooling system under a vacuum, the components 170 may be maintained at the reduced, low-pressure boiling point of the dielectric fluid 140. This has the benefit of increased cooling which allows for more electricity to be passed through the various components 170 resulting in greater performance of the components. By controlling the pressure in the pressure controlled vessel 110, the boiling point of the dielectric fluid 140 may also be controlled, thereby allowing the same fluid 140 to be used in a broader range of conditions. Many embodiments benefit from cooler temperatures, however certain computer components 170 have an ideal range and suffer from reduced performance at temperatures below that range. By controlling the pressure in the pressure controlled vessel 110, the boiling point of the immersion cooling fluid 140 may also be controlled. In certain embodiment, the disclosed pressure management system may be used to dynamically control the pressure, and thereby the boiling point of the dielectric fluid 140 as the computing system is initiated, shut down, or in response to other changing conditions.

In addition to reducing the boiling point of the dielectric fluid 140 by operating in a pressure controlled vessel 110 at less than ambient pressure, a computer component 170 itself may be modified in order to more efficiently transfer heat away from itself and into the dielectric fluid 140. By increasing the surface area of a component 170, for example, a chip, which is exposed to the liquid dielectric fluid 140, heat transfer between the component 170 and the bath 142 of dielectric fluid 140 may be increased. An exemplary device for increasing surface area may be a copper boiler or a copper disc, which may be adhered to a chip of other computer component 170. In certain embodiments, the adhesive used will be selected based on its ability to transfer heat and its solubility in the dielectric cooling fluid. Preferred adhesives exhibit high thermal conductivity and low solubility in the selected dielectric fluid.

FIG. 1 shows a schematic of an exemplary embodiment of the disclosed computing system. Embodiments of the disclosed systems include a pressure controlled vessel 110 (or the cooled computing system 110), a pressure controller 150, an immersion cooling system comprising at least a volume of dielectric fluid 140 and a condensing structure 130, and the desired computer components 170. A pressure system may be configured to maintain the desired degree of reduced pressure. The pressure controlled vessel 110 may be configured to maintain a negative pressure while still allowing multiple penetrations into the pressure controlled vessel 110 for various connections including, but not limited to power, data, networking, cooling water, and/or communications systems. Some embodiments utilize hermetic and/or marine grade connections. Operating a computer system within a pressure controlled vessel 110 at less than ambient pressure requires a series of modifications to the system as a whole. These modifications are discussed below and some are readily apparent to one of ordinary skill in the art.

Figure 3:
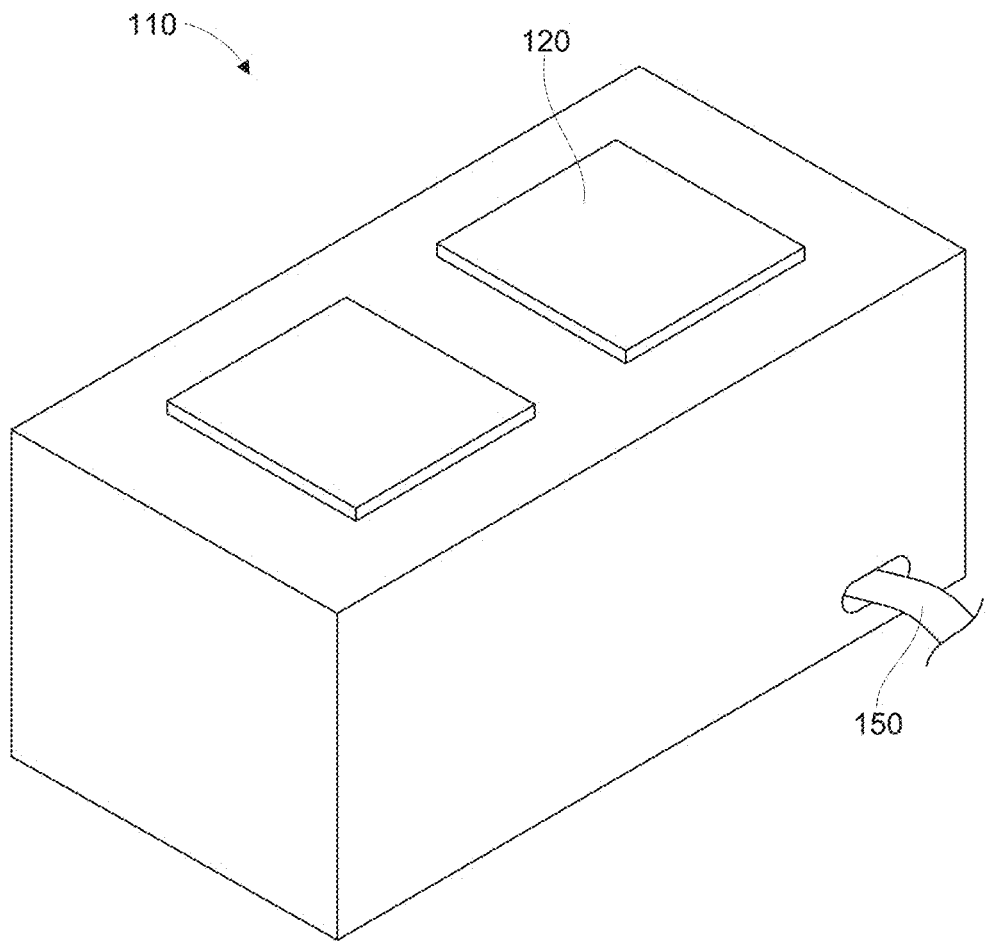
FIG. 3 shows the exterior of an exemplary embodiment of a pressure controlled vessel 110.

FIG. 3 shows the exterior of an exemplary embodiment of a pressure controlled vessel 110. In some embodiments, the disclosed pressure controlled vessel 110 is at least about 2 feet tall, or at least about 3 feet tall, or at least about 4 feet tall, or at least about 5 feet tall. In some embodiments, the pressure controlled vessel is at most about 3 feet tall, or at most about 4 feet tall, or at most about 5 feet tall.

In certain embodiments, the pressure controlled vessel has an interior volume of at least about 100 cubic feet, or at least about 150 cubic feet, or at least about 200 cubic feet, or at least about 250 cubic feet, or at least about 300 cubic feet, or at least about 350 cubic feet, or at least about 400 cubic feet.

In some embodiments, the pressure controlled vessel will be configured to contain about 12 vertical inches of liquid dielectric fluid and about 36 vertical inches of dielectric fluid vapor while in operation. In certain embodiments, the ratio of liquid volume to gaseous volume helps to create a convective current and direct gaseous dielectric vapor towards condensing structures which turn the vapor back into a liquid. In some embodiments, the pressure controlled vessel is configured to contain a ratio of a volume of liquid dielectric fluid to a volume of gaseous dielectric fluid of about 1:6 during operation. In other embodiments, the pressure controlled vessel is configured to contain a ratio of a volume of liquid dielectric fluid to a volume of gaseous dielectric fluid of about 1:3, or about 1:5, or about 1:8 or about 1:10, or about 1:15 during operation.

In one example embodiment, the pressure management system may include a pressure controller 150. The pressure controller 150 can be a source of vacuum, e.g., the pressure controller 150 may be a vacuum pump which may be connected to the pressure controlled vessel 110. In some embodiments, the vacuum pump 150 may be remote and the vacuum may be transmitted to the pressure controlled vessel 110 using piping and/or tubing. In preferred embodiments, a pressure sensor 180 is contained within the pressure controlled vessel 110 and used to regulate and/or maintain the desired negative pressure within the pressure controlled vessel 110. In some embodiments, the pressure sensor 180 and/or a pressure regulator 190 may be connected to a processor which monitors the pressure in the pressure controlled vessel 110 using the pressure sensor 180 and regulates the pressure using the pressure regulator 190.

Some embodiments comprise operator protection mechanisms. In one example embodiment, the operator protection mechanism may be a locking mechanism that precludes the system from operating if any of the lids or service panels to the pressure controlled vessel are not in place. In one example embodiment, the operator protection mechanism may include a controller to immediately power down the system in the event of an unauthorized breach of one of the doors or panels of the pressure controlled vessel. In addition to providing a life safety feature, the operator protection mechanism may also provide an enhanced operations security feature for deployments where sensitive data is housed within the vessel. By ensuring that the equipment cannot be accessed during normal operation without shutting down power to the system, a high level of assurance can be achieved in the efficiency of disk protection mechanisms. Furthermore, in some embodiments, the disk protection mechanisms may use runtime stored encryption keys to protect data at rest on the pressure controlled vessel.

In certain embodiments, in addition to denying unsafe access to the pressure controlled vessel, sensors may be placed to ensure that the system is operating as designed. The primary sensor package may include temperature sensors in the vapor space; temperature sensors in the liquid space; humidity sensors in the vapor space; and/or pressure sensors in the vapor space. These sensor readings may be monitored by software and/or by human operators to ensure that the system is operating in a safe and correct fashion. In some embodiments, the sensor data will be recorded or later analyzing.

In some embodiments, additional sensors may be incorporated within the vessel or the super structure (defined below). Such sensors could include, for example, FLIR based heat imaging cameras; VESDA or other forms of aspirating smoke detectors; and/or refrigerant leak detectors designed to detect a leak of the dielectric fluid into the surrounding environment.

In some embodiments, the vessel and/or super structure may be equipped with indicator lights relating to the operational status of the system.

Although the cooled computing system 110 is sometimes referred to as the pressure controlled system 110, one or ordinary skill in the art recognizes that many, if not all, of the benefits of the cooled computing system 110 can be realized without using a "pressure controlled system."

Vapor Management System

Liquid immersion cooling systems may be operated in different ways. Some may operate by continuously cooling the immersion fluid directly. Others may operate by allowing the liquid to reach its maximum liquid phase temperature and then boil into a vapor phase. Immersion cooling systems which operate by allowing the liquid to evaporate are called two-phase immersion cooling systems. Two-phase immersion cooling systems often allow the dielectric fluid to boil and/or vaporize and regularly add additional fluid to replace the fluid which is lost to the atmosphere.

Disclosed embodiments utilize a liquid immersion cooling system which is contained within a pressure controlled vessel 110. This has the advantage of not losing the dielectric fluid 140 even after it has converted to a gaseous form. In a closed, or substantially closed pressure controlled vessel 110, the gaseous dielectric fluid may be condensed and added back to the bath 142 of the liquid dielectric fluid 140 which is actively used to cool the computing components 170. The condensing step may be performed in any convenient manner, for example, by running process water through a thermally conductive tube. Condensing structures 130 may include radiator fins and/or similar equipment which increases the surface area of the condenser, thereby allowing greater and/or more rapid condensation of the gaseous dielectric fluid and returning it to a liquid form. In some embodiments the process water is at ambient temperature and is not actively cooled. In other embodiments, the process water may be chilled using evaporative cooling, dry cooling towers, and/or other method of chilling process water known in the art.

In some embodiments, there may be two interfaces between a pressure controlled vessel and external systems. The first may be the process water supply interface. This may be a pipe which delivers process water from a facility which provides chilled process water to a distribution manifold on the pressure controlled vessel. The second may be the process water return interface. This may be a pipe which returns the process water to the facility which provides chilled water. The process water may be returned to the facility after the process water has flowed through the pressure controlled vessel and associated cooling components. Cooling components may include, for example, condensers, condensing coils, and/or radiators within the vessel as well as coils which reject heat from the exhaust of any powered components including, for example, motors, pumps, and/or utility cabinets. In some embodiments, there may be two interfaces between a super structure and external systems. The interfaces may be similar or substantially similar to the two interfaces between the pressure controlled vessel and external systems.

In some embodiments, the location of the condensing structures 130 within the pressure controlled vessel 110 may be configured in order to optimize the flow of vapor phase dielectric fluid and increase the rate and/or efficiency of condensation. In some embodiments, the geometry of the pressure controlled vessel 110 itself may be controlled in order to increase the rate and/or efficiency of condensation.

In one example embodiment, the location of the condensing structures 130 may facilitate and optimize placement (e.g., by a robot) of the computer component 170 within the vessel (or removal of the computer component 170 from the vessel). For example, the condensing structures 130 can be placed on a side (or a sidewall) of the vessel such that the condensing structures 130 are not situated in between a lid of the vessel and the computer component 170. As such, when the lid is opened, a robot can directly remove the computer 170 without any interference with the condensing structures 130. This arrangement of the condensing structure can streamline placement and removal of the computer component 170, thereby can offer significant benefits in autonomous operation of the vessel. In one example embodiment, the condensing structures 130 can be located above a shelf within the vessel.

As shown in FIGS. 1-3, in one exemplary embodiment, a pressure controlled vessel is about 10 feet long, about 4 feet wide, and about 4 feet tall. A bath 142 may be created within the pressure controlled vessel 110 using about 130 gallons of Novec™ dielectric fluid 140. This leaves a layer of liquid dielectric fluid about 12 inches deep in an immersion cooling tank at the bottom of the pressure controlled vessel, while the majority of the pressure controlled vessel volume is gaseous. The ceiling of the pressure controlled vessel is lower in the middle of the structure running lengthwise. The ceiling and/or lid 120 angles upward and raises as it approaches the sidewalls of the pressure controlled vessel 110. Condensing structures 130 run lengthwise on two sides of the pressure controlled vessel 110. The condensing structures 130 in this exemplary embodiment may be about 12 inches wide and about 24 inches tall and run substantially the entire length of the pressure controlled vessel 110. The condensing structures 130 include radiator like material with high surface area fins which are cooled using flowing process water. Some embodiments may additionally or alternatively comprise a heat exchanger.

As shown in FIG. 2, the structural arrangement within the pressure controlled vessel 110 directs a convective flow of dielectric fluid vapor as it rises from the liquid bath 142 after boiling. The structural arrangement directs the convective flow up towards the ceiling of the pressure controlled vessel where the flow is directed toward the high surface-area of condensing structures 130 and condensed back into a liquid form. The dielectric fluid 140 then flows back into the liquid bath 142. In this manner, the total amount of dielectric fluid 140 may be conserved within this closed housing. The use of convective current to circulate dielectric fluid vapor allows disclosed embodiments to operate in the absence of a mechanical pump for circulating the dielectric liquid, thereby reducing the total energy usage of the disclosed system.

Certain embodiments may utilize additional tanks and/or storage containers of dielectric fluid which may be used during star-up and/or shut-down of the system, in the event the pressure controlled vessel must be opened, and/or to allow redundant and robust control of the level of liquid dielectric fluid.

Figure 11:
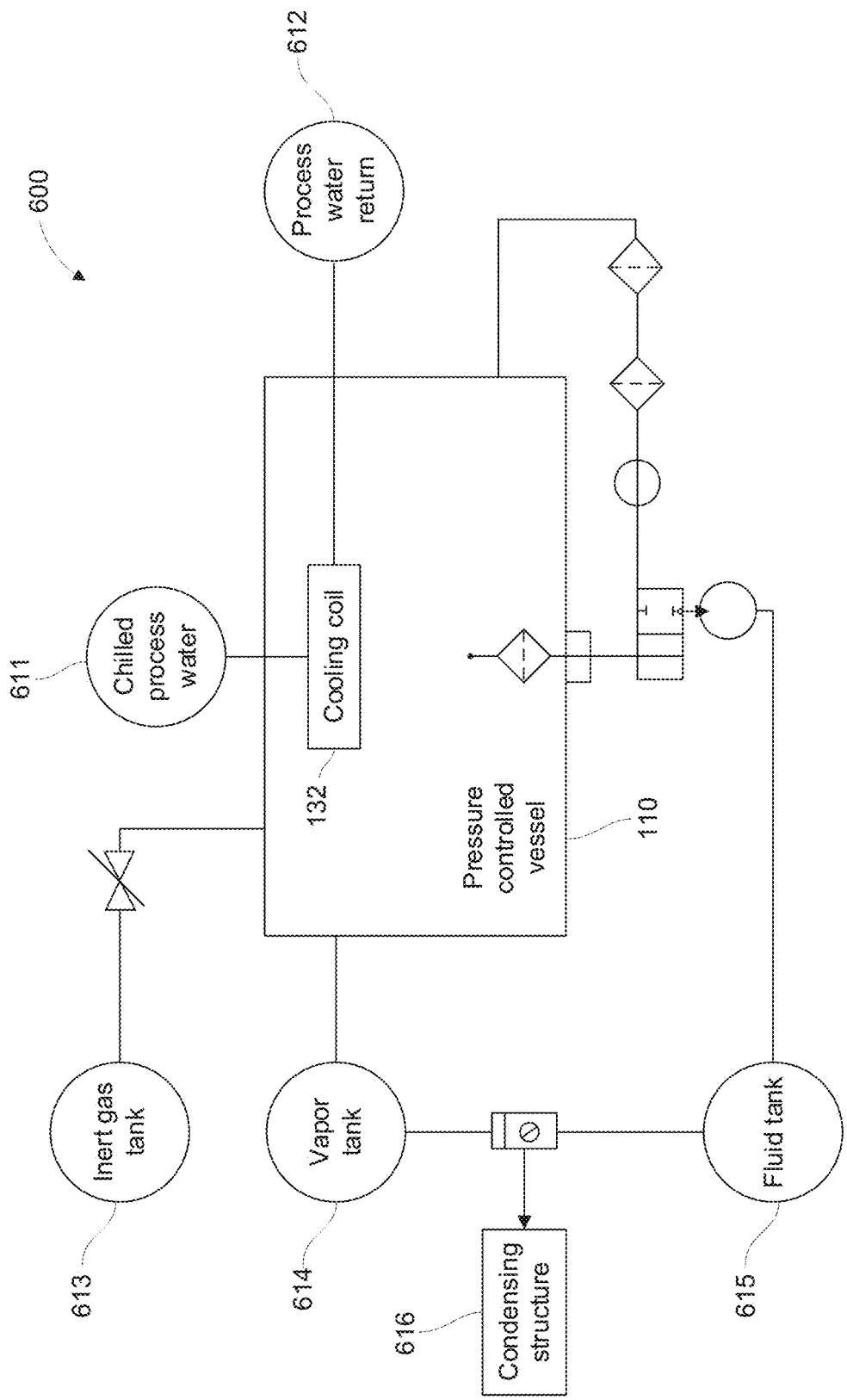
FIG. 11 shows an example cooling and vapor management system for a pressure controlled vessel.

FIG. 11 shows an example cooling and vapor management system 600 for a pressure controlled vessel 110. In this example embodiment, the cooling and vapor management system 600 can include a chilled process water storage 611, which runs through the cooling coil 132 to cause condensation of the dielectric fluid 140. After passing through the cooling coil 132, the process water can proceed to a process water return storage 612. The cooling and vapor management system 600 can also include a tank for vapor storage 614 and a tank for dielectric fluid storage 615. The tanks 614 and 615 can provide dielectric fluid or vapor when needed, e.g., during star-up and/or shut-down of the system. In one example embodiment, the tanks 614 and 615 can be coupled via a condensing structure 616. In case there is an excess supply of vapor in the tank 614, the condensing structure 616 can remove the vapor and add it as dielectric fluid to the fluid storage tank 615.

In some embodiments, during operation, the pressure controlled vessel is maintained at about 3 psi less than ambient atmospheric pressure which helps to reduce the boiling point of the dielectric fluid and thereby reduce the operating temperature of the computer chips and other components. In some embodiments, the pressure controlled vessel 110 is maintained at least at about 2 psi below ambient pressure or at least about 4 psi, or at least about 6 psi, or at least about 8 psi, or at least about 10 psi below ambient pressure.

In some embodiments, it will be necessary to select components with some degree of tolerance for pressure fluctuations. It would be preferable, to use components which can withstand a wide degree of pressures to allow for manipulation of the coolant boiling point, and as such the general operating temperature of the overall system, by adjusting the operating pressure of the system. Given the operating nature of the two-phase system, standard operating conditions for some embodiments would see a variance of between ±4 PSIg. In certain conditions, such as during a rapid startup or shutdown of the system, a difference of three additional PSIg may be experienced. In some embodiments, system level adjustments can be made to better control these variables and keep them within a more controlled and defined range.

In certain embodiments, the computer components 170 are operated at least at about 3% less than ambient pressure, or at least about 5%, or at least about 10%, or at least about 15%, or at least about 20%, or at least about 25%, or at least about 30% less than ambient pressure.

In some embodiments, the pressure controlled vessel is maintained, during operation at less than about 750 torr, or at less than about 710 torr, or less than about 650 torr, or less than about 600 torr, or less than about 550 torr, or less than about 500 torr, or less than about 450 torr, or less than about 400 torr, or lower. In some embodiments, the pressure controlled vessel is maintained, during operation at greater than about 650 torr, or greater than about 600 torr, or greater than about 550 torr, or greater than about 500 torr, or greater than about 450 torr, or greater than about 400 torr, or greater than about 300 torr.

Some embodiments utilize a vapor scrubbing process and/or initial purging process in order to control the gaseous atmosphere within a pressure controlled vessel. This process removes a portion of the gaseous atmosphere from the pressure controlled vessel and removes undesirable portions of the atmosphere such as air and water vapor. These, and other non-desirable portions of the atmosphere may be separated based on the temperature at which the vapor condenses into a liquid. Due to the specialized nature and boiling point of the dielectric fluid, many naturally occurring contaminants may be removed using this method. Removing the non-readily condensable fluids helps to maintain the purity of the dielectric fluid. A fluid will be considered to be not readily condensable if the condensation point of the fluid is greater than about 20° C. lower than the condensation point of the dielectric fluid at standard atmospheric pressure or if the condensation point of the fluid is less than 10° C. at standard atmospheric pressure.

During maintenance, startup and/or shut down operations, a blanket of inert gas, such as nitrogen, gas may be introduced into the pressure controlled vessel in order to reduce the amount of dielectric fluid lost when the pressure controlled vessel is opened and/or exposed to atmospheric conditions. As shown in FIG. 11, the cooling and vapor management system 600 can include an inert gas tank 613, which can supply inert gas to reduce dielectric fluid loss.

Some disclosed embodiments may include a substantially self-contained server and/or computing system. In some embodiments, specialized seals and/or connections may be utilized to reduce the total number of penetrations into the pressure controlled vessel 110. Some embodiments combine power, water, vacuum, and networking connections into a bundle of lines in order to minimize the penetrations into the pressure controlled vessel in order to reduce the potential for leaks while the system is under vacuum.

Figure 4:
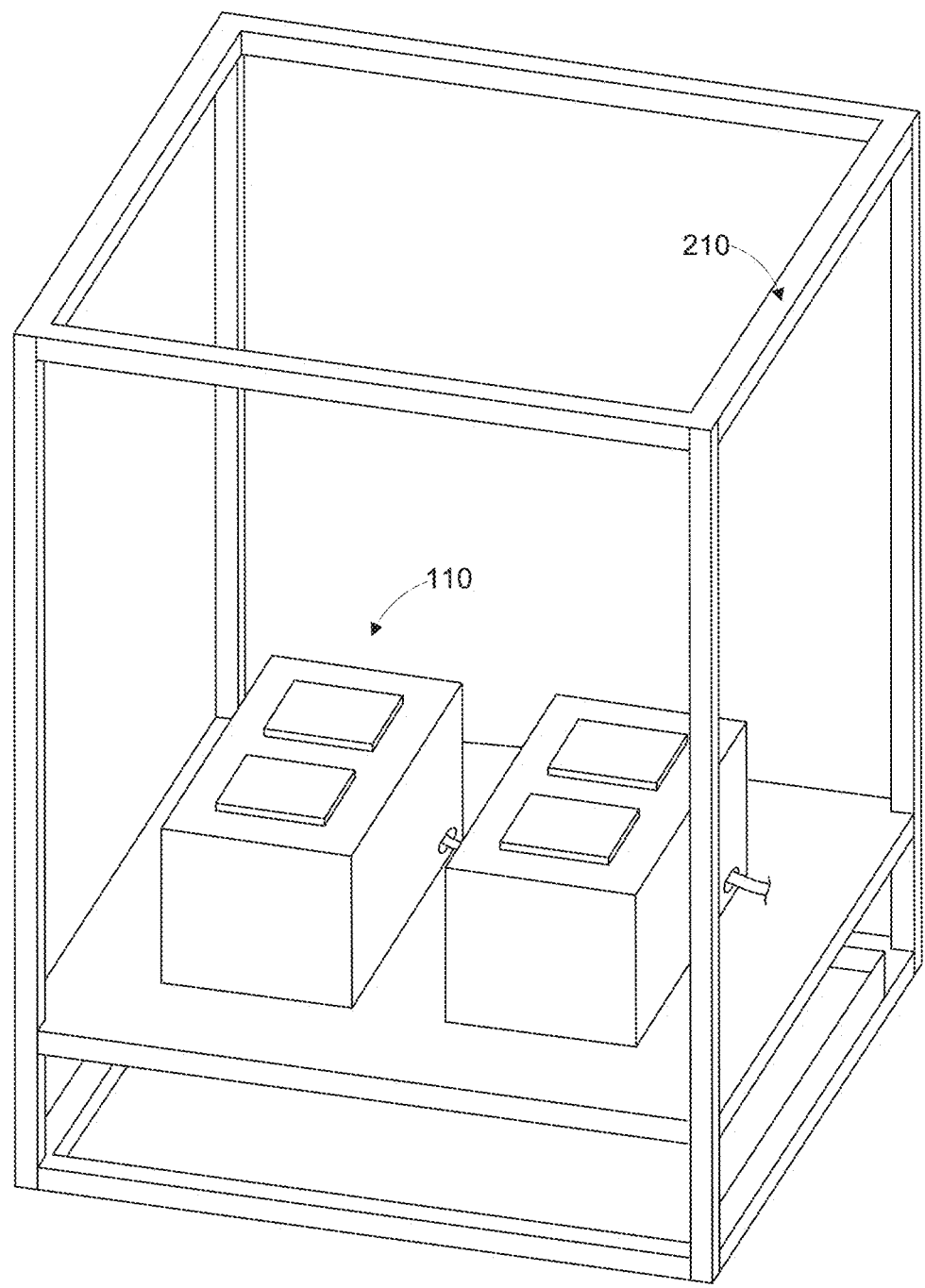
FIG. 4 depicts an exemplary embodiment of a super structure containing multiple pressure controlled vessels.

FIG. 4 depicts an exemplary embodiment of a super structure containing multiple pressure controlled vessels. In this example embodiment, two pressure controlled vessels 110 are pre-plumbed, pre-wired and housed within a modular super structure 210. This allows for embodiments to be pre-fabricated and delivered as substantially complete, self-contained systems. The modular system may be configured to be connected to other modular embodiments of the disclosed computing system. In some embodiments, the modular super structure 210 will require only a single power connection and will be pre-wired with the appropriate electronics to supply the required voltages to the computer components and/or other electronic components.

Figure 5:
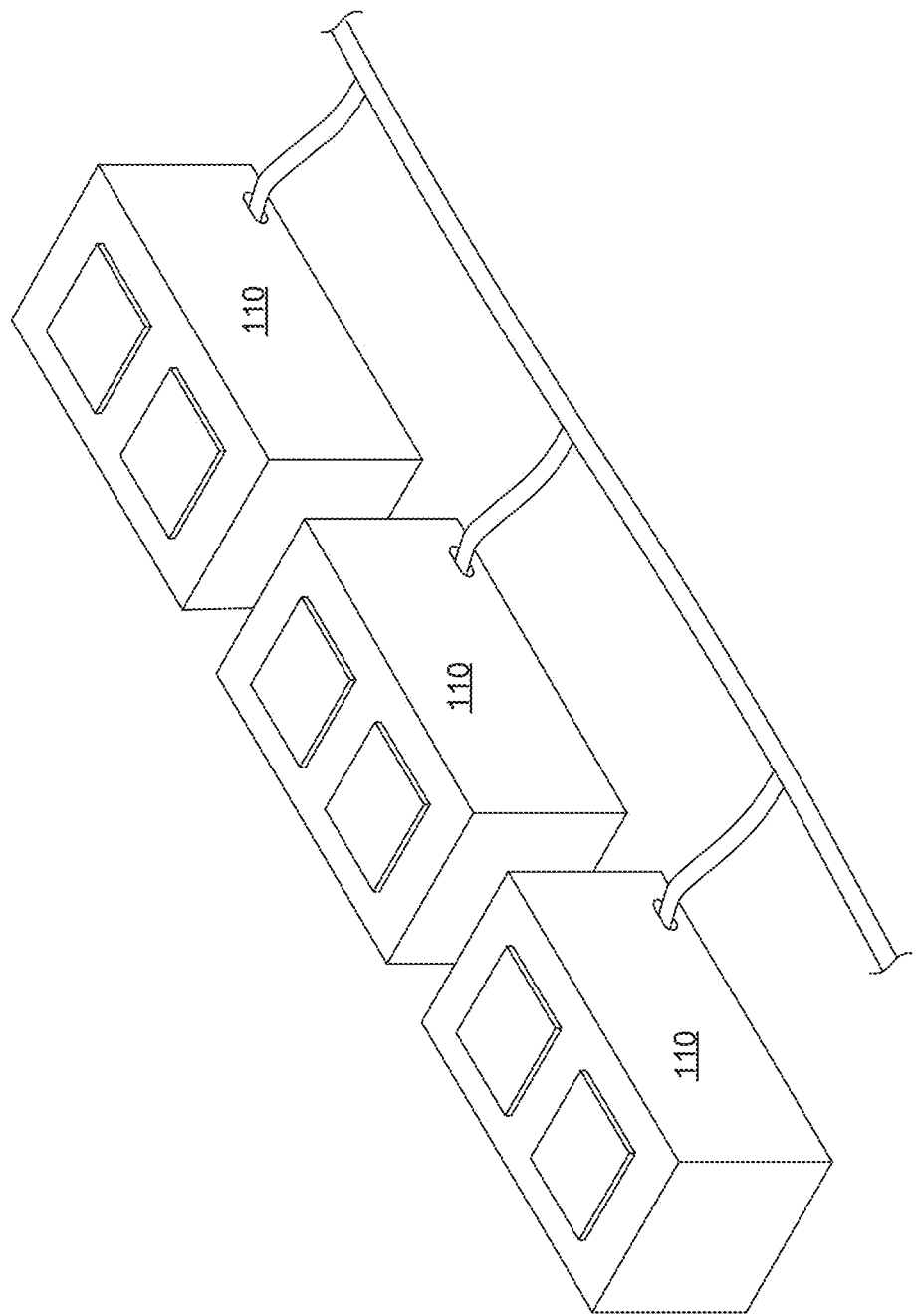
FIG. 5 depicts an exemplary data center embodiment showing multiple pressure controlled vessels connected to a central power supply.
Figure 6:
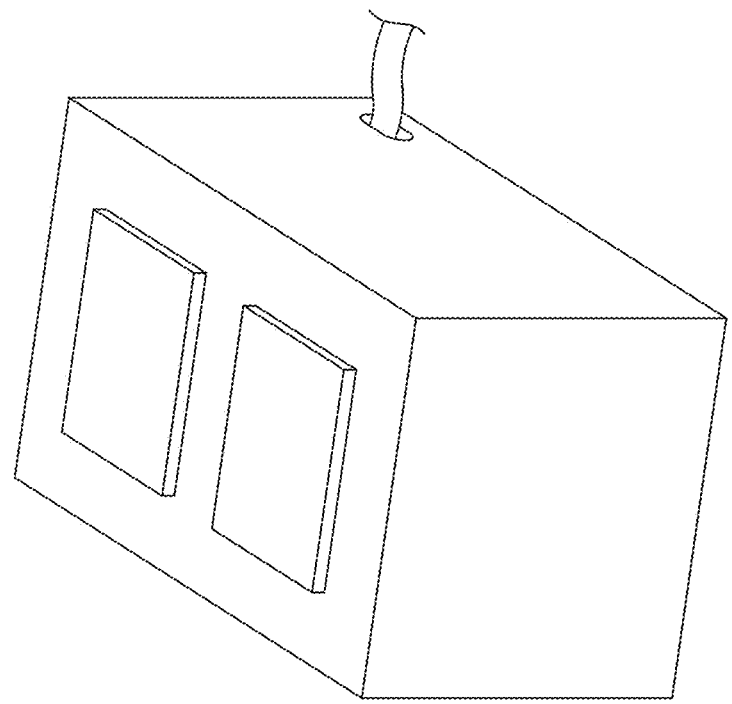
FIG. 6 depicts an exemplary data center embodiment showing multiple pressure controlled vessels connected to each other in series.
Figure 6:
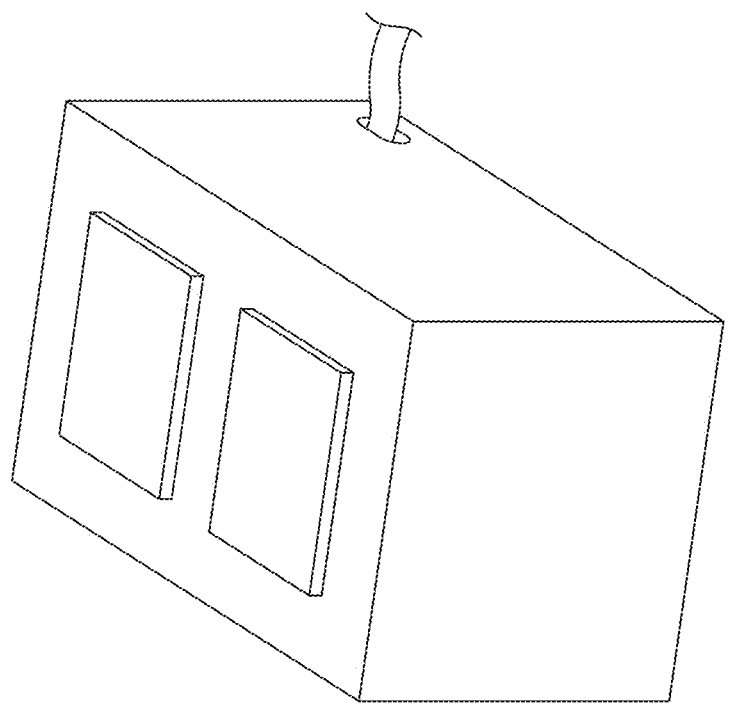
Figure 7A:
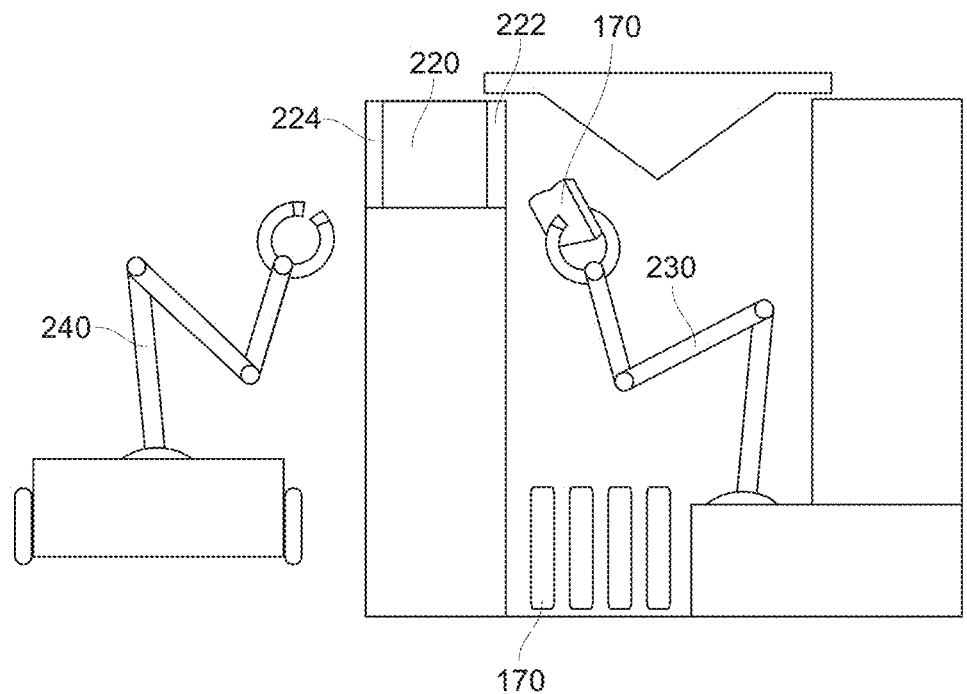
FIGS. 7A-D depict an exemplary embodiment of a cooled computing system with an interior robotic arm, airlock, and exterior robotic arm.
Figure 7B:
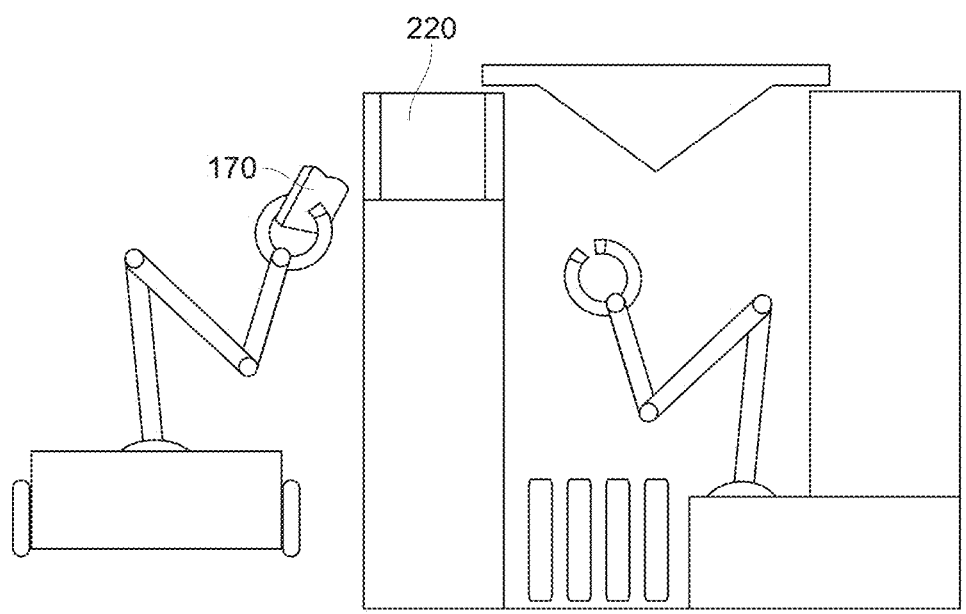
Figure 7C:
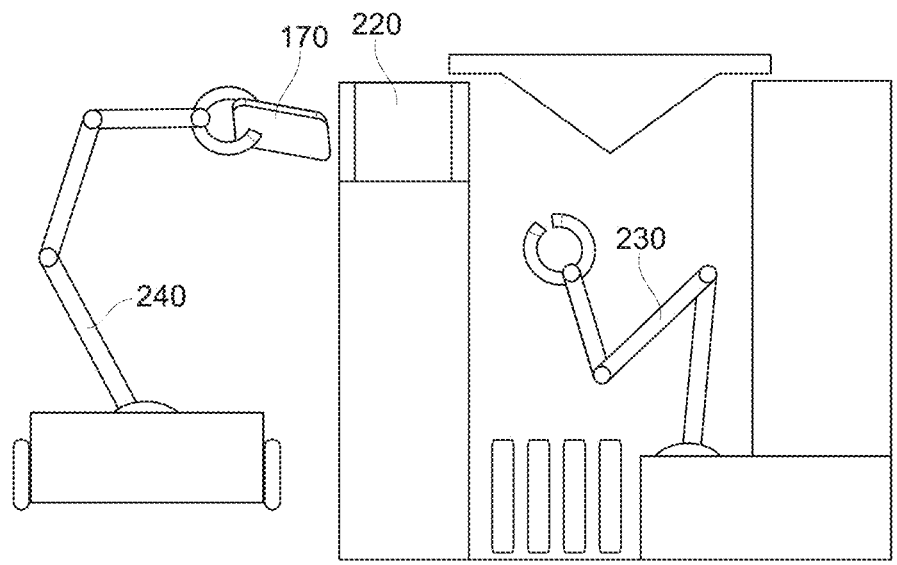
Figure 7D:
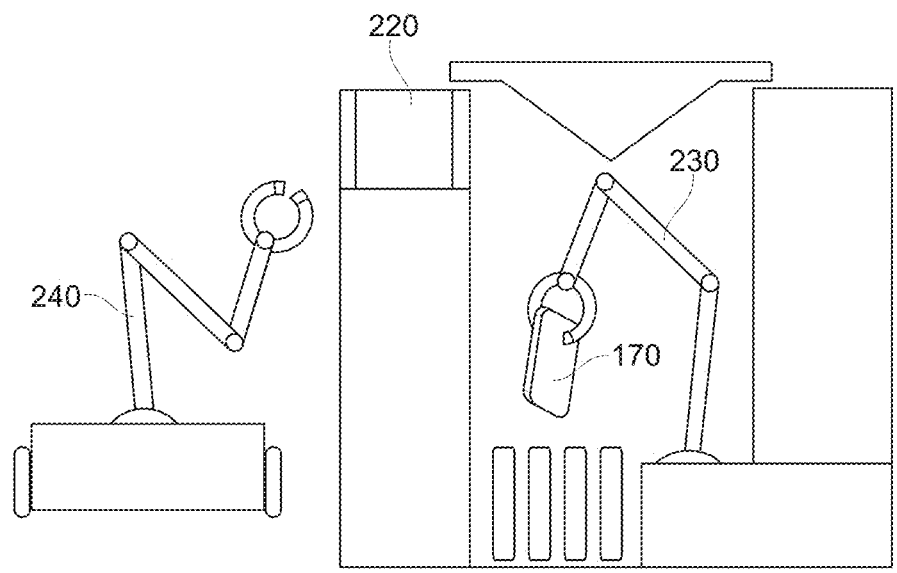

FIG. 5 depicts an exemplary data center embodiment showing multiple pressure controlled vessels connected to a central power supply. FIG. 6 depicts an exemplary data center embodiment showing multiple pressure controlled vessels connected to each other in series. In these example embodiments, the pressure controlled vessels 110 may or may not be placed within a superstructure.

FIGS. 7A-D depict an exemplary embodiment of a cooled computing system with an interior robotic arm, airlock, and exterior robotic arm. In this example embodiment, an internal robotic arm 230 contained within the pressure controlled vessel 110 may be used to remove a component 170 and deliver the removed component to an airlock 220. Using the airlock 220, the component 170 may be removed without substantially disturbing or disrupting the pressure, atmosphere, dielectric fluid, and/or the other conditions within the pressure controlled vessel 110. Once the component 170 is removed from the pressure controlled vessel 110, a replacement component may be introduced into the pressure controlled vessel 110 using the airlock 220. The replacement component may then be installed by the internal robotic arm 230. The use of components which may be installed in a "slot-in" manner, such as a blade server and chassis, may facilitate this process significantly.

A disruption to a condition within the pressure controlled vessel may be detected by a sensor, e.g., pressure sensor, placed within the pressure controlled vessel. The disruption may be indicated by at least a 10% deviation in that condition outside of the standard range of operating conditions. A significant disruption to a condition within the pressure controlled vessel may be indicated by at least a 30% deviation in that condition outside of the standard range of operating conditions.

In certain embodiments, a self-contained diagnostic program may run which analyzes the performance of the components within the pressure controlled vessel 110. If a component 170 is not performing as desired, a robotic arm 230 may be used to remove and/or replace the component automatically. In this manner a self-healing, self-contained server and/or computing system may be created. In certain embodiments, such a self-healing system may be pre-fabricated and pre-wired to create a modular unit which may be shipped or delivered to remote locations using conventional methods to provide significant high-efficiency computing power which requires limited set-up and/or maintenance.

In some embodiments, a first vapor management objective of cooling the vapor and causing it to condense from a gas state back to a liquid state is achieved entirely within the closed system of the vessel through the use of condensing coils. Process water will be piped through condensing coils within the vessel. The shape and geometry of the vessel itself will encourage the flow of vapor from the bath area to the coil area and gravity will serve to pull the re-condensed liquid back into the bath area.

In some embodiments, a second vapor management objective of monitoring and maintaining the internal pressure of the vessel is achieved through the use of integrated pressure sensors within the vessel and use of a purge system. In some embodiments, the purge system will be used to remove excess vapor from the vessel and condense it back to a liquid for storage in the liquid storage tank.

In some embodiments, a third vapor management objective of controlling and removing non-condensable components of the vapor which are present during system startup is accomplished via the same mechanism as the second objective. The purge system may be used to bring the system under pressure during its initial startup and to remove any non-condensable gases from the system.

In some embodiments, a fourth vapor management objective of controlling the overlay of an inert gas may be accomplished using a dedicated nitrogen overlay feeding system. This overlay keeps the coolant below the top of the vessel, allowing for minimization of the loss of coolant during periods where the vessel is opened to service the components therein. Dedicated piping from a set of nitrogen storage tanks through a set of dedicated overlay pipes within the vessel will allow for the adding of the inert overlay when the operator desires to open the system. This gas, along with any other non-condensables, may be removed during the non-condensable removal process which may occur at system startup. The overall vapor management process may be managed and monitored through the control system software based on user commands and system state monitoring.

Ballast Blocks

In some embodiments of the disclosed system, such as that shown in FIG. 1, the pressure controlled vessel 110 may include a deeper bath portion 142 for containing the majority of the dielectric fluid 140 and a broader shelf area 112 adjacent to the bath. The boards, cards, chips, blades, and/or any other computer components 170 are substantially contained within the deeper bath section 142 of the pressure controlled vessel 110. The broader shelf area 112 may also contain liquid dielectric fluid 140 and/or collect dielectric fluid 140 that is re-condensed into the liquid phrase from the vapor phase. In certain embodiments, the depth of the dielectric liquid in the pressure controlled vessel 110 may be increased utilizing ballast blocks 160. Ballast blocks 160 may be used to occupy undesired volume on the shelf, thereby displacing any dielectric fluid 140 that would be on the shelf 112 and raising the level of liquid without requiring the addition of additional dielectric liquid 140. In some embodiments, the ballast blocks 160 include riser feet 161 which allow fluid to flow underneath the ballast blocks 160 so that condensed liquid can continue to flow into the deeper bath portion of the pressure controlled vessel without the flow being hindered by the ballast blocks 160.

The ballast blocks 160 may be made of any material that does not interfere with the operation of the disclosed immersion cooling system. The ballast blocks may be made of materials including, but not limited to, metals, rubbers, silicone, and/or polymers. Preferred materials are not substantially soluble in the dielectric fluid. The blocks must be denser than the dielectric fluid but are not required to be solid. In preferred embodiments, the blocks will have a handle or cut out which allows the block to be more easily handled and manipulated. Some embodiments of the ballast blocks 160 utilize interlocking top and bottom sections so that the blocks maybe stacked on top of each other in a secure manner. The interlocking top and bottom reduce the risk of a block damaging any nearby component if it slides or is otherwise displaced from its intended position. In some embodiments, the interlocking top includes recessed portions which align with feet and/or risers on the bottom portion such that the lowest block does not prevent fluid flow and blocks may be securely stacked on top of the lowest block in order to occupy a significant volume, thereby allowing the level of dielectric liquid to be raised without requiring a significant amount of additional dielectric liquid to be added.

In some embodiments, the ballast blocks 160 are configured to run the entire length of the pressure controlled vessel 110 and/or shelf 112. In other embodiments, the ballast blocks 160 may be substantially any size which allows for the block to be handled. In such embodiments, multiple modular ballast blocks may be configured to displace as large or as small of a volume as desired. In some embodiments, a single ballast block has an outer dimensions of about 2 feet long or about 3 feet long or about 4 feet long or longer and about 6 inches wide, or about 8 inches wide, or about 12 inches wide, or wider, and about 1 inch tall, or about 3 inches tall, or about 6 inches tall, or about 8 inches tall or taller.

The Super Structure

The disclosed computing system consists of various components, all of which may be attached, directly or indirectly, to a physical super structure 210, as shown in FIG. 4. The super structure 210 allows for pre-wiring and pre-plumbing of any required electrical, sensor, control, power, fluid control, pressure control, and/or communication systems. This allows for faster and simplified deployment in the field and testing at the factory prior to delivery to the customer.

The super structure 210 is typically fabricated from metal components and may be skid mounted or configured to be handled with a forklift, hoist, or crane. In some embodiments, the super structure 210 is configured to fit within a standard container in order to facilitate shipping. The super structure 210 and associated components may be configured to weigh less than about 58,000 lbs total and may be divided into smaller subcomponents in order to facilitate shipping without requiring special equipment. In some embodiments, super structure 210 and the associated components will weigh less than about 50,000 lbs, or less than about 40,000 lbs, or less than about 30,000 lbs, or less than about 20,000 lbs. In some embodiments, super structure 210 and the associated components will weigh more than about 5,000 lbs, or more than about 10,000 lbs, or more than about 20,000 lbs, or more than about 30,000 lbs. Embodiments of the super structure 210 may be any size and or shape. Many embodiments are sufficiently large to contain multiple pressure controlled vessels 110, server racks 310, and the associated liquid immersion cooling equipment as well as the necessary equipment for managing power delivery and distribution and network connectivity.

The overall design of the super structure 210 can be adjusted to accommodate the unique aspects of each deployment, including customizations to the types and quantities of power and process water interconnects to meet the needs of existing facilities.

The control and management systems for all of the components within the disclosed pressure controlled vessel may be included as part of the disclosed computing system. A preferred embodiment of the disclosed system includes all of the required mechanical systems to maintain and operate a two-phase liquid immersion cooling environment, including the required pumps, valves, regulators, vapor management systems, pressure management systems, and other associated components.

The super structure 210 may be an open frame design, or may include side panels and access doors. This allows for deployment within existing structures or outside in field locations. The super structure 210 may be modified to include weatherization features, allowing for deployment in harsh environments. In some embodiments, the super structure may be a skid/module framework.

Various systems, features and/or capabilities may be incorporated into the super structure 210 to support, monitor, and manage the other components of the pressure controlled vessel and any environments contained within or associated with the pressure controlled vessel. In some embodiments, such systems may include fire detection and/or suppression capabilities, dedicated air condition and/or environmental management capabilities, security features such as access control, and/or surveillance features among many others.

The Power System

Some embodiments of the super structure 210 are designed to accept various means of electrical inputs and connect them to an existing power distribution system built within the super structure. One of many exemplary embodiments includes a 415V input to a main breaker, which is then distributed to a series of power shelves which converts the 415V AC input to 12V DC output. In preferred embodiments, this conversion occurs in substantially one conversion step, thereby reducing the lost efficiency typically associated with such conversions. Traditional computer server locations typically convert incoming industrial electricity from a high AC voltage, such as 415V to a reduced AC voltage such as 120V. This conversion results in a loss of energy to heat. Under common circumstances, this may result in about a 6% loss of energy. Then, the 120V electricity must be further converted to DC current for the use by various computer component. This second conversion results in a second, about 6% loss of energy to heat. By directly converting industrial electricity of about 415V to about 12V DC, the total loss of energy to heat can be reduced Another exemplary implementation may include the connection of a 480V AC input to a power shelf which converts the 480V AC input to 48V DC output, which is then distributed to a series of intermediary power supplies which converts the 48V DC input to various DC outputs, including, for example, 12V, 5V, 3.5V 3.3V and others.

On some implementations, there may be a single set of power supplies, or there may be multiple power supplies operating at different input and output voltages. The exact configuration will be adjusted to meet the needs of the particular equipment being installed and depending on the conditions of the application. The particular design of a power system may be adjusted to meet the needs of the particular environment in which the disclosed computing system is being deployed. Customizations may include the type, capacity, and interfaces for both input and output of power to the system.

In some embodiments, a rack power distribution system may comprise a modular power supply system and/or set of modular power supply systems. The specific configuration of the modular power system or systems is not particularly critical so long as it can deliver the desired quantity and type of power to the rack. Accordingly, modular power systems may be configured in parallel or in series or in a combination thereof to provide one or two or even multiple power distribution pathways. The specific pathways to the rack may be direct or indirect and often may depend upon the components involved, power quantity and type, and/or desired configuration. If desired, the pathway to the rack may involve distributing power to a chassis located within the rack. The power distributed may be delivered at one or more desirable voltages which may vary depending upon the configuration and components. In some cases desirable voltages may include, for example, 12V, 5V and/or 3.5V. In some embodiments, if a chassis is employed, then it may employ one or more subsystems. Such subsystems may include any desired subsystem that does not interfere with the desired quantity and type of power to be delivered to the rack. As but one example a power-on-package subsystem may be employed. Such a package may accept AC current and convert to DC current and/or vice versa depending on what is desired. For example, a particularly useful power-on-package subsystem may be designed to accept input power at 208, 240, 380, 400, 415, 480, and/or 600 volts AC and convert that power directly to DC power, e.g., 48V DC.

Figure 17:
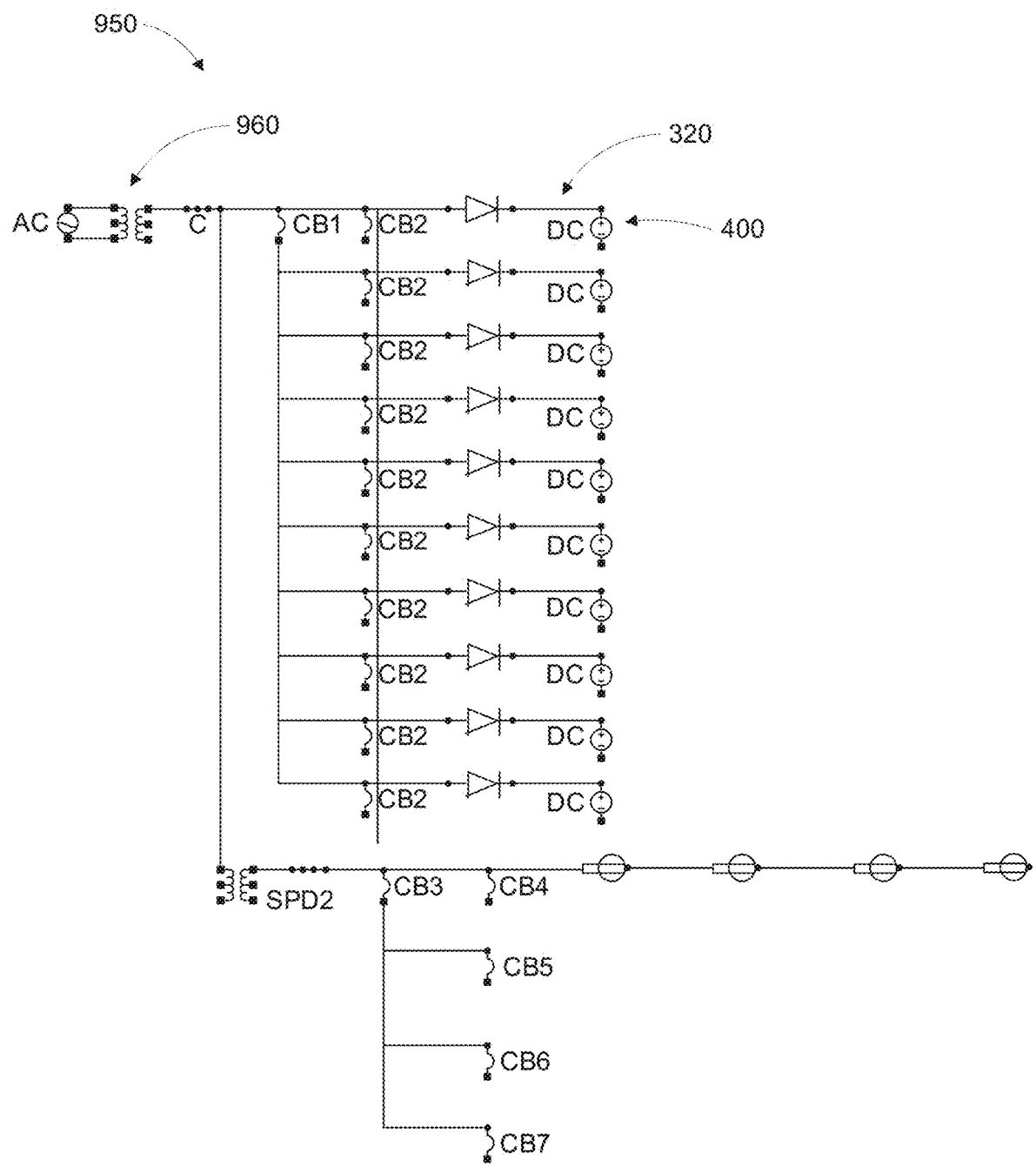
FIG. 17 shows an exemplary embodiment of a rack power distribution system.

The modular power supply system or systems may be powered directly or indirectly in any convenient manner. For example, a modular power supply system may be powered directly via a primary electrical distribution system within the chassis. Depending on the type and quantity of power and other components, a chassis could use an interface, such as a set of spring loaded pins or other suitable connector interface to establish electrical continuity between the power distribution pathway and the chassis itself. Continuity could then be established between that interface connector and any desired power supply input interface on desired servers or other computing components located on the chassis. In some embodiments, a power-on-package module may be utilized within each chassis to convert the voltage to the appropriate levels directly at the chassis itself. This could be used for various types of power distribution but may be especially useful with, for example, 48V distribution. FIG. 17 shows an exemplary embodiment of a rack power distribution system 950. In this example embodiment, a rack 310 can receive an AC input 960 at an AC interface 311 of the rack 310. The power distribution system 950 can generate a DC output 320 and distribute the DC output 320 to one or more chassis 400.

In some embodiments, ensuring supply of reliable power to the computer components within a rack is a primary concern. To that end, some embodiments use blade level power supplies or computer component level power supplies which may supply a certain input voltage and provide the required output voltage to the blade and/or component level power supplies. Some embodiments incorporate multiple power supplies into each blade to provide redundancy.

In some embodiments, one or more switches may require power. An exemplary switch may be a standard datacenter grade switch with the appropriate interfaces to connect to the backplane and provide rack level communications to each blade. Some embodiments distribute only a single voltage, and this can be accomplished by a power rail and interface system with connectors to serve as the interface between a power rail and each of the blades, delivering the voltage either directly to the power supply input rails or via an intermediary connector to sit in between the power supply power leads and a rack level voltage distribution system.

In some embodiments, there may be one or more power rails which distribute the primary voltage along the bottom of the rack. This rail may be fed from one or more primary power rectifiers, likely located outside of the pressure controlled vessel and delivered to each rack via a cable or busbar system. The use of higher voltage, for example, 48 Volts, at this level may reduce the required current carrying capacity of the distribution system and may effectively interface between the distribution rail(s) and the load interface.

In some embodiments, there will be two primary power distribution systems located within the super structure platform. The first is the Primary Equipment Power System (PEPS) and the second is the Secondary Equipment Power System (SEPS). The purpose of the PEPS is to provide electrical service to the components within the vessel. This system may be a high voltage, high current distribution system which accepts inputs via either copper conductors or busbar systems and delivers it to the primary power supplies responsible for providing operational current to the chassis, computer components and/or other critical load equipment. The power will enter the super structure at a defined point and be terminated to a master service disconnect breaker. Upstream of this point will be the electrical service and all power redundancy components used in the system. This input will be at a high voltage, such as, for example, 415 or 480 volts AC. The primary equipment load will be driven by power supplies or rectifiers which are fed from a breaker panel downstream of the master disconnect breaker.

The purpose of the SEPS is to provide electrical service to all of the infrastructure support systems and components located within the super structure. As the components required as part of the secondary equipment infrastructure may expect a lower input voltage, the SEPS may be powered by a step-down transformer which is connected upstream of the PEPS master service disconnect breaker via a secondary service disconnect.

This arrangement will allow for the super structure support and infrastructure systems, including all of those components which are powered from the SEPS, to be turned on and operate even without primary power being delivered to the remainder of the system components. All aspects of the management and control systems, as well as the vapor control system, may be able to operate independently of the operation of the PEPS.

In some embodiments, an uninterruptable power supply (UPS) is included as part of or in addition to the power distribution system. The incorporation of the UPS allows for continued operation of the disclosed computing system in the event of a temporary interruption to the external power supply.

Components of the disclosed power distribution system may include, but is not limited to, commercially available components such as, for example, uninterruptible power supplies, DC power systems, AC power systems, and/or power control and monitoring systems. Some such components may include, but are not limited to Vertiv products such as, for example, Liebert and/or Chloride UPS products, dual conversion online UPS, line-interactive UPS, stand-by UPS, lithium-ion battery UPS and combinations thereof. The UPS products may be single phase or three phase. Other exemplary power distribution system components may include, for example, Emerson Network Power products, NetSure DC power systems, Vertiv, Liebert, Chloride, and/or NetSure power distribution units and related components, such as, for example, inverters, rectifiers, transfer switches, and combinations thereof. Commercially available monitoring units, controller units, and/or software related to such components may also be incorporated into certain disclosed embodiments.

The Pressure Controlled Vessel and Pressure Management Systems

Embodiments of the disclosed system include a pressure controlled vessel which is designed to house a two-phase liquid immersion cooling system. The pressure controlled vessel 110 contains a bath 142 of dielectric cooling fluid 140, condenser 130 with cooling coils 132 to condense gaseous phase dielectric fluid into a liquid, and the physical mechanisms and/or equipment necessary to hold computer components 170 and distribute power from the power system to the equipment and components located within the pressure controlled vessel 110.

During operation, the pressure controlled vessel 110 may be kept at a slight vacuum. It will be appreciated that a variety of specialized connections and considerations must be made in order to operate a computing system within a pressure controlled vessel 110 which is maintained at a negative pressure.

Some embodiments of the disclosed system use a series of fiber optic Media Transfer Protocol (MTP) interfaces allowing connectivity of fiber into the pressure controlled vessel 110 in addition to break out panels and cable trays to distribute the fiber to the racks 310. This arrangement reduces the total number of penetrations into the pressure controlled vessel 110 reducing the likelihood of leaks in the vessel.

Some embodiments of the pressure controlled vessel 110 include sensors to ensure safe operation. These sensors may include, but are not limited to, temperature sensors, fluid level sensors, pressure sensors 180, gaseous partial pressure sensors, position sensors, electrical sensors, microphones, and/or cameras to ensure and/or automate operations of the system.

In one example embodiment, temperature sensors may include, but not limited to, sensors for measuring the temperature of the gaseous phase within the pressure controlled vessel 110, sensors for measuring the temperature of the liquid phase within the pressure controlled vessel, sensors for measuring the temperature water and/or other process fluids, and/or sensors for measuring the temperature of the other components including the computer components 170. In some embodiments, thermocouples, thermistors, and/or silicone sensors may be utilized to measure the temperature of computer components. In some embodiments, the system may rely on information provided by the components themselves and retrieved or monitored through the use of a generally accepted communications protocol, such as a device provided API or other programmatic interface, such JSON via HTTPT or SNMP, to determine the equipment temperature.

Some embodiments may include various life safety features to ensure the safety of users. These features may include, but are not limited to, automatic electromagnetic locking mechanisms, fail safe systems, fire and/or smoke detection and/or suppression systems, ventilation systems, and/or back up lighting. In certain embodiments, these features may be incorporated as part of a comprehensive platform.

Certain embodiments include an automatic vapor detection based leak detection system to ensure that any loss of fluid in the pressure controlled vessel is rapidly detected. These systems may include pressure sensors 180 within the pressure controlled vessel 110 which monitors the pressure in order to ensure there are no substantial leaks and/or gas sensors positioned on the exterior of the pressure controlled vessel which detect the presence of any dielectric vapor which may have leaked out of the pressure controlled vessel.

The particular design, arrangement, and/or layout of an embodiment of the disclosed system may be adjusted based on the conditions in which it is deployed. In some embodiments, the size, material, internal systems, component mounting and configuration options, interfaces between the pressure controlled vessel 110, the computer components 170, and power systems may all be adjusted based on the conditions in which the system is utilized.

The Rack System

Figure 8A:
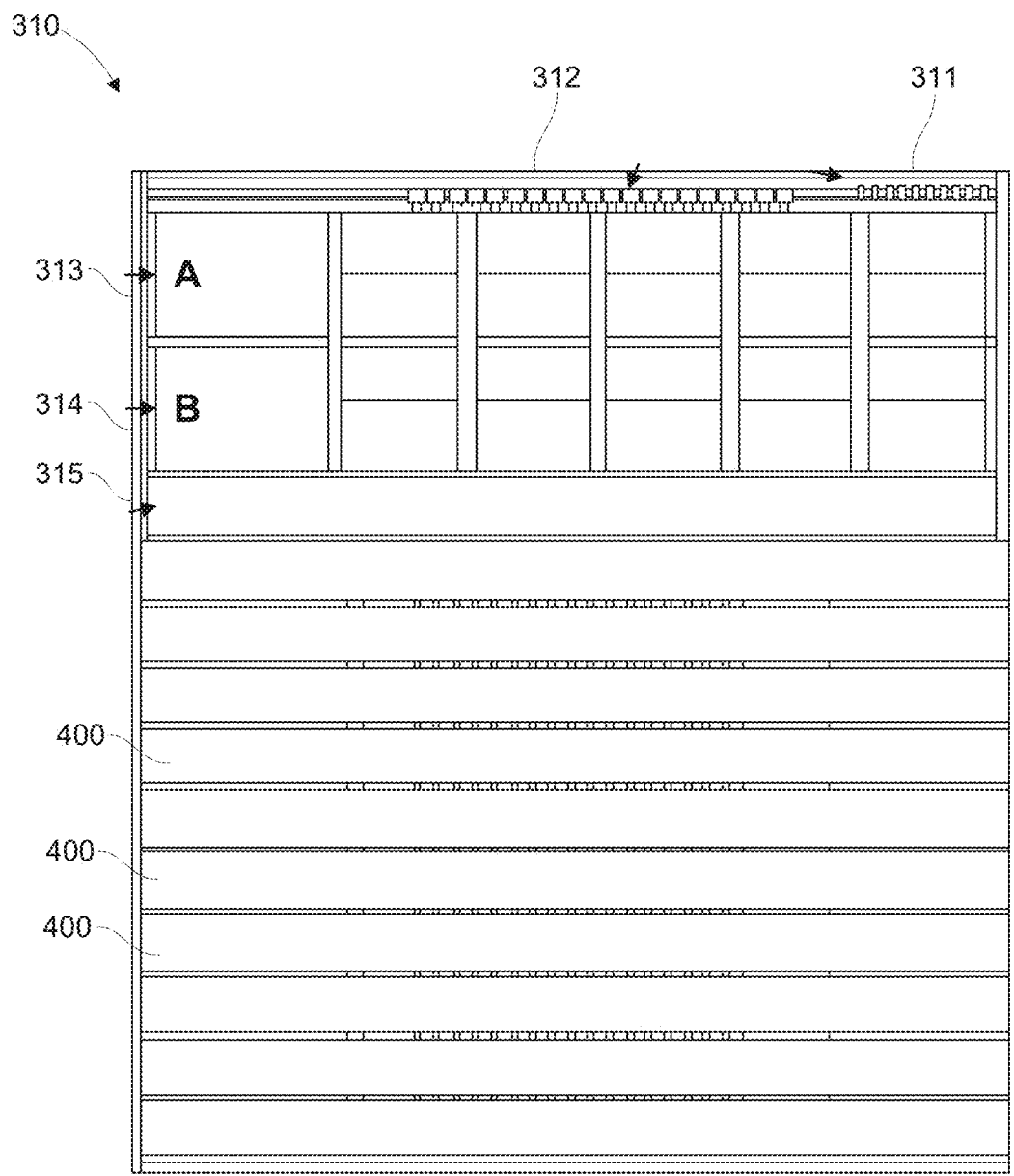
FIGS. 8A-C show an example embodiment of a rack system.
Figure 8B:
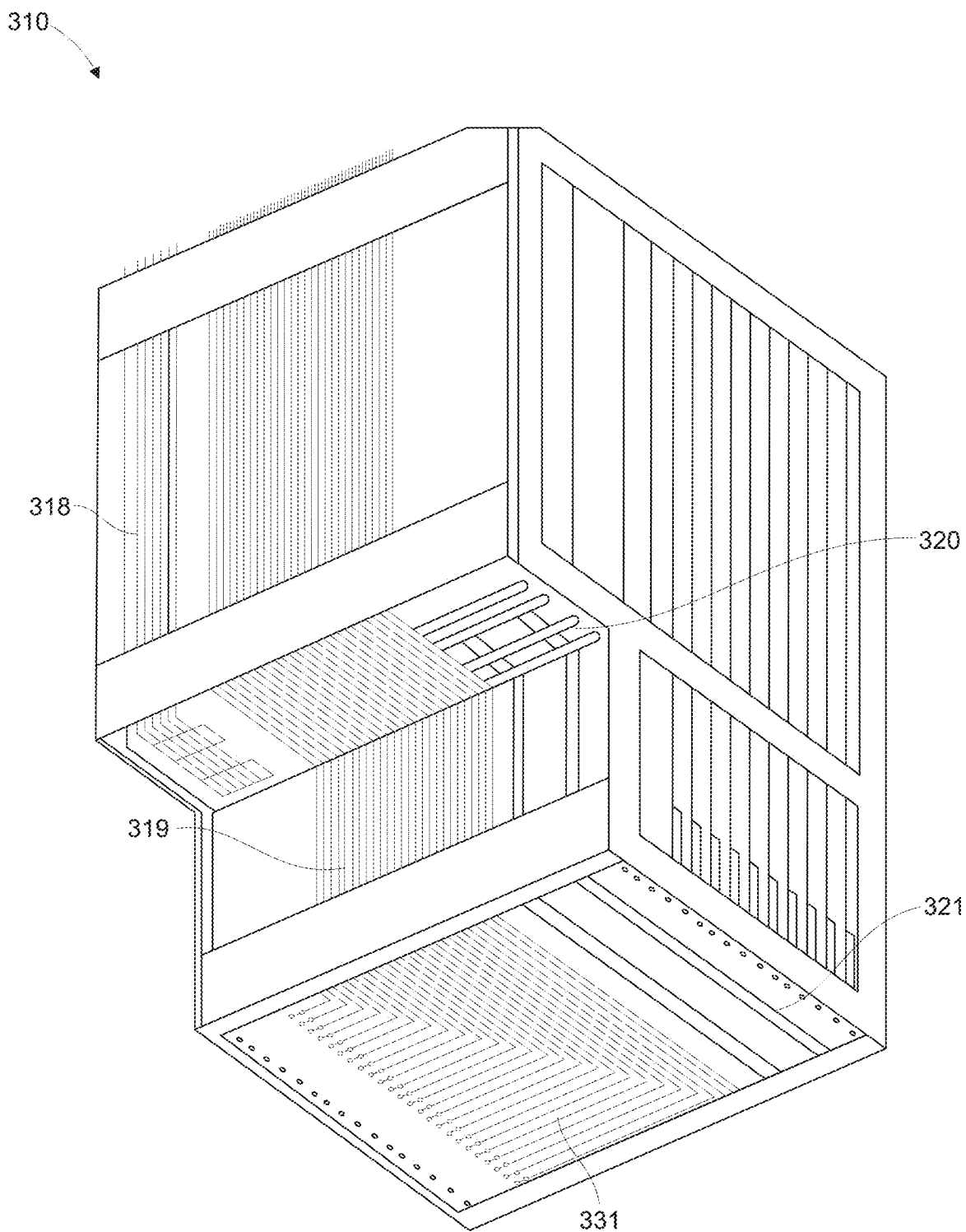
Figure 8C:
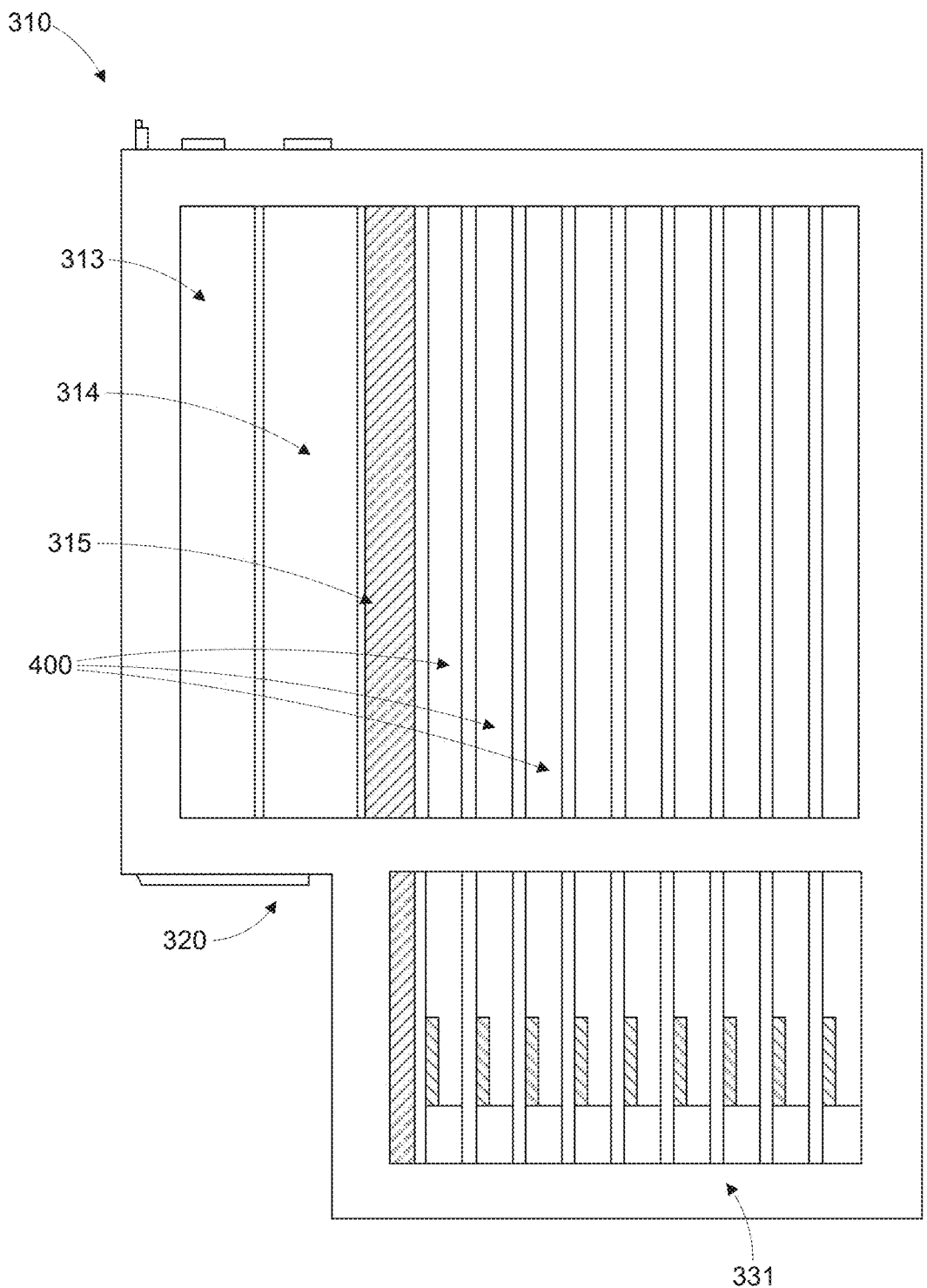

FIGS. 8A-C show an example embodiment of a rack system 310 (or rack 310). The rack 310 may serve as an intermediary between the electrical and communication systems installed within a pressure controlled vessel 110 and the computing equipment 170 to be installed within the rack 310. Computer components 170 can be mounted on the rack 310 in order to control the spacing, orientation, position, and/or configuration of the computer components 170 in the pressure controlled vessel 110. In one example embodiment, each computer component 170 may be installed in a chassis 400 before being mounted on the pressure controlled vessel 110.

The rack 310 may be any physical structure which may be used to mount computer components 170 including but not limited to any frame, bracket, support, or other structure. Computer components 170 will be considered mounted to the rack 310 when they are attached, directly or indirectly, to the rack 310 and held in a substantially stationary position. Some embodiments may include the use of dedicated mechanical guide plates as mounting mechanisms, wiring harnesses attached to bulkhead fittings, and/or through the use of intermediary power supplies and a backplane receiver 331 to distribute power and signal within the rack.

The particular design of the rack system 310 may be adjusted based upon conditions under which the system is deployed. Some embodiments of the rack 310 may include a dedicated switch. In some embodiments, the uplink interfaces may be connected via fiber infrastructure and/or the downlink access interfaces may be connected to computing equipment 170 within the rack via the backplane receiver 331 interface or any other suitable way of connecting computing equipment.

In certain embodiments, the rack system 310 may include housing for one or more intermediary power supplies which may distribute the appropriate voltages from a power interface to other equipment installed within the rack 310. The interfaces to interconnect the power from the distribution system to the intermediary power supplies may be incorporated into the design of the rack 310 to allow it to be removed and/or replaced with an alternative rack configuration by disconnecting the interfaces between the various rack, power, and communication systems.

FIG. 8A shows a top view of the rack 310. In this example embodiment, the rack 310 includes an AC interface 311 and a data interface 312. The rack 310 also includes a pair of power supplies, a power supply 313 and a redundant power supply 314 (or backup power supply). The rack 310 may also include rectifiers and a controller. The redundant power supply 314 (and/or the rectifiers and controller allow the rack 310 to be quickly repaired or even to continue functioning if the primary power supply stops functioning. The rack 310 may optionally include a converter 315. The rack 310 is configured to receive a plurality of chassis 400 and hold the chassis 400 in a substantially stationary position.

In some embodiments, the entire rack 310 may be submerged in dielectric fluid. This may include submerging the rectifier, power connections, and/or data connections in dielectric liquid during operation. In order to reduce and/or eliminate plastic contamination of the dielectric fluid, in some embodiments, plastic insulation and/or cable shielding may be eliminated. In such embodiments, the dielectric fluid may serve to insulate the otherwise exposed cables and/or connections.

FIG. 8B shows a perspective view of the rack 310 including a plurality of chassis 400. The disclosed configuration of the rack facilitates the hot swappability of the chassis 400. In this example embodiment, the rack 310 can include a plurality of AC cables 318 which connect the AC interface 311 to the power supply 313 and/or the redundant power supply 314. The power supply 313 and/or the redundant power supply 314 can generate a DC output 320 which can be delivered to the backplane receiver 331 via a DC cable 321. The rack 310 can also include a plurality of data cables 319 which connect the data interface 312 to the backplane receiver 331. The backplane receiver 331 may be used to supply data from the data connections on the bottom of the chassis 400 to a data connection at the top of the rack.

FIG. 8C shows a side view of the rack 310. In some embodiments, the racks 310 provides mechanical stabilization and/or housing for the chassis 400 and its components. Additionally, the racks 310 facilitate the routing of power and data cables from the top of the racks 310, where they are generally accessible within the vessel, to the bottom of the racks 310 where they connect with the chassis 400.

The Chassis and Interface Systems

In one example embodiment, the purpose of the disclosed chassis system 400 is to serve as a standardized physical intermediary component between traditional and/or purpose built computing components 170 and the disclosed rack system 310. In one example embodiment, the purpose of the backplane receiver 331 is to provide a slot-in interface between the chassis 400 and the rack 310, allowing for the distribution of power and signals between the power supplies in the power system and the network switches in the communication system with the various computing components 170 installed within the chassis 400.

In some embodiments, the pressure controlled vessel of the present disclosure can include at least one rack 310, which can include one or more servers, e.g., blade servers. Each server can be attached to a chassis 400 (also called server case or case). FIGS. 9A-G show an example embodiment of a chassis 400 for mounting various components 170. The chassis can facilitate installation of the servers on the racks of the pressure controlled vessel or their removal from the system. In some embodiments, other electronic components of the pressure controlled vessel can be mounted in a chassis. For example, computer components or hardware such as a motherboard, chip, card, any portion of a GPU or CPU can be installed in a chassis. As another example, components such as a power supply, a power interface, or a network communication interface can be mounted in the chassis.

In one example embodiment, the chassis can serve as a common interface between a component (e.g., server) and the pressure controlled vessel. The chassis can provide a variety of mounting, power, and connectivity features which can be customized based on the nature or design of the component. In other words, various aspects of the chassis can be modified based on the design specification of the component. As such, the chassis can accommodate almost any model or type of hardware. For example, the chassis can facilitate usage of specifically designed hardware or off-the-shelf hardware.

Embodiments of the chassis 400 may include components designed to allow for the adaptation of existing commercial components, the use of custom designed components, and/or the use of specialized chassis for particular applications. Embodiments may include adaption kits for standard motherboards, and specialty components. In particular embodiments, such components include Gigabyte motherboards with NVidia GPUs and/or Supermicro motherboards with Intel CPUs.

Figure 9A:
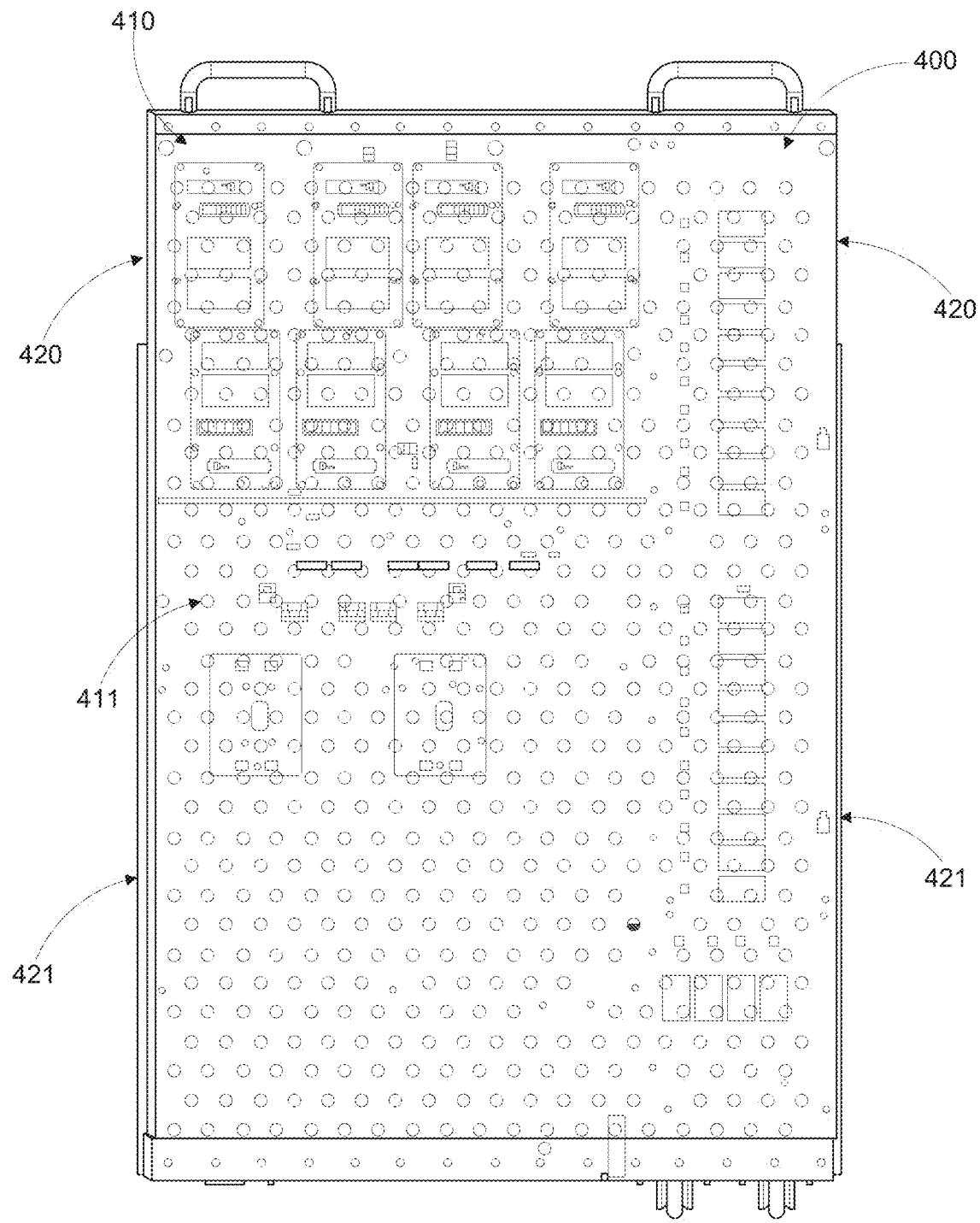
FIGS. 9A-G show an example embodiment of a chassis for mounting various components.

FIG. 9A shows a chassis 400 for mounting a server on a rack according to an example embodiment. In this example embodiment, the chassis 400 can be a rectangular box including a back wall 410 and two sidewalls 420. The back wall 410 can include a plurality of holes 411 to facilitate circulation of fluid within the chassis 400. The chassis 400 can include a guide rail 421 on each sidewall 420.

Figure 9B:
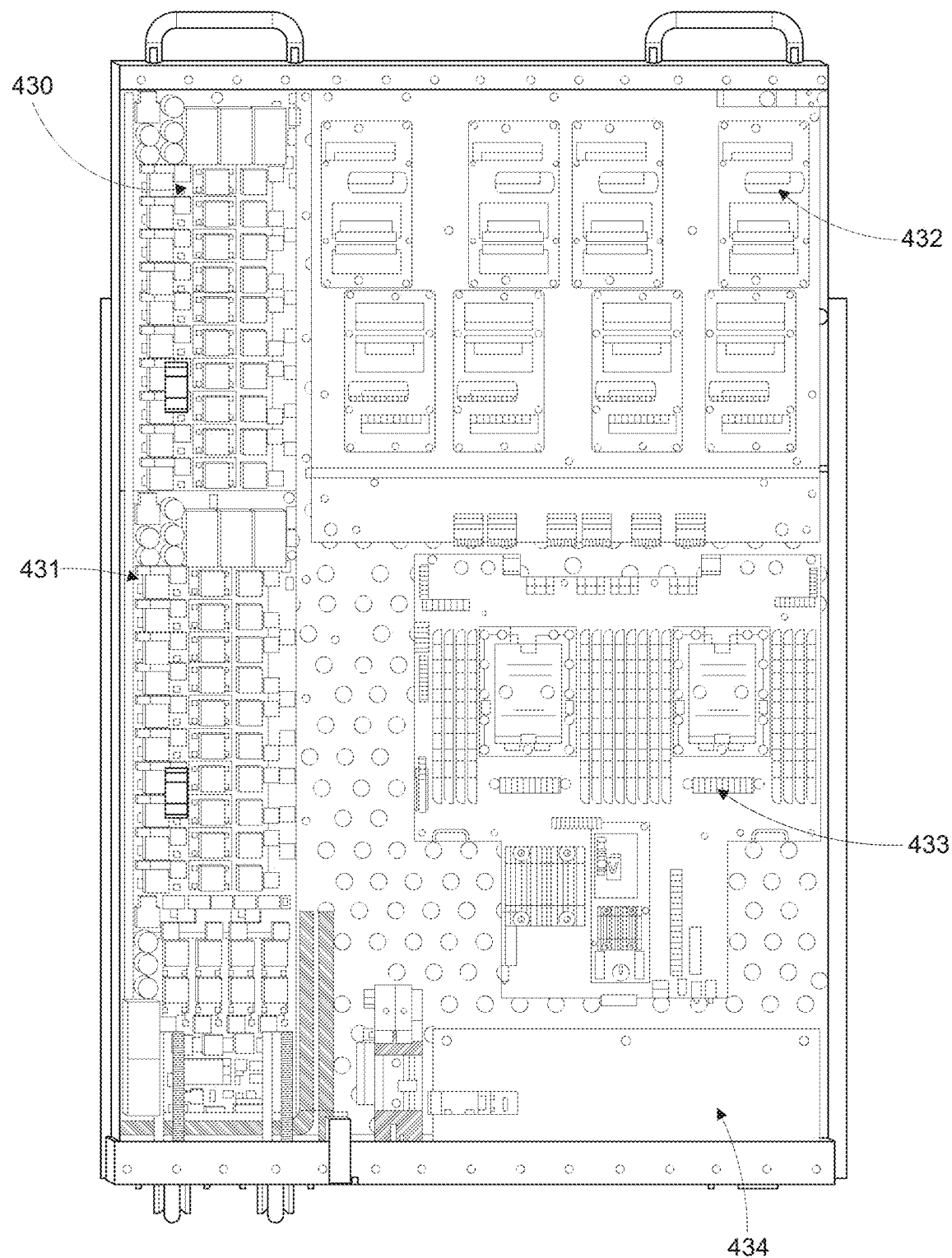

FIG. 9B shows a plurality of components inside of the chassis 400 according to an example embodiment. In this example embodiment, the back wall 410 is removed. As such, FIG. 9B shows a server 430 including a power supply module 431, a GPU module 432, a CPU module 433 and an interface card 434. In one example embodiment, the components inside the chassis 400 can comprise the components used in a blade server, e.g., a CPU module 433 and a GPU module 432. Additionally, the components inside the chassis 400 can include other components which are traditionally not included in a server, e.g., power supply module 431 or interface card 434. Because the chassis 400 does not need the traditional air cooling equipment, the chassis 400 does not include any fans or heat sinks in the chassis. As such, the chassis has a very thin profile relative to the computing power of the chassis.

Figure 9C:
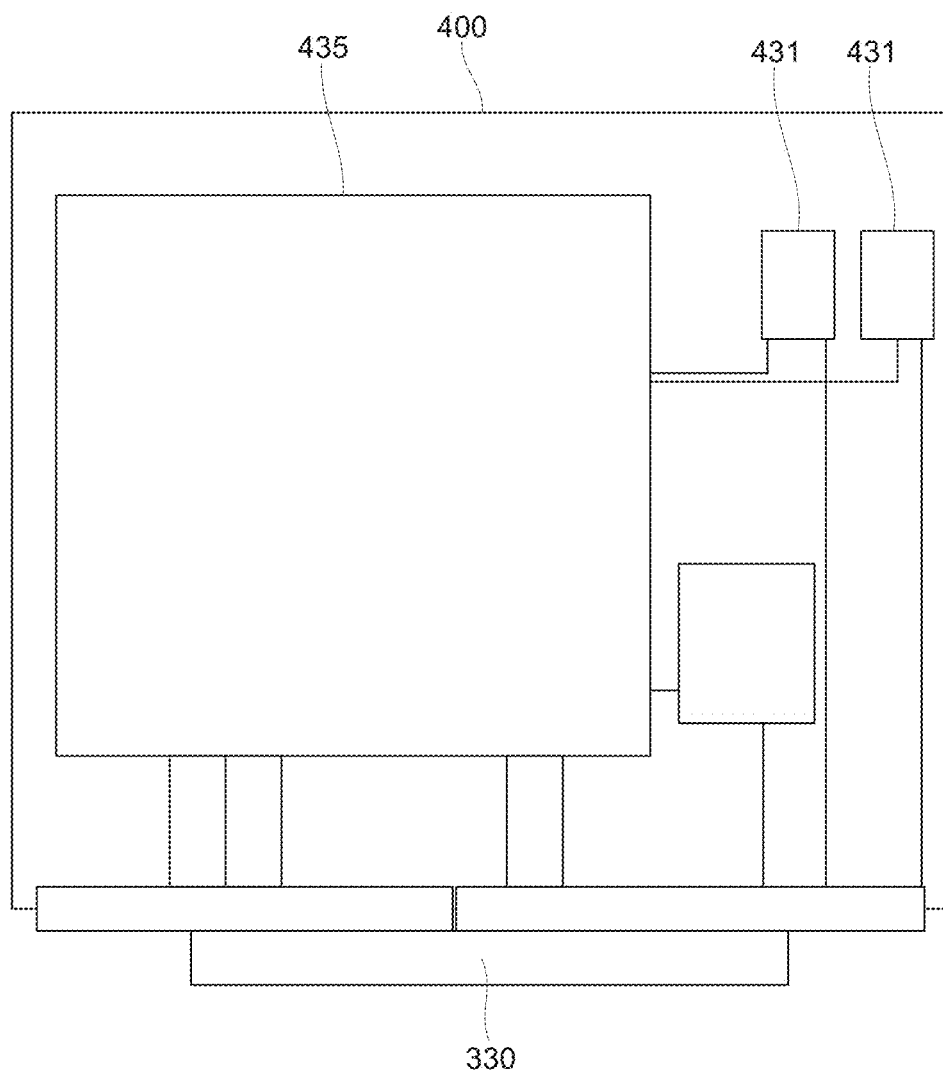

FIG. 9C shows a schematic drawing of the components within a chassis. In this exemplary embodiment, a server motherboard 445, a plurality of power supply modules 431, and an interface card 434 are mounted on a chassis 400. Storage devices and/or other peripheral components may also be mounted to the chassis 400 along with a backplane interface 330 and/or a power module and communication system module.

In one example, mounting interfaces can be added to or removed from the chassis so that a piece of hardware is fixed to the chassis. On an internal surface of the chassis 400, provisions can be made which allow for components (e.g., motherboard, GPU, CPU, interface card and other related components) to be mounted to the chassis. These provisions are the mounting interfaces. The specific arrangement of the chassis system 400 may depend on the equipment and/or components that will be attached to the chassis 400 and/or rack. Some embodiments of the chassis 400 may feature an interchangeable mounting plate that can be used for equipment attachments. A set of standard attachment plates may be used for common or frequently used components.

The styles and form factors of power and network interface modules within the chassis system 400 may be adjusted based on the demands and requirements of certain components and/or user specified equipment. In one example, a power subsystem of the chassis can be modified to address the needs of a particular component. In another example, the size of the chassis can be designed to accommodate a piece of hardware of any size. In yet another example, the chassis can offer different networking options depending the network connection card installed in the chassis. Because of these features and other features of the chassis, the chassis can accommodate a variety of components. As a result, assembly or removal of these components of the pressure controlled vessel can become simplified, and thus, automated. For example, a chassis can include a blade server and a robot can easily install or remove the chassis from a rack of the pressure controlled vessel. As such, the robot can remove and replace a blade server without any human interaction, thereby minimizing human exposure to the dielectric fluid.

In one example embodiment, the chassis can include a microcontroller which can be in communication with a management system of the pressure controlled vessel. The microcontroller can receive sensor data from various sensors placed in or outside of the chassis. For example, the chassis can include a sensor for detecting whether the chassis is properly placed in a rack. A server is properly placed in a rack if the server can make a connection with the rack. The sensor can determine whether the chassis is properly placed in a rack. As such, the sensor can transmit data to the microcontroller, and using the data, the microcontroller can provide a signal to the management system indicating whether or not the chassis is properly placed in the rack.

In one embodiment, the microcontroller can be coupled to a switch which can power on or off the component mounted in the chassis. The microcontroller can receive a power on or off signal from the management system, and in response to receiving the signal, the microcontroller can transmit a signal to the switch to power on or off the component, e.g., server. In one example embodiment, the microcontroller can receive operational data from the server and the microcontroller can relay this data to the management system. Operational data are key performance indicators of a server and can indicate its performance. Operational data can include the speed of the compute, degradation in the compute, power consumption, temperature of the circuits and bandwidth of the system.

In one example embodiment, the microcontroller can monitor, manage and control the electrical and communications facilities of a blade server. For example, indicators such as electrical current (i.e., amperage) and voltage are monitored to make sure that the system can protect itself, e.g., there is no provision of over-current or under-current.

In one example embodiment, the chassis can include a structure which can enable a robot to grab and remove the chassis. For example, the chassis can be the shape of a rectangular box having front, back and sidewalls. The chassis can also include a top wall and a bottom wall. The top wall of the chassis can include a plate which can make a coupling with a robotic arm. Using the plate, the robotic arm can grab the plate for unloading and other handling operations.

In one example embodiment, the chassis can include mechanical guide rails and positioning pins to ensure proper alignment and insertion of the chassis in a rack. Mechanical guide rails may be placed on the sidewalls of the chassis.

In one example embodiment, the chassis can include various features to promote fluid flow. For example, the chassis can be the shape of a rectangular box having front, back and sidewalls. The chassis can also include a top wall and a bottom wall. In this example, at least one of the walls of the chassis can include fluid flow holes throughout the wall. For example, the back wall can include a plurality of holes which can facilitate fluid flow in and out of the chassis when the chassis is immersed in a liquid bath.

In one example embodiment, a chassis can include apertures to ensure that all fluid within the chassis drains when the chassis is removed from a liquid bath. For example, a rack can be located in a liquid bath to cool the computer components held by the rack. In order to remove a server, a robot can grab the plate of a chassis and lift the chassis out of the rack (thereby removing the chassis from the liquid bath). When the chassis is removed from the liquid bath, certain amount of fluid can remain within the chassis. The chassis can include notches or drains at the bottom wall of the chassis to ensure that fluid can escape even if the pressure controlled vessel is not perfectly level. The notches or drains can be at the corners of the bottom wall.

In one example embodiment, the chassis can include a power interface and/or communication interface. The interfaces can electrically couple a component mounted within the chassis to the rack and/or the pressure controlled vessel. The power interface and/or communication interface can be placed at the backplane. For example, a server mounted within the chassis can be connected, via various wires and cables, to the interface of the chassis. When the chassis is placed within the rack, the interface can be electrically coupled to another interface connected to the rack (i.e., backplane receiver) and/or the pressure controlled vessel. The electrical coupling between the two interfaces (e.g., the backplane and the backplane receiver) can provide power to the server and connect the server to a communication network within or outside of the pressure controlled vessel. The coupling between the two interfaces can be made automatically during the mechanical insertion of the chassis in the rack. Similarly, removal of the chassis from the rack can disconnect the server from rack and/or the pressure controlled vessel.

In some embodiments, providing standardized interconnectivity through the backplane interface 330 and communication system interfaces may minimize the possibility for misconnection of data interfaces and reduce the need for connectivity troubleshooting.

In certain embodiments, the chassis 400 will include a set of standard power and network interfaces. The network interfaces may be in the form of Cat6A or Cat7 compatible RJ45 interfaces for connection to 1G or 10G Ethernet interfaces on equipment motherboards. In such embodiments, the power interface may include a set of standard Molex style connectors for the connection of standard motherboards and/or peripheral components.

In one example embodiment, the pressure controlled vessel can include an internal database for storing information about the components installed within the system. The internal database can be a repository of components installed on the pressure controlled vessel. For example, the internal database can store the make and model of every server and power supply installed within the system. As the components of the system are exchanged or replaced, e.g., by a robot, the management system can keep track of the changes and update the information stored on the internal database. The pressure controlled vessel can also be connected to an external database via a network.

In one example embodiment, each chassis can be associated with a unique serial number, e.g., displayed as a barcode on the chassis. When a component is placed within a chassis, the specification of the component (or the component's make and model) can be stored in the external database in association with the unique serial number. Subsequently, when the chassis is installed in the pressure controlled vessel, the pressure controlled vessel can look up the component by searching the external database for the unique serial number. For example, a robotic arm can scan the barcode on the chassis and the management system can search the external database using the barcode. The management system can update the internal database using the information obtained from the external database. Similarly, when a chassis is removed from the pressure controlled vessel, the robotic arm can scan the barcode associated with the chassis, and the management system can update the internal database to indicate that the component mounted in the chassis is not installed in the system anymore.

In one example embodiment, a chassis can include an RFID tag. The robotic arm of the pressure controlled vessel can include a scanner which can emit radio frequency to detect the RFID tag. When the robotic arm is handling a chassis, the robotic arm can scan the RDIF tag and provide the unique serial number to the management system to update the internal database.

In one example embodiment, the chassis can include an identification plate which can contain a user specified asset identification number. This asset identification number can be associated stored in association with the component mounted within the chassis. In some embodiments, the identification plate can be a chip configured to store the asset identification number.

In one example embodiment, a chassis can include a pump to enhance flow of fluid within the chassis. In order to maximize heat exchange between a component within a chassis and the liquid bath, the chassis can include a pump which can circulate the fluid within the chassis and around the component. The pump can draw the fluid from various conduits spread around the chassis and propel the fluid outside of the chassis or vice versa.

In one example embodiment, a chassis can include various conduits around the chassis for drying the chassis and the component mounted therein. When a chassis is pulled from the liquid bath, some amount of liquid may remain within the chassis or components therein. The chassis can include various conduits which can guide a flow of gas within the chassis or around the component to facilitate drying of the chassis and components. In one example embodiment, the pressure controlled vessel can expose the chassis to a flow of gas before delivering the chassis to a user. For example, the chassis can include an input pipe for receiving the flow of gas and the pressure controlled vessel provide the flow of gas through the input pipe.

Figure 9D:
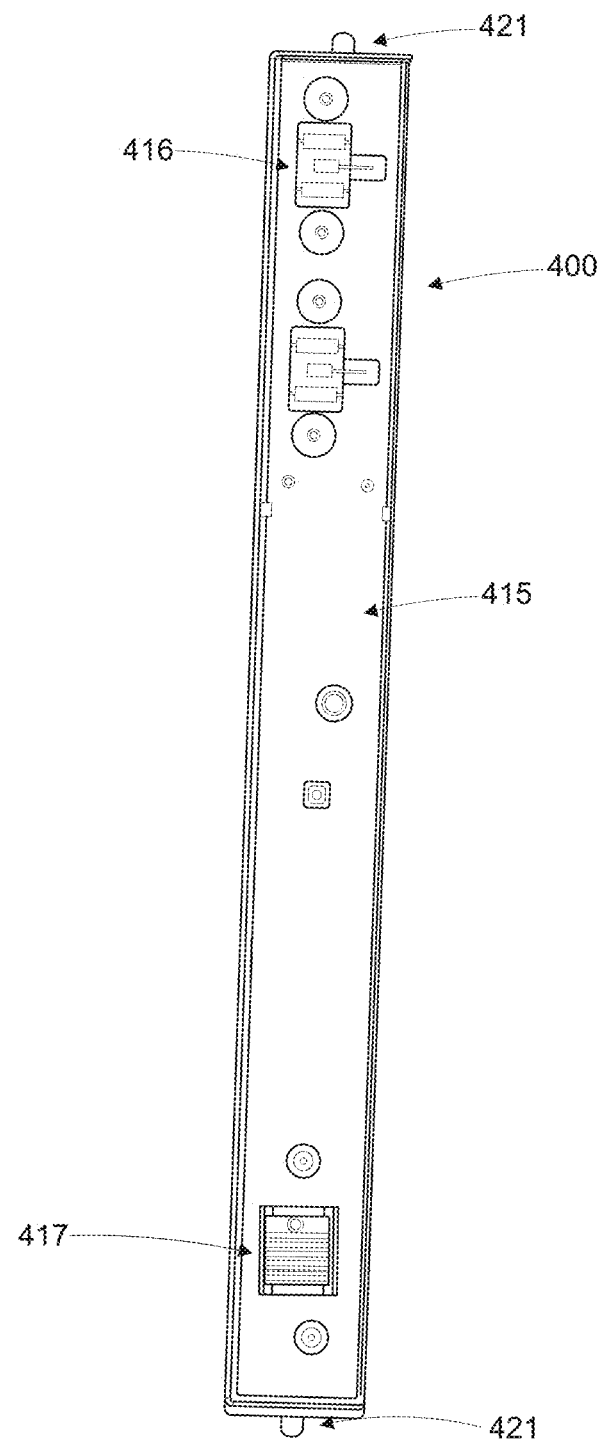

FIG. 9D shows a bottom wall 415 of the chassis 400 according to an example embodiment. In this example embodiment, the bottom wall 415 can include a power interface 416 and a communication interface 417. FIG. 9D also shows the guide rails 421 on sidewalls 420 of the chassis 400.

Figure 9E:
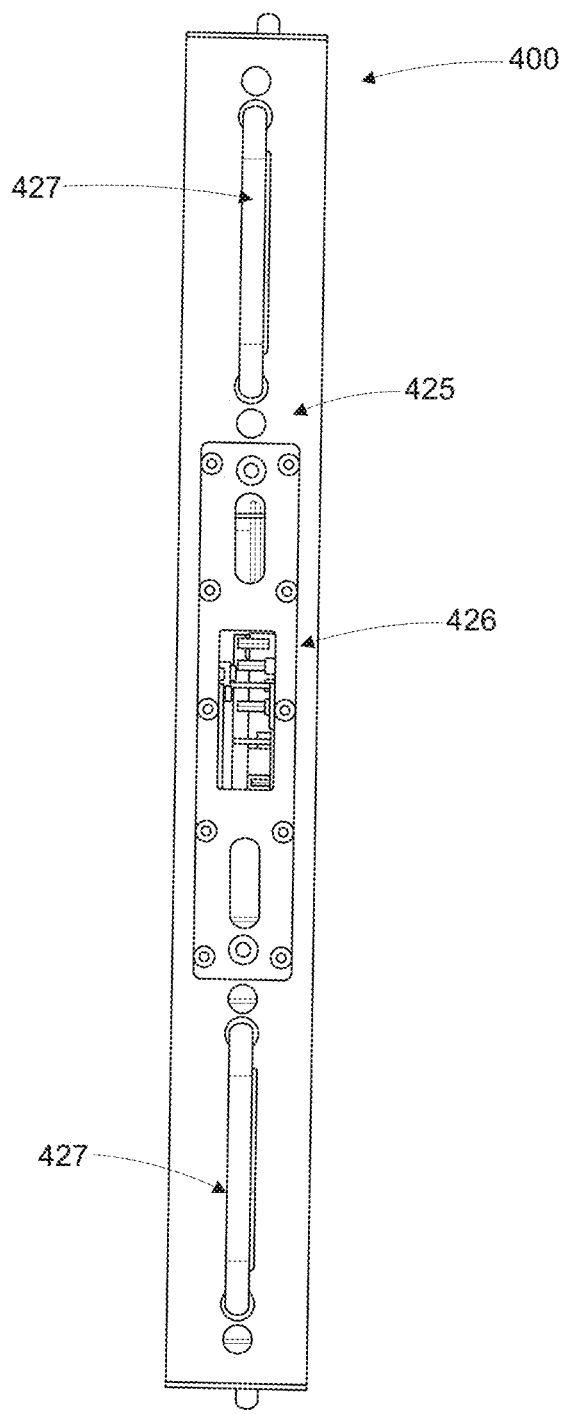

FIG. 9E shows a top wall 425 of the chassis 400 according to an example embodiment. In this example embodiment, the top wall 425 can include a plate 426 and a pair of handles 427. A robotic arm can pick up the chassis 400 using the plate 426.

Figure 9F:
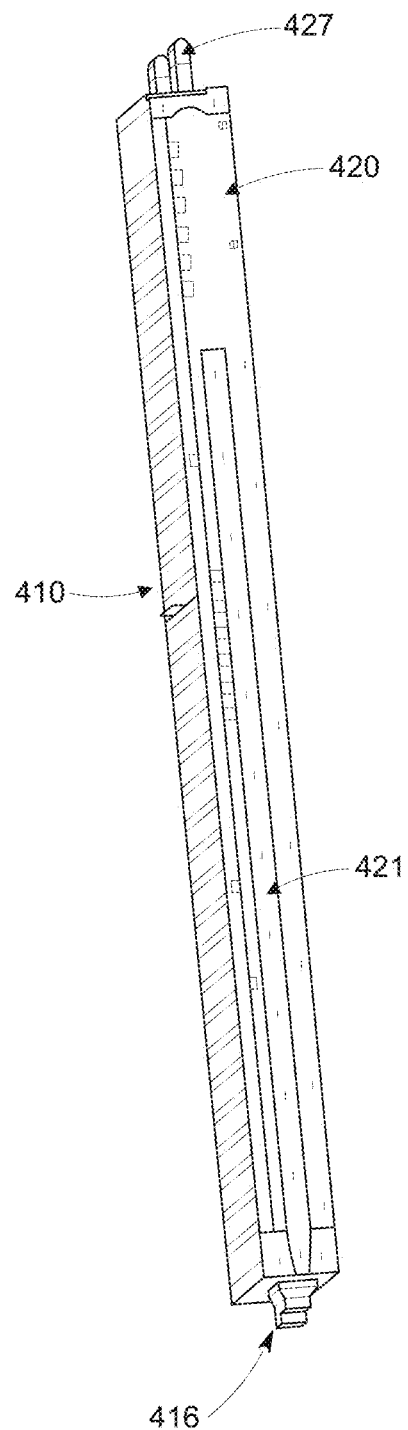

FIG. 9F shows a sidewall 420 of the chassis 400 according to an example embodiment. In this example embodiment, the sidewall 420 can include a guide rail 421. FIG. 9F also shows the back wall 410, the handles 427, and the power interface 416.

Figure 9G:
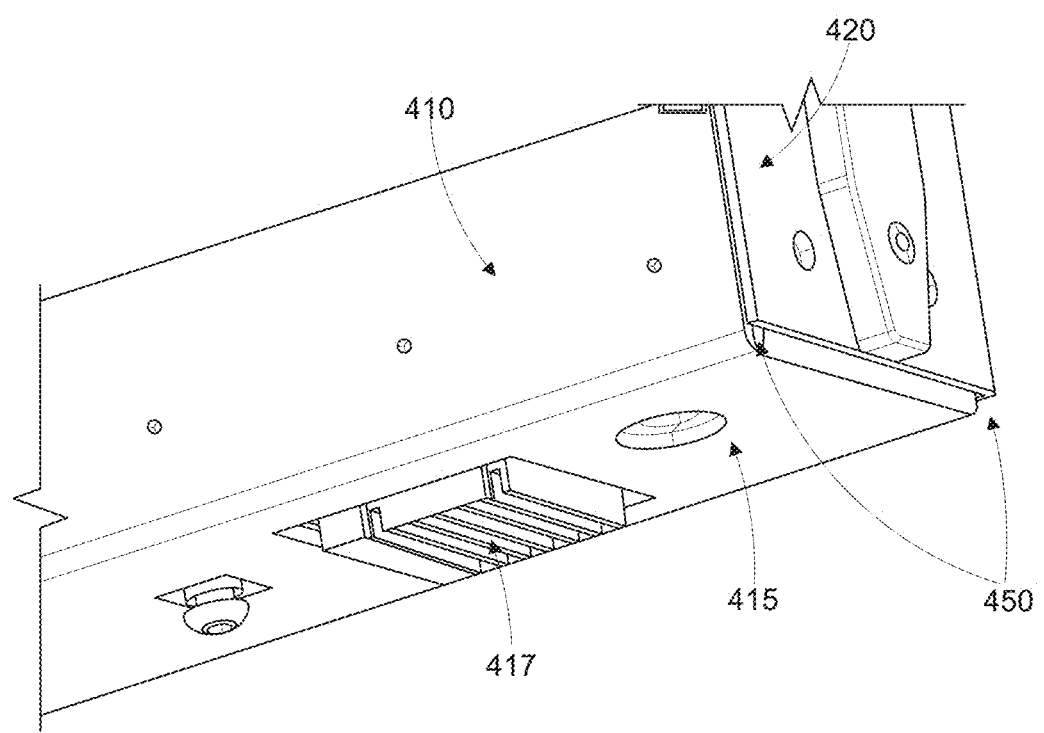

FIG. 9G shows an exploded view of a bottom drain hole 450 of the chassis 400 according to an example embodiment. In this example embodiment, the bottom drain holes 450 can be placed on the corner of the bottom wall 415, sidewall 420, and the back wall 410.

Figure 10A:
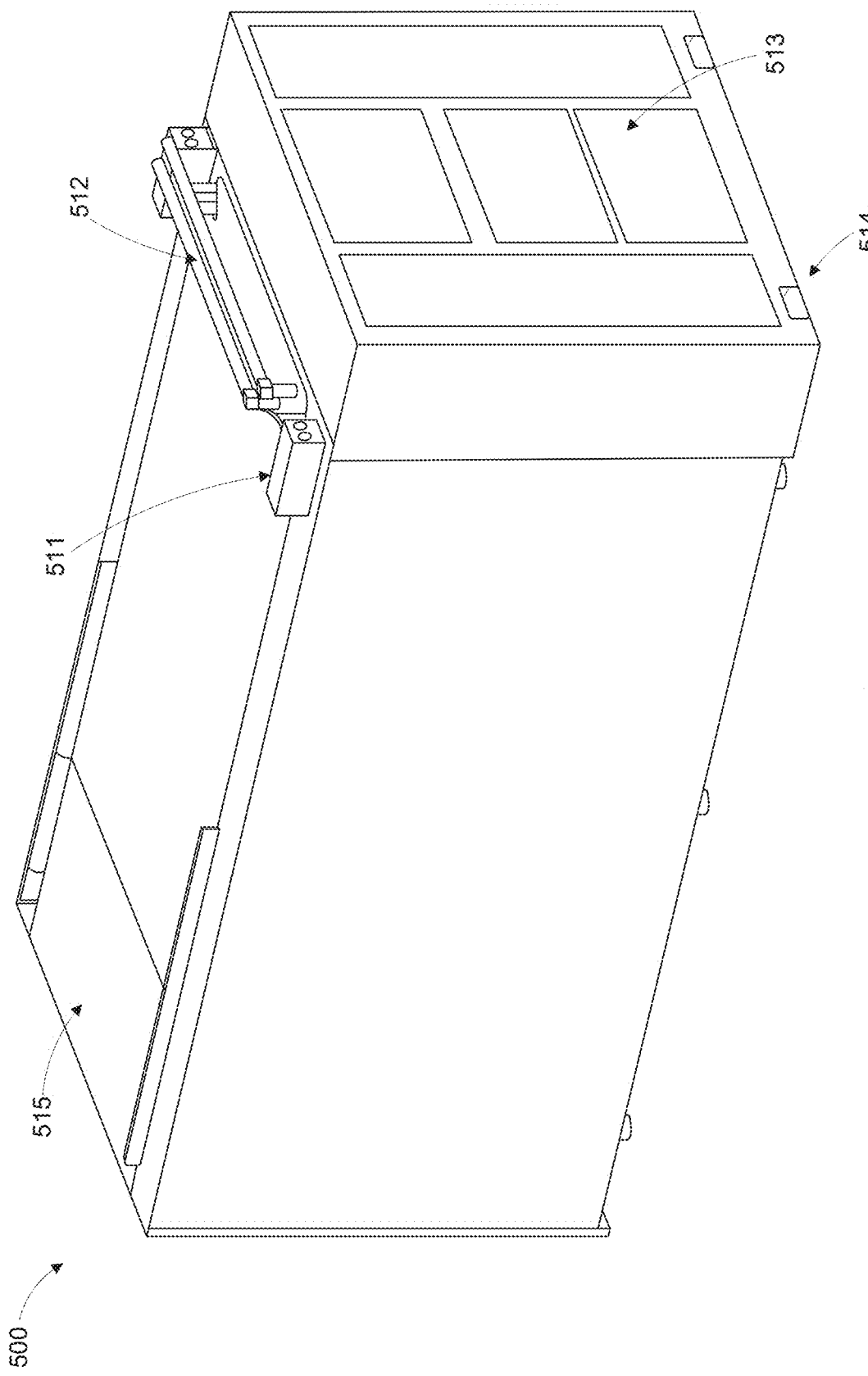
FIGS. 10A-F show an example embodiment of a pressure controlled vessel.

FIGS. 10A-F show an example embodiment of a pressure controlled vessel 500. In particular, FIG. 10A shows an exemplary embodiment of a vessel 500, e.g., a 600 KW skid. The exemplary embodiment includes a modular skid. The vessel 500 may include a plurality of forklift tubes 514, which facilitate movement and transfer of the vessel 500 to a desired location. The vessel 500 may receive a power and communication input 511 and process water from process water pipes 512 with minimal penetrations through the vessel itself. These connections may be positioned on the top of the vessel in order to facilitate close packing of the modular vessel in a data center. In some embodiments, the connections may be placed on the front and/or side of the vessel in order to accommodate vertical stacking of multiple modular vessels within a data center. In some embodiments, a vessel may comprise a vertical spacer to facilitate vessels being stacked vertically on top of each other. The vertical space may create additional space for connections, air flow, and/or insulation between vessels. By vertically stacking vessels, extraordinary power density may be achieved on a square foot basis. In some embodiments, the vessel 500 may include a power and communication box configured to receive the input 511 and distribute power and network connectivity throughout the vessel 500. The vessel 500 may include a sealing lid 515, which may facilitate addition and/or removal of components from the vessel 500.

Figure 10B:
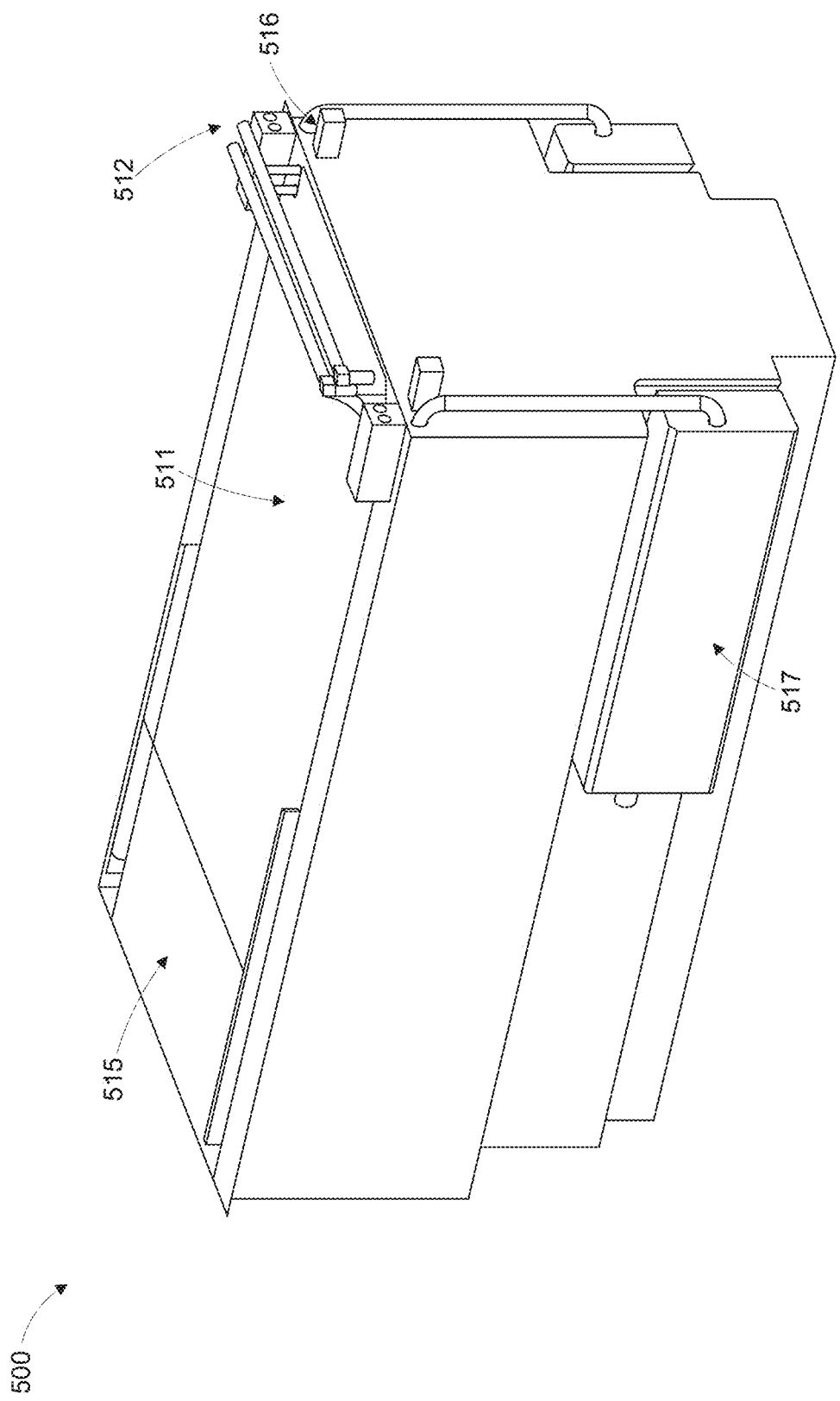

FIG. 10B shows another view of the vessel 500. In some embodiments, an inventory of replacement components may be stored within the vessel 500 so that components may be replaced using a robotic system within the vessel without opening the vessel. The robotic system may be operated using the gantry motors 516. In such embodiments, when a component breaks or needs repair, a replacement component is installed into the system and the broken or otherwise removed component may be stored in a cassette until the cassette is full. At that point, the cassette containing removed components may be removed from the vessel and a fresh cassette with new replacement components may be inserted into the vessel for future use. In some embodiments, the disclosed vessel is about 15 feet long, about 7 feet wide, and about 10 feet high. In some embodiments, the disclosed system may provide for 600 KW of computing power to be achieved in about 150 square feet.

In some embodiments, the vessel 500 may also include one or more bellows tank 517. The bellows tank 517 may be used to regulate pressure within the vessel. When the disclosed computing and/or cooling system is initially activated, the expanding dielectric fluid may be directed to the bellows tank so that it is not lost to the environment and/or to avoid pressure building up within the vessel. In some embodiments, the bellows tank 517 may be large enough to hold about two times the liquid dielectric fluid within the vessel.

Figure 10C:
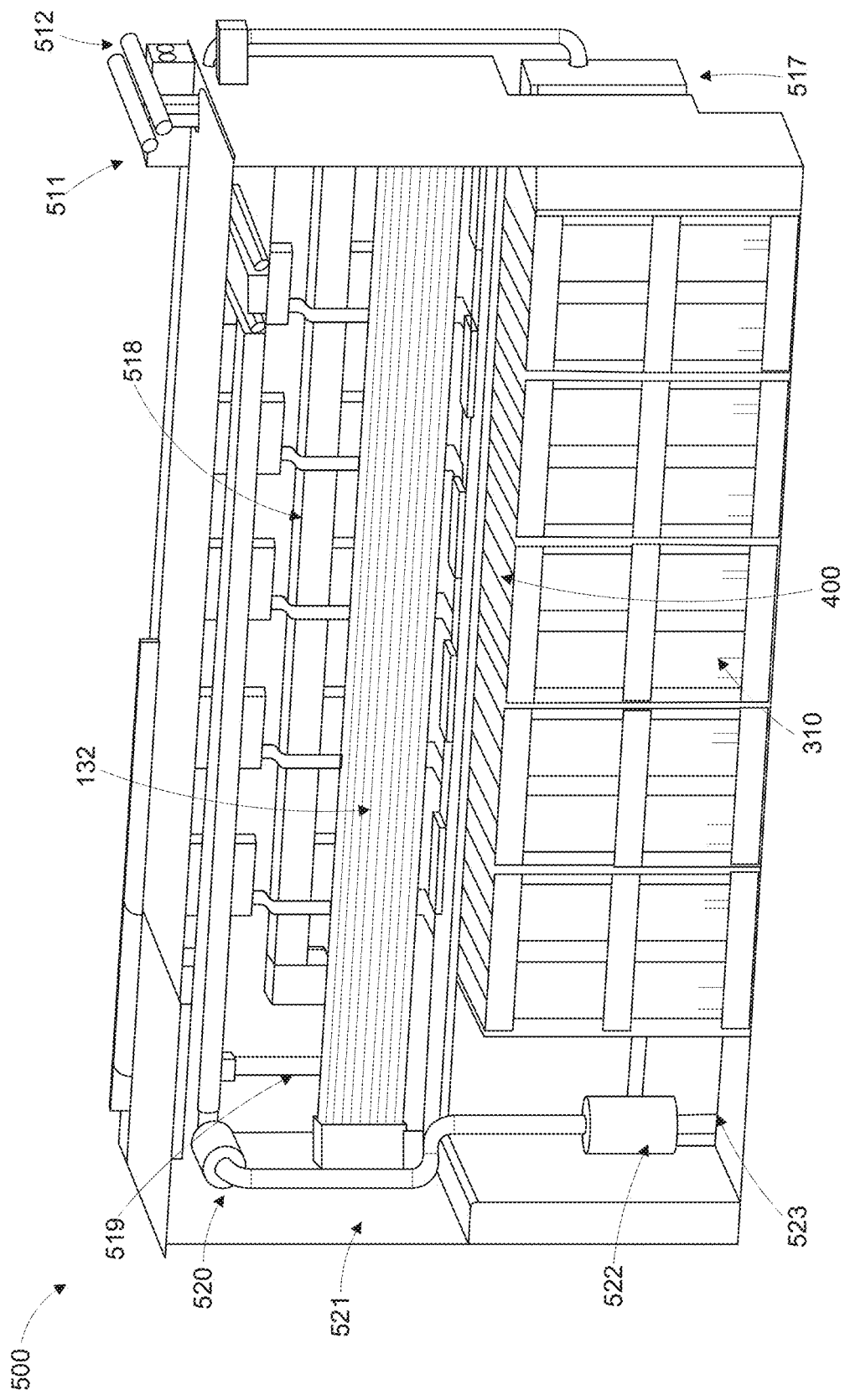

FIG. 10C shows a section view of the vessel 500. The lower portion of the vessel 500 may contain a rack 310 and/or chassis 400 which contain computing components. Above the rack is a condenser coil 132 which cools and condenses any dielectric vapor. Power may be distributed within the vessel using a power bus bar 518. This allows power to be distributed to the individual computing components in a hot-swappable manner. The power bus bar 518 allows the vessel to receive external power using only one or a small number of penetrations through the vessel. This design simplifies installation and operation of the vessel system. In some embodiments, each power bus bar may serve 600 amps for the power supplies to five racks. In such embodiments, there may be two sets of bus bars, one on each side of the vessel. In some embodiments, the bus bars do not include plastic insulation. Plastic may be regarded as a contaminant of some dielectric fluids and may be generally avoided in some embodiments.

In some embodiments, the vessel 500 may include a desiccant 519. In some embodiments, dielectric vapor may be removed from the head space of the vessel 500 and condensed in a manner that allows any non-condensable constituents to be removed from the dielectric fluid. Water will not condense under the same conditions as many dielectric fluids. As such, this system may be used to remove water contamination from the dielectric fluid.

In some embodiments, the vessel 500 may include a fluid filter 520, a fluid pipe 521 and a fluid pump 522. In some embodiments, the dielectric fluid can be added to the vessel in a manner that causes liquid dielectric fluid to spill out of the rack 310 and into the sump area 523. Fluid may then be filtered, using the fluid filter 520, and pumped, using the fluid pump 522 and fluid pipe 521, to the far side of the vessel. This system circulates fresh filtered dielectric fluid through the vessel, and thus, the dielectric fluid can be reused to cool the computing components.

Figure 10D:
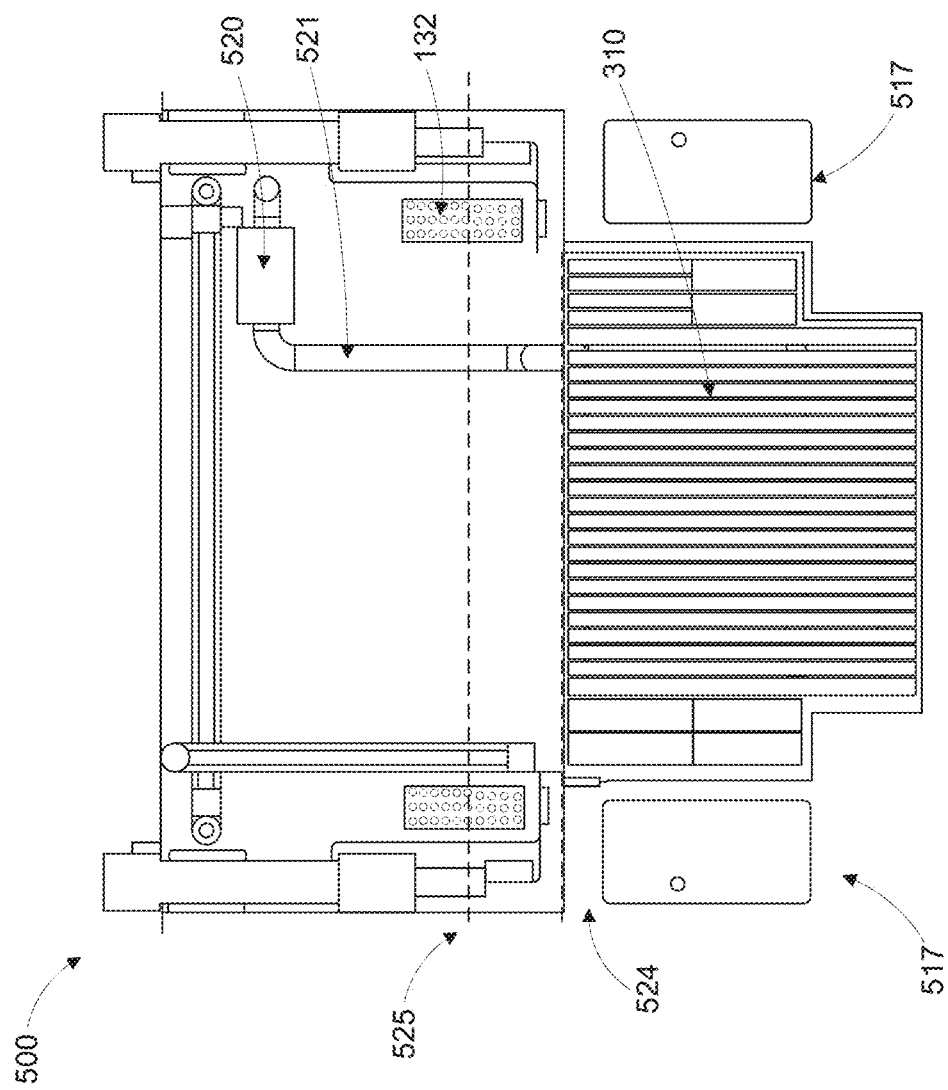

FIG. 10D illustrates a section view of the vessel 500. In this embodiment, a level of liquid dielectric fluid may be maintained at a fluid level 524 above the height of the rack 310 and/or the computing components therein. As a result, the rack 310 and/or the computing components may be immersed in the dielectric fluid. Above the fluid level 524 may be saturated dielectric vapor, e.g., up to a halfway level 525. In some embodiments, the saturated dielectric vapor is maintained up to the halfway level 525, which may be at about half the height of the condenser coil 132. Above the saturated vapor is a headspace which may, in some embodiments, contain a less dense dielectric vapor.

In the example embodiment of FIG. 10D, the cooling coils 132 are located over a shelf area. As such, when the robot 526 places or removes the chassis 400, the cooling coils 132 are not in the way. This arrangement of the cooling coils 132 can streamline placement and removal of the chassis 400, thereby can offer significant benefits in autonomous operation of the vessel.

The Communication System

Embodiments of the disclosed communication system are designed to provide a standardized layer 1 through 3 connectivity and management interface for the equipment within or associated with the disclosed super structure 210, pressure controlled vessel 110, and/or computing system.

In some embodiments, a series of MTP interfaces provide the ability to bring multiple high density multimode fiber connections into the pressure controlled vessel 110. Once contained in the pressure controlled vessel 110, the fiber connections may be broken down to individual switch level connections using a set of dedicated break out cables, break out interfaces, patch panels and/or distribution patch panels to the racks 310.

Some embodiments of the disclosed system may include dedicated fiber patch panel interface ports at each rack 310 to allow for connection to the switches system installed therein via a short patch panel. In other embodiments, there may be a dedicated patch panel, or set of patch panels, running from each switch system to the MTP distribution interface.

In some embodiments, the interface between the switch system and the chassis 400 may be via the backplane interface 330 and/or via some other mechanism which may or may not include the use of a backplane connector. In some embodiments, there may be no intermediary rack level switch system. Such embodiments may use a set of centralized switches within the pressure controlled vessel 110 to connect to various computing equipment located therein.

The typical interface between the switch system and the chassis 400 may be accomplished using a patch panel attached to the rack 310 and wired to the backplane system 330 with patch cables connecting the ports on the patch panel with an appropriate port on the switch system.

In some embodiments, there will be a small (6U) rack rail area containing a patch panel interconnecting the communication system cabinet with the MTP interfaces on each pressure controlled vessel 110, and centralized communication system distribution switches which serve to interconnect the switch system with each other and/or the outside world. In such embodiments, the end-user or customer may choose to either install their own routing gear within this space and provide external connectivity thereto to serve as the connection between the disclosed computing system and the outside world, or run fiber connectivity between the pressure controlled vessel 110 or super structure 210 and an existing network environment.

The access, communication, and/or networking components utilized within an embodiment of the communication system environment may be standard equipment or may be user specified. The rack 310 and backplane interface 330 systems may include the ability to replace the switch system located within each rack 310 by removing the existing switch, replacing it with any standard switch (such as a 1U switch), and re-wiring the desired interfaces to the backplane network interface panel.

In certain embodiments, products which are designed to interface directly with the backplane system 330 may be utilized. Such products may utilize a chassis 400 patch panel system and/or a direct electrical interface designed specifically to interconnect switch ports via a specialized purpose built internetworking interface, via a commercially used protocol or via specification for the design of a network level interconnectivity interface.

In some embodiments, the connectivity between each blade or chassis and the switch may contain multiple interfaces. One interface may be a standard switchport which may be the standard port which is available on a commercially available switch. A common interface can be 1GBASE-T or 10GBASE-T which makes use of Cat6 or Cat7 twisted pair copper connections between the switch and the host device. Another interface may be a switch-to-backplane intermediary device which may consist of either a patch panel with standard patch cables going from the standard switchports to the front side of the patch panel and a set of hard wired connections from the back side of that patch panel to the signal interfaces of the signal backplane. Alternatively, this could consist of specialized cables and/or standard RJ45 interfaces, which go from the switchport to the board to establish connectivity between the standard switchports and the backplane. Yet another interface may be an interface system signal backplane which distributes the signal pathways from the standard switchports along a printed circuit board (PCB). One or more of the signal pathways may be terminated at a connector on the PCB to which the signal backplane interface will connect. Yet another interface may be a chassis signal backplane interface. This may be a connector located on the chassis itself which mates up to the connector on the interface system signal backplane. It serves as the interface between the interface system signal backplane with the chassis itself. Yet another interface may be the chassis network interface. This may be a standard patch interface allowing for the connection of a patch cable from the chassis network interface to the RJ45 interface on the server which is attached to the Chassis.

The Robotic Systems

In some embodiments of the disclosed system, a potential method of addressing the need for hot swapability of the components within the pressure controlled vessel 110. The need for the ability to remotely remove and replace failed components 170 may be addressed through robotics.

A particular embodiment of the disclosed combination of systems may include an internal robotic arm 230 and/or external robotic arm 240. Some embodiments, such as those for cryptocurrency applications and/or certain high performance computing environments, may not require hot swapability of components. In other hyper scale GPU and CPU environments, this may be a fundamental requirement. Embodiments of the disclosed robotic system allow for replacement of a chassis and/or other computer component without interruption of any other components. In some embodiments, failed cards and/or components may be automatically and/or programmatically replaced and/or stored. This allows for short and mid-term, fully remote and autonomous operation of embodiments of the disclosed systems.

The internal robotic arm 230 mechanism is located within the pressure controlled vessel 110 environment. As shown in FIGS. 7A-D, in an exemplary embodiment, when a card or component is not operating properly, a removal sequence may be initiated. When a removal sequence is initiated, the internal arm 230 will remove the appropriate computer component 170 and/or associated chassis 400 from the rack 310, move it to an airlock 220 located within the pressure controlled vessel 110, and signal completion of the removal sequence. Once this sequence has been completed, the inner airlock door 222 will close, the airlock pressure will be equalized with that of the outside atmosphere, and an exterior airlock door 224 will open. Once the exterior door 224 has been opened, the external robotic arm 240 will remove the chassis 400 from the airlock 220 and place it into an empty storage slot.

In some embodiments, the airlock 220 will be purged with nitrogen and/or another inert and/or non-condensable gas, before the airlock 220 is opened to the exterior environment. In such embodiments, this has the effect of reducing or eliminating the loss of dielectric vapor when the airlock is opened and closed. In certain embodiments, the airlock will be fit with one-way valves, on the interior portion, exterior portion, or both. In an embodiment with one-way valves on both the interior and exterior portion of the airlock, purging the airlock will prevent cross contamination of the exterior environment into the interior atmosphere of the pressure controlled vessel 110 and also prevent loss of dielectric vapor.

When a card or component replacement sequence is initiated, the external robot arm 240 will remove a replacement component and/or chassis 400 from a storage slot and place the component into the airlock 220. Once completed, the outer airlock door 224 will close, the airlock pressure will be equalized with that of the inside of the pressure controlled vessel 110, and the inner door 222 will open. Once the inner door 222 has been opened, the internal robotic arm 230 will remove the chassis 400 from the airlock 220 and insert it into the appropriate rack 310.

When coupled with the remotely accessible management system, the internal and external robotic arms 230 and 240 allow for the remote operation and management of a datacenter environment. This may reduce the need for human operators to remain available and reduce costs and/or downtime. In some embodiment, the external robot arm 240 is mounted on a movable base, thereby allowing a single external robotic arm system to serve multiple embodiments of the disclosed computing system.

When integrated with custom developed workflow management systems and virtualization technologies, the disclosed robotic systems allow for the development of completely autonomous, self-healing datacenter solutions which can provide maximum levels of system reliability.

In some embodiments, an asset tag with a unique human and/or machine readable serial number and/or production batch code may be included on each computer component, and/or chassis. In these embodiments, the asset tag may be a unique serial number. The tag may contain a printed barcode or QR code and allow for automatic part identification by embodiments of the disclosed robotic system. The tag code may also be used in connection with a management software system to provide detailed component information regarding inventory management and automation systems. The tag and any associated adhesive or other components are preferably made of a material that is compatible with the dielectric fluid. The tag is preferably located on the chassis in a spot that is readable when the chassis is inserted into the rack. In some embodiments, secondary or additional tags may be located on other area of the chassis to assist in identification of the components and/or inventory management.

Embodiments of the disclosed robotics system allow for any individual chassis to be temporarily removed and replaced, a process called "re-seating". This is useful when during troubleshooting it is determined that a hard power cycle of the component is desired. A reseat accomplishes this by disconnecting all power, waiting a moment, and reconnecting it.

Some embodiments allow for an individual card and/or chassis to be removed from the pressure controlled vessel through an airlock. In some embodiments, the robotics system will remove a chassis from its slot in the rack, move it to an airlock, and signal the completion of this task to allow for the airlock to be opened and the card and/or chassis to be removed. Some embodiments allow for a replacement component and/or chassis to be placed into a particular rack slot through the same airlock used for removal. In some embodiments, the robotic system will remove the chassis from the airlock, place it into the appropriate rack slot, and signal its completion of this task.

Robot on the Inside Systems

Embodiments of the disclosed system may contain a "robot inside" robotics system. In such embodiments, the pressure controlled vessel may be expanded in order to accommodate a robotic arm operating within the vessel. The vessel may also be arranged to accommodate the movement or transfer of computer components and/or chassis above the racks which contain operating computer components. It will be appreciated that a pressure controlled vessel may also be referred to as the tank, pod, and/or vacuum chamber. Alternatively, it will be appreciated that certain components of the pressure controlled vessel may be referred to as the tank or pod.

Figure 10E:
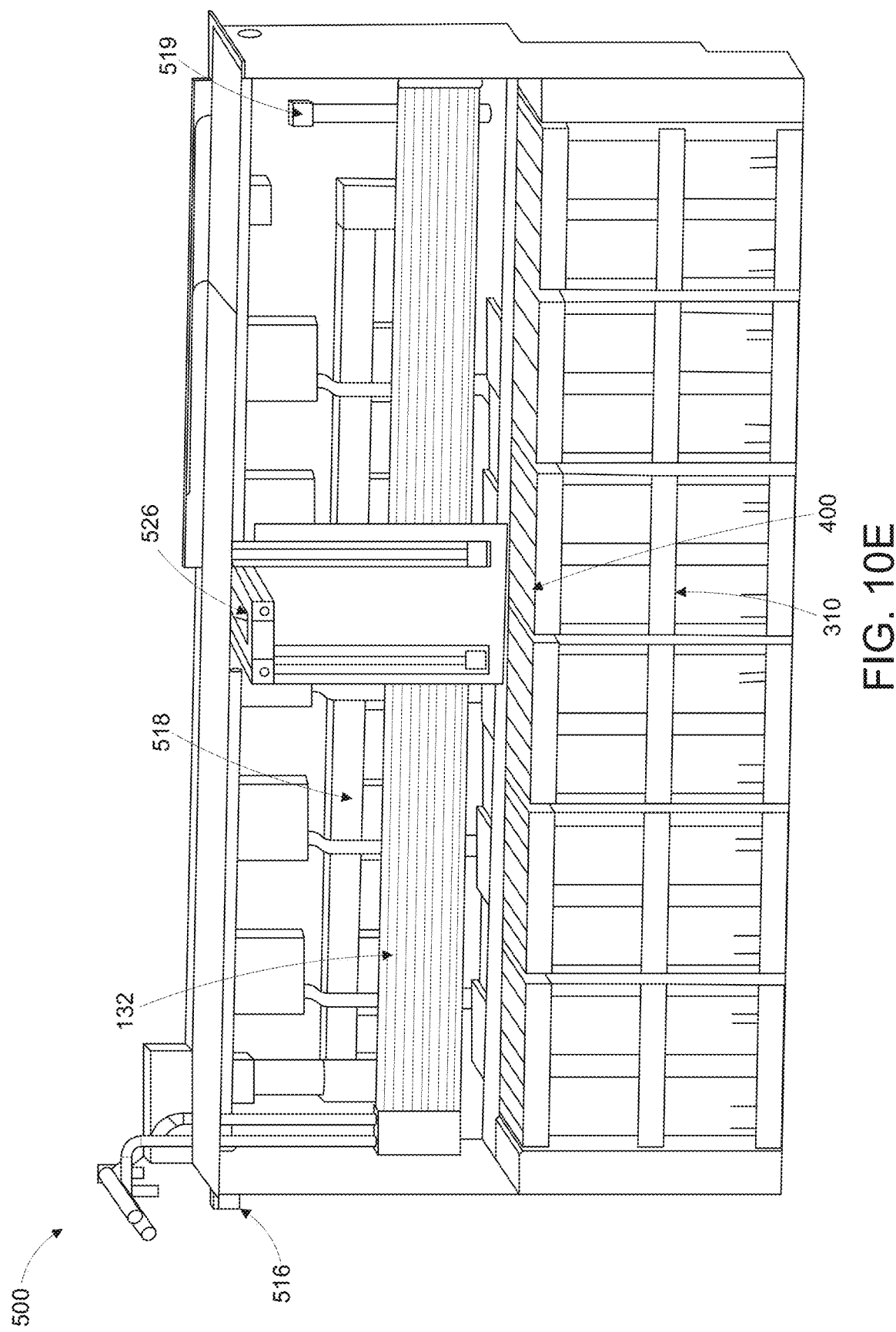
Figure 10F:
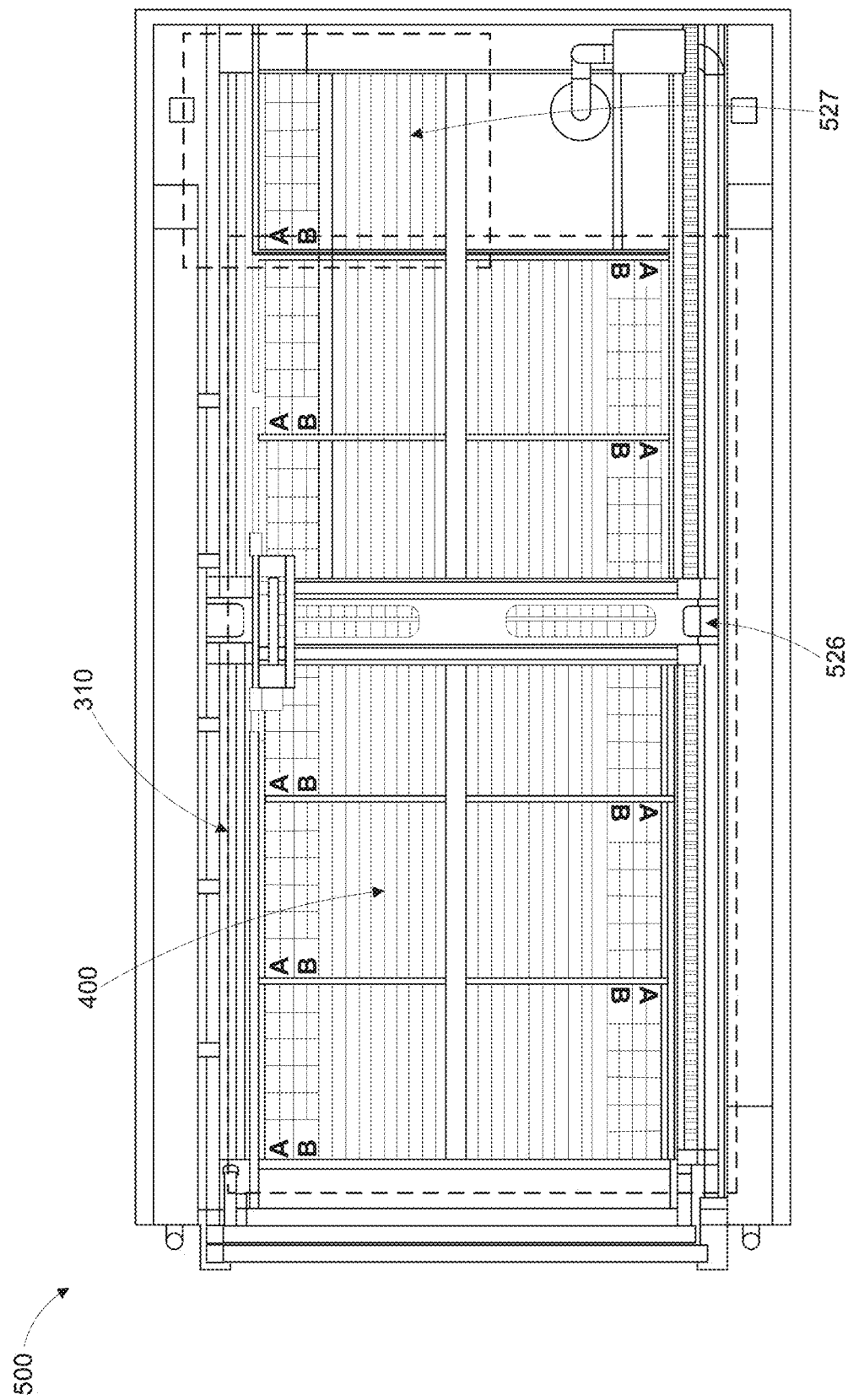

FIG. 10E depicts an embodiment of the disclosed system with a gantry robot 526 configured to remove, replace, and/or install computing components, e.g., chassis 400 of the rack 310. In some embodiments, the gantry robot 526 may also be configured to remove, replace, and/or install DC rectifiers and/or other components of the power distribution system. It will be appreciated that some embodiments of the disclosed computer components and power distribution components may be designed to be hot swappable and may include handles or other features which facilitate handling by the gantry robot 526. In some embodiments, the gantry robot 526 is arranged to travel in both x and y directions and may drop down in the z direction in order to remove and/or install replacement components. In some embodiments, the gantry robot 526 comprises a gripping tool to grab the chassis 400 and/or power supplies, e.g., the gripping tool can grab the plate 426.

FIG. 10E illustrates a top section view of an exemplary embodiment of the disclosed tank. In some embodiments, an array of racks 310 may be populated with chassis 400 and/or computing boards. In some embodiments, each chassis 400 may utilize about 6 KW of power and each rack 310 may contain 10 chassis. Accordingly, in embodiments which contain 10 of such racks 310, the vessel may utilize about 600 KW of power for computing purposes. In some embodiments, an additional rack 310 and/or magazine 527 of chassis 400 and DC power rectifiers may be stored in the vessel 500 to be used as replacement components and/or to provide a space to store components that have been removed from the vessel 500.

Robot on the Outside Systems

Figure 12A:
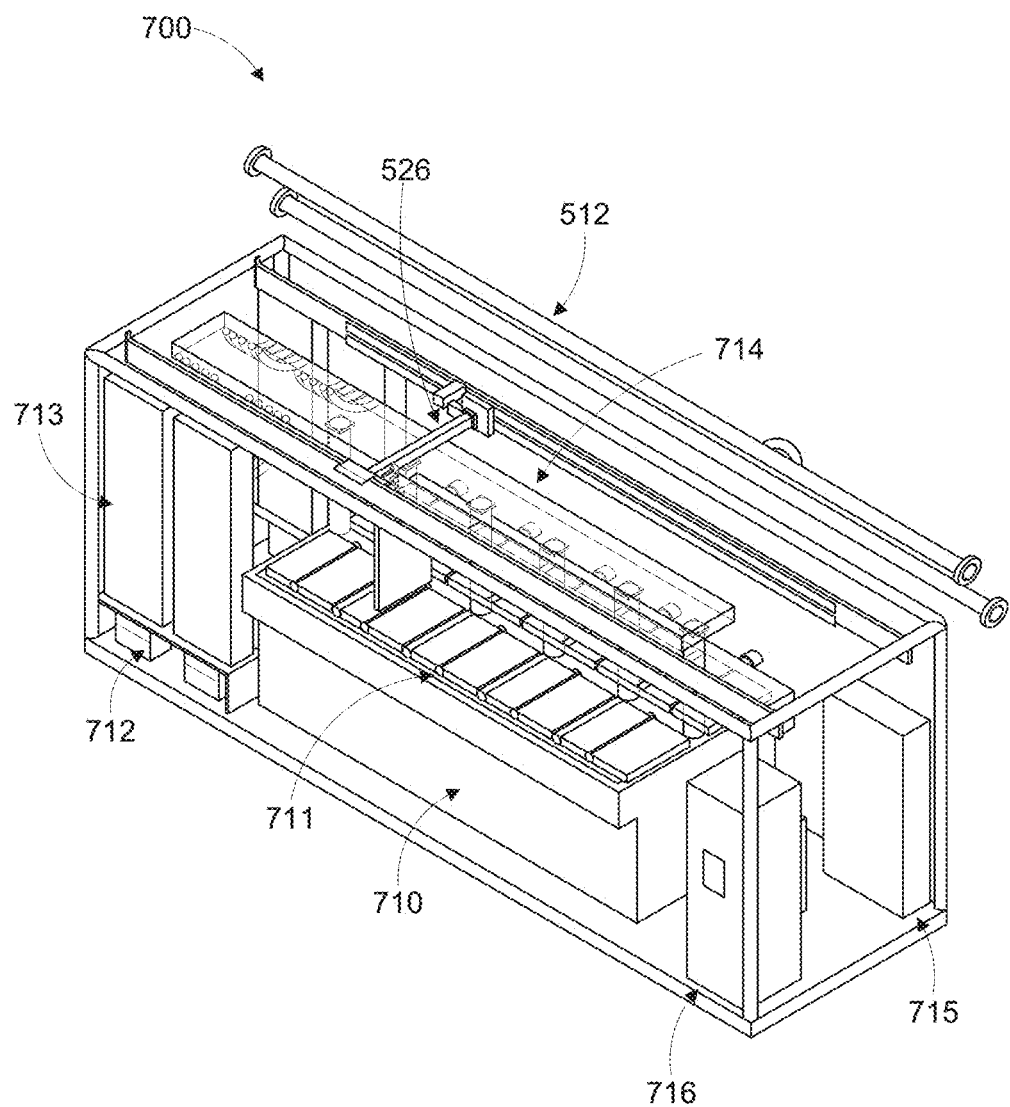
FIGS. 12A-E show another embodiment of the vessel.

FIGS. 12A-E show another embodiment of the vessel. In particular, FIG. 12A depicts an embodiment of the vessel 700 in which the gantry robot 526 is exterior of a tank 710 which houses the chassis 400 and/or computing components. In this embodiment, the tank 710 may be smaller but will need to be opened more often for the external gantry robot 526 to access the chassis 400 and/or power supplies inside the tank 710. Also, replacement equipment may be stored and/or housed within a modular enclosure such as the storage 716, which is outside of the tank 710. In some embodiments, the tank 710 may have multiple doors 711, thereby limiting the exposure of the interior of the tank 710 when a single door 711 is opened for the purpose of removing, installing and/or replacing a component or chassis 400. In such embodiments, replacement components may be stored outside of the tank 710 in order to avoid opening the tank unnecessarily.

Additionally, the vessel 700 may include one or more transformers 712, electrical distribution panels 713, process water pipes 512 and electrical chase 714. The vessel 700 may also include a programmable logic controller (PLC) cabinet 715, which monitors and control the status of various equipment within the vessel 700. The transformers 712, electrical distribution panels 713, process water pipes 512, electrical chase 714 and PLC cabinet 715 may be located outside of the tank 710.

Figure 12B:
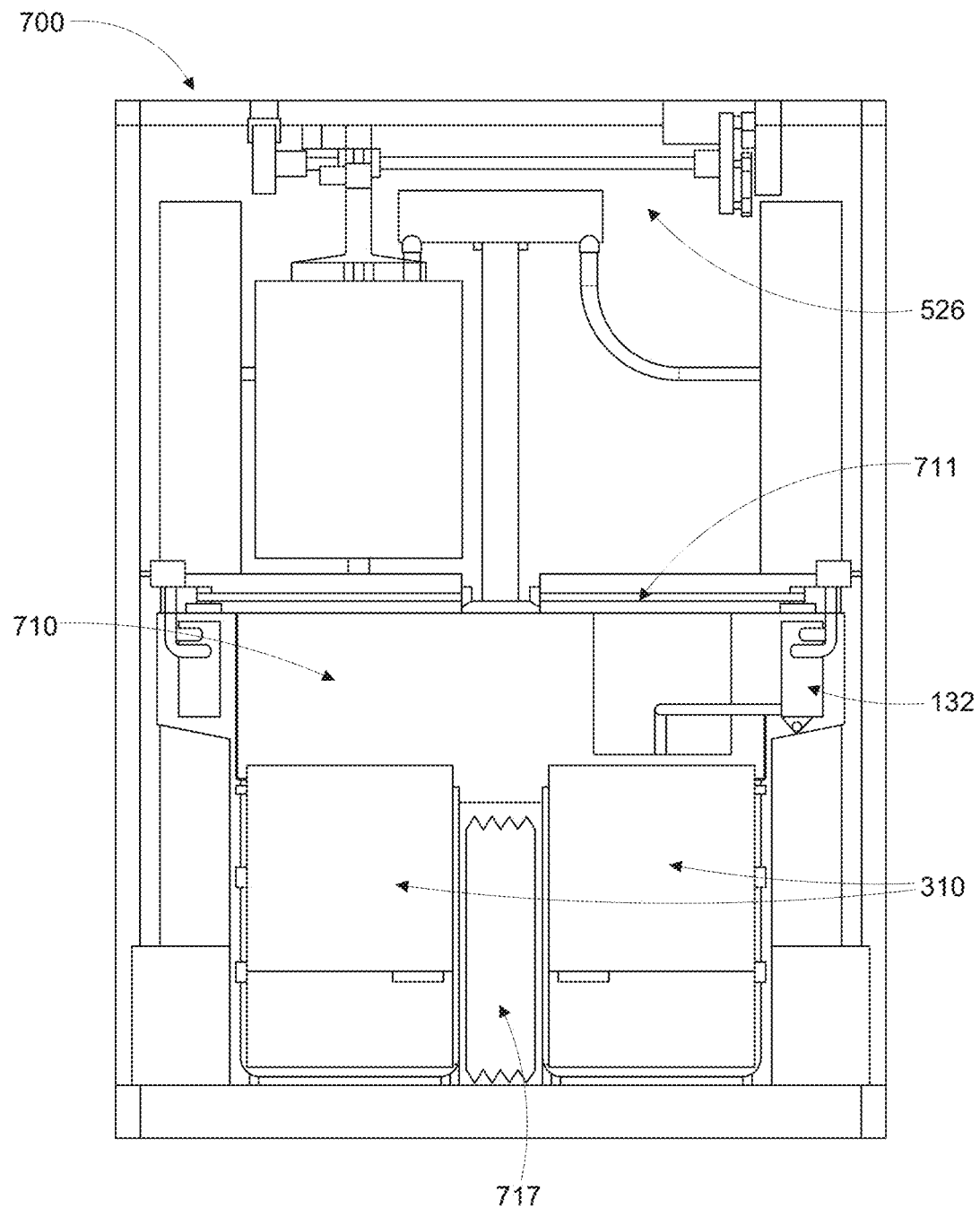
Figure 12C:
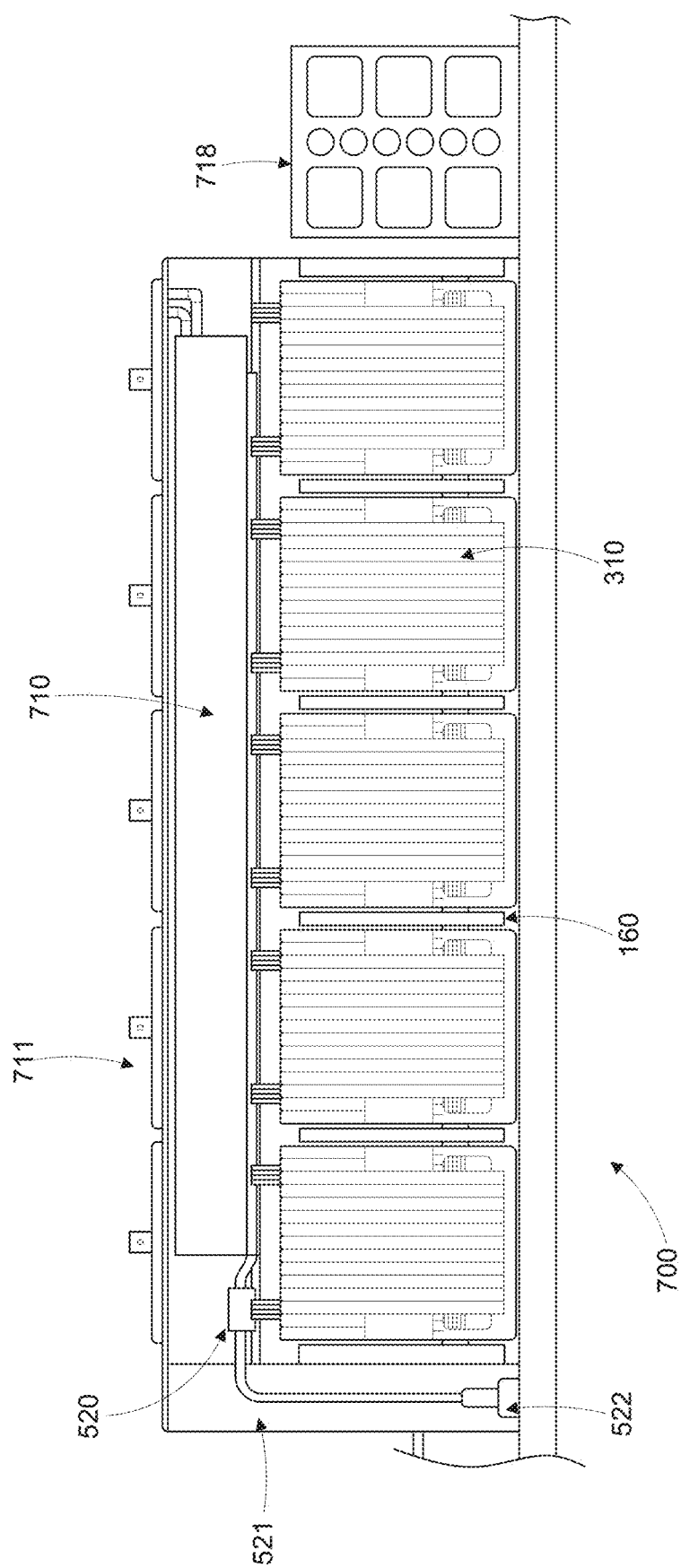

FIG. 12B illustrates a section view of the vessel 700 with the tank 710 being accessible to the external gantry robot 526. In this example embodiment, the condenser coil 132, racks 310 and bellows 717 are located in the tank 710. FIG. 12C illustrates a side view of the vessel 700 with the tank 710 with an external gantry robot and multiple doors 711. In this example embodiment, the tank 710 includes a fluid pump for removing fluid form a sump area and sending the fluid to a fluid filter 520 through a fluid pipe 521. The vessel 700 also includes a magazine 718 for storage of replacement equipment. In this example embodiment, the magazine 718 is located outside of the tank 710. In some embodiments, spacers and/or ballast blocks 160 may be used in order to reduce the total volume of liquid dielectric fluid in the tank 710.

Figure 12D:
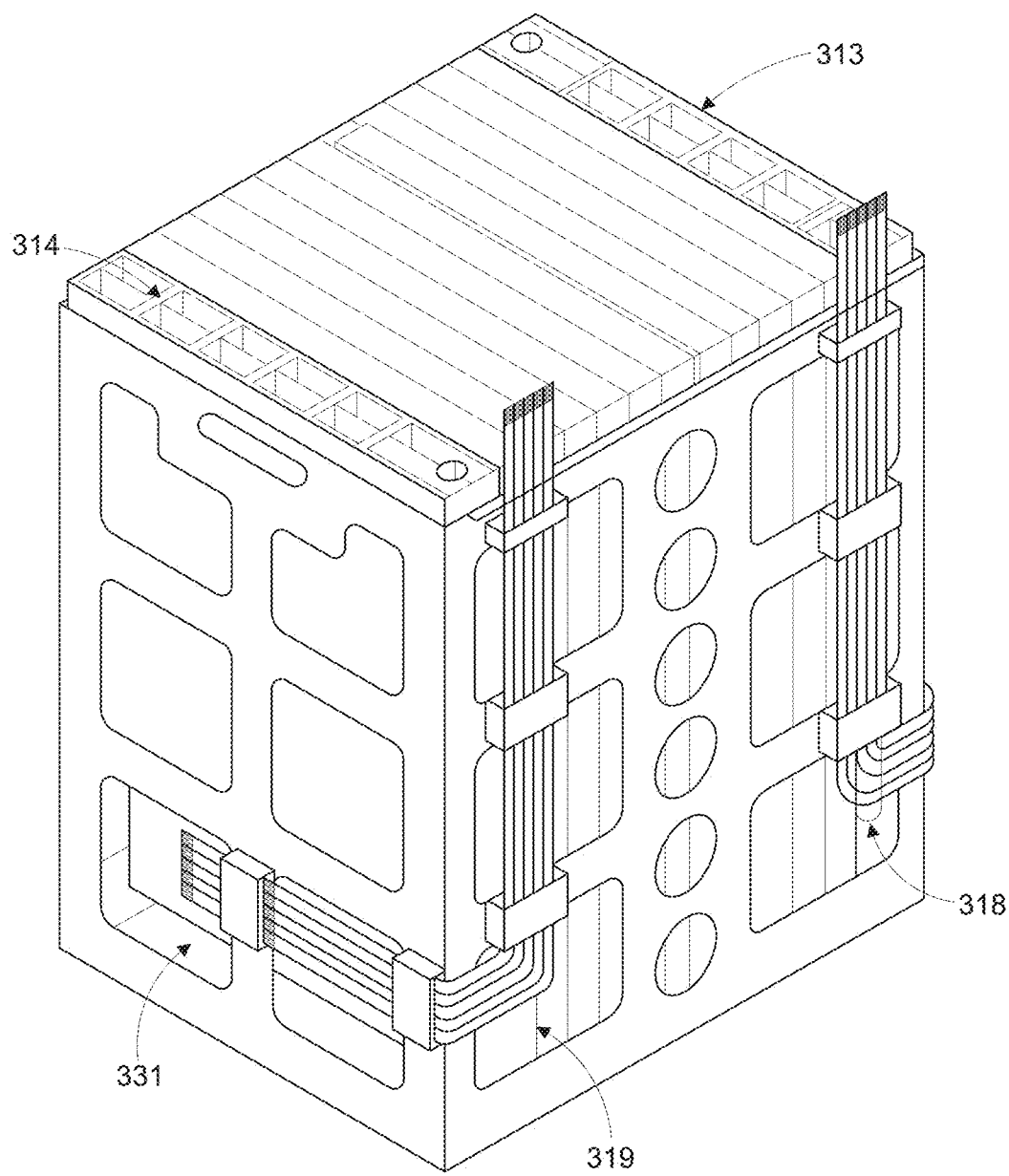

FIG. 12D illustrates a rack 310 according to an example embodiment. In some embodiments, a redundant power supply 314 may be positioned on the opposite side of the rack 310 as opposed to adjacent to the primary power supply 313. Additionally, power and/or data cables 318 and 319 may be routed in alternative configurations in order to accommodate the specific requirements of a particular deployment. In this example embodiment, a backplane receiver 331 is located under the rack 310.

Figure 12E:
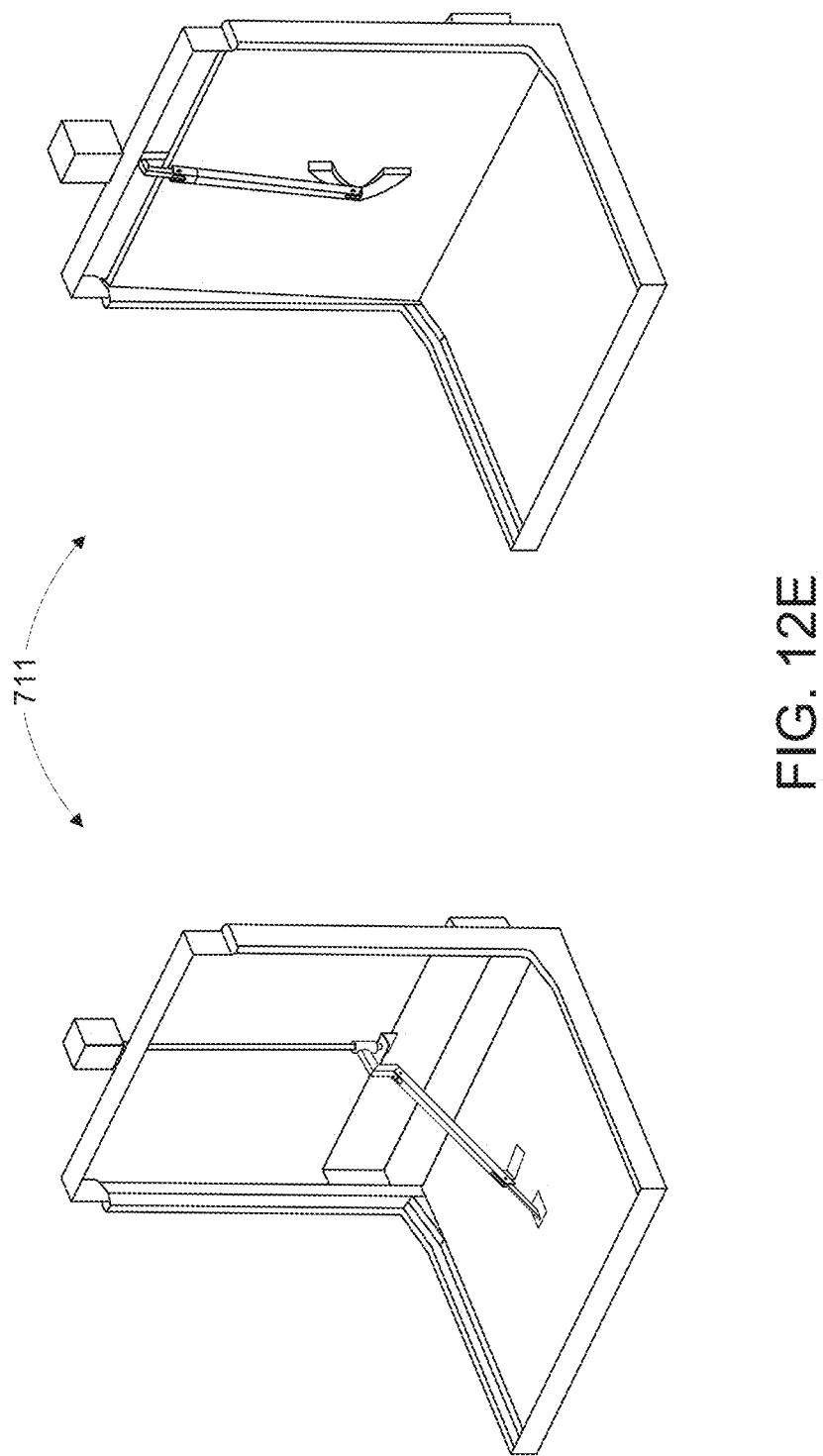

FIG. 12E shows an example hinging door 711 that may be used in some alternative embodiments of the disclosed tank 710. In some embodiments, sliding doors, as opposed to hinged doors may be utilized in order to reduce or avoid inducing currents in the dielectric vapor. Slowly sliding a door open will likely disturb the dielectric vapor less than swinging open a hinged door and causing mixing currents.

The Management System

The management system is a web based interface between the user of the disclosed computing system and the computing system itself. Embodiments of the management system provide an operational view of the computing system and allow for the monitoring and management of the various components, including monitoring and managing the pressure controlled vessels 110, the robotic systems, the communication system, the power system, and/or all other systems and components. In one example embodiment, the management system may be implemented in the PLC cabinet 715 of FIG. 12A. In another example embodiment, the management system may be implemented in the power and communication box 513 of FIG. 10A. in each embodiment, the power management system can be implemented as a software program on a control device or other suitable device, e.g., a computer.

In certain embodiments, a set of simple network management protocol accessible data points may be made available to users of the management system to allow for monitoring of key operational parameters via third party monitoring systems. Full operational logs may be maintained and charts may be provided for user review of operational condition data.

Regular maintenance of system components may be scheduled and maintained via the management system. The user may be provided with regular reminders of routine maintenance and be able to acknowledge those as being performed within the interface. This data may all be maintained as part of the operational log information for historical operational review.

In some embodiments, operational functionality may also be exposed via an API interface to allow for the remote programmatic monitoring and management of the computing system and associated components. A full set of operational monitoring and alerting functionality may be included to allow for the notification of operators in the event of any issues.

A centralized server version or a hosted cloud based management version of the management system may be utilized by customers with multiple pressure controlled vessel computing systems. This provides the operator with a single programmatically and user accessible interface for the management of a fleet of pressure controlled vessel computing systems.

In some embodiments, software based interface modules allow for interoperation with the computing platform and third party management utilities, such as Microsoft System Center and VMWare VCenter. The user and API interfaces provided by the management system may allow complete interoperation with the disclosed robotic systems, allowing for complete remote and programmatic autonomous operation and administration of the disclosed computing platform.

In some embodiments, control systems allow for adjustment and control of operations including temperature, pressure, flow rate, and/or power management. In some embodiments, a user authentication system allows multiple unique users to authenticate to the system. Some embodiments include role based and/or element based permission systems. In such embodiments, an administrator will be able to configure multiple roles with which users may be associated and/or apply specific permissions to individual users outside of their role allocations.

Some embodiments incorporate video management in order to provide users with the ability to record and retrieve video feeds from cameras which may be located within a vessel and/or super structure. In some embodiments, the cameras may acquire visual data which may be analyzed by a processor. In such embodiments, the processor may utilize computer vision techniques in order to control operations of the vessel, robotics, and/or super structure systems in response to the acquired visual data.

In some embodiments, the control system and software may be configured to generate reports regarding the operations and status of the overall system and/or the individual subsystems and/or components of the disclosed computing platform.

Exemplary Combined System Embodiments

It will be understood that the disclosed systems may be utilized individually or in combination. There are multiple embodiments of the combined computing system which may be tailored to various use cases.

One exemplary embodiment is the Crypto Series. This is an ultra-high density implementation of the disclosed technology utilizing purpose built computing hardware, racks 310 with guide plates and wiring harnesses designed for that hardware, a modified implementation of the communication system 360 architecture, and a 1 MW pressure controlled vessel 110 and power distribution system. The typical user of this embodiment are those who wish to perform cryptocurrency mining or other ultra-high power density processes using customized computing components, or manufacturers of computing components who wish to develop a full scope two-phase liquid immersion cooling system into which they will incorporate their own hardware.

Another exemplary embodiment is the GPU Series. This is a high density GPU supercomputing implementation of the disclosed technology. This implementation will make use of custom made chassis 400, rack 310 and backplane interface 330 technology designed to incorporate motherboards from Gigabyte and GPUs from NVidia using the NVidia NVLink technology to facilitate ultra-high speed GPU to GPU communications. The typical users of this technology include general purpose parallel processing applications which can make use of the GPU based computing and memory capabilities, including graphics rendering, particle simulation and general research activities.

Yet another exemplary embodiment is the CPU Series. This is a high density CPU computing implementation of the disclosed technology. This implementation will make use of high end Supermicro based motherboards, Intel Xeon CPUs, high speed network interfaces, high speed memory, and solid state storage devices for local storage. The typical user of this technology includes datacenter, enterprise, and cloud/VPS hosting providers and service providers who utilizing high performance computing for either their own internal applications or for those which they provide to third party customers and other organizations.

Still another exemplary embodiment includes the Edge Series. This is a scaled down implementation of the disclosed computing system which is designed specifically for remote/field deployments or within or alongside traditional business and data center environments. The embodiment is focused on a secure, weatherized environment with full remote monitoring and management capabilities. The target users of this technology would be operators of field deployed and distributed technologies, such as network operators and other organizations with distributed field infrastructure, and operators of existing facilities wishing to augment their computing capabilities with minimal modification to existing facilities or structures. This system may incorporate various enhancements to the external structure to simplify the connection of utility service, including electrical, water and network connectivity to the system.

Self-Contained Embodiments

Some disclosed embodiments do not rely on an external source of water. Such embodiments may comprise a closed-loop chiller for cooling water or another fluid which may be circulated through a condenser as described above. The use of a closed-loop chiller, rather than an external source of cooling water allows for embodiments which are substantially self-contained.

Figure 13:
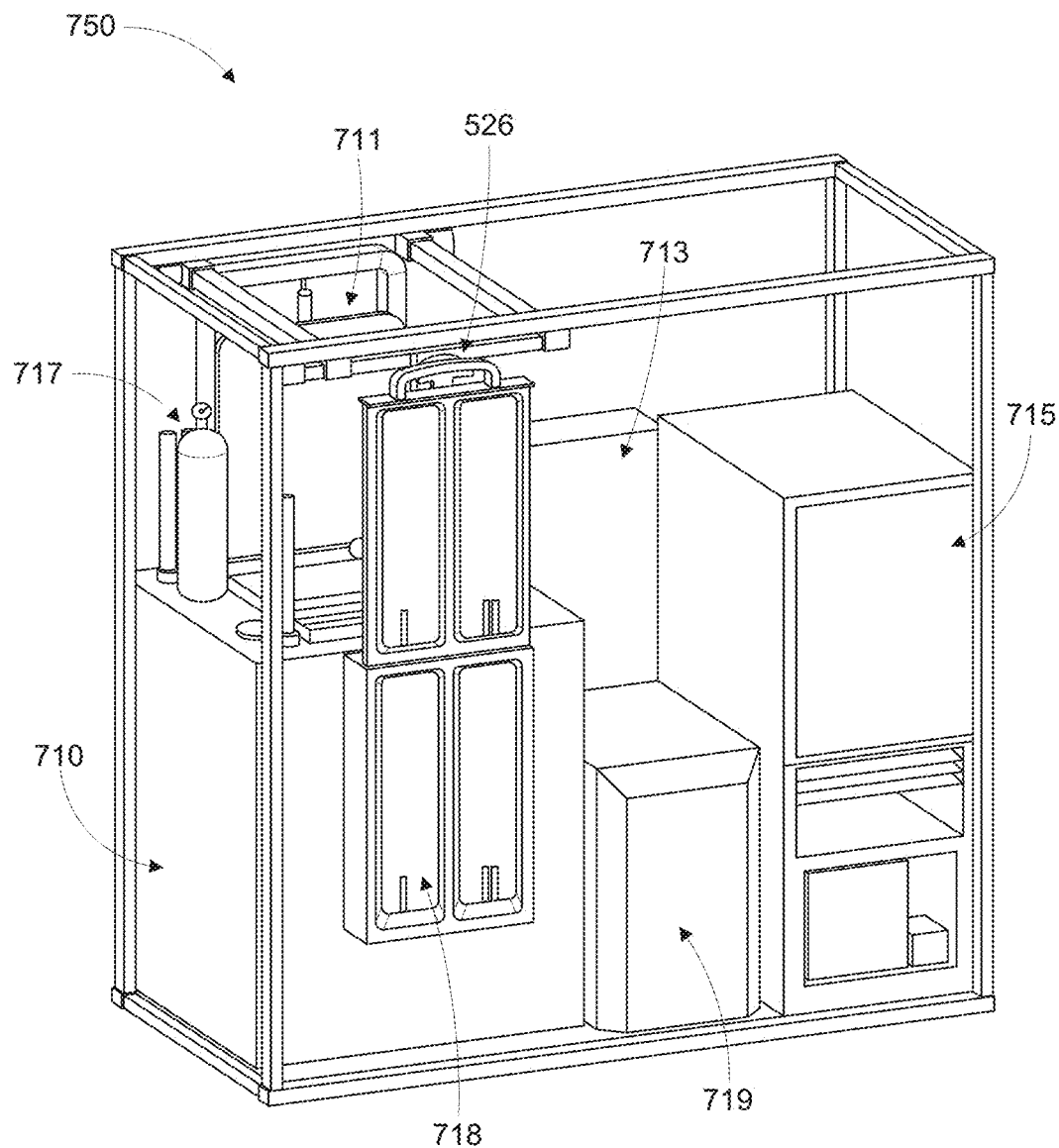
FIG. 13 shows an example of a self-contained vessel.

FIG. 13 shows an example self-contained vessel 750. The exemplary embodiment of FIG. 13 utilizes a skid-mounted closed-loop chiller 719 for cooling water or another liquid to be used in a condenser within the pod or immersion tank 710. By utilizing a closed-loop chiller, the need for an external source of cooling water may be eliminated resulting in a self-contained data center solution which may require only an external source of power and a network connection in order to be fully operational. The vessel 750 may also include bellows 717, door 711, gantry robot 526, electrical distribution panel 713, PLC cabinet 715 and magazine 718.

In some embodiments, the closed-loop chiller 719 may be a skid-mounted closed loop chiller which is enclosed within an outer housing of a modular pressure controlled vessel. In such embodiments, heat is transferred from computer components to a dielectric liquid within the tank 710. This process converts the dielectric liquid to a dielectric vapor as discussed herein. The dielectric vapor rises within the tank 710 and is cooled by a condenser, thereby converting the dielectric vapor back into a dielectric liquid. The heat transferred from the dielectric vapor to the condenser is then transferred from the condenser to a refrigerant or condensation fluid within the condenser and then to a closed-loop chiller 719. In some embodiments, the chiller 719 removes heat from the refrigerant or condensation fluid using vapor-compression, a compressor, an evaporator, a heat-exchanger or other closed-loop method of cooling the refrigerant or condensation fluid. The heat from the refrigerant or condensation fluid is ultimately dispersed via air cooling. In some embodiments, this results in a self-contained, modular, air-cooled, two-phase liquid immersion computing system. The air cooling of some self-contained embodiments is surprising as the field of immersion cooling has commonly taught against air cooling, especially air cooling of a self-contained device.

Some disclosed embodiments may be provided in a form factor with a space-saving footprint. An exemplary embodiment comprises a single rack containing ten blades or servers immersed in a dielectric liquid as described above. In some embodiments, each server may draw about 6 kW of power. Accordingly, some exemplary embodiments provide about 60 kW of computer power in a small footprint.

The exemplary embodiment illustrated in FIG. 13 is contained within a foot print that is about 4 feet 2 inches deep, about 8 feet 8.5 inches wide, and about 8 feet 8 inches tall. This exemplary embodiment comprises about 60 kW of computer power as well as the other operational components and systems and is contained in an area of about 36.3 square feet. It will be appreciated that operational components of a vessel may include, but are not limited to, a tank or pod containing a dielectric fluid, condenser, power supply, and data connection for the computer components. The vessel may also comprise sensors, control equipment, a power cabinet, a bellows 717, a vacuum system, fluid filter, purge system, and/or other components. Some self-contained embodiments may comprise an outer housing. In some embodiments, the outer housing may enclose the vessel, provide structural support, be skid mountable, be ventilated, be weather and/or water resistant, and/or be decorative. In some embodiments, the outer housing of a self-contained vessel may comprise a radiator coil, fan grate, thermal transfer components, and/or air-cooled components to facilitate the use of a closed-loop chiller.

In some embodiments, a self-contained computing system provides at least about 1.5 kW of computing power per square foot of area, at least about 1.6 kW per square foot, at least about 1.65 kW per square foot, at least about 1.8 kW per square foot, at least about 2.0 kW per square foot, or at least about 3.0 kW per square foot. In some embodiments, a self-contained computing system provides at most about 1.5 kW of computing power per square foot of area, at most about 1.6 kW per square foot, at most about 1.65 kW per square foot, at most about 1.8 kW per square foot, at most about 2.0 kW per square foot, or at most about 3.0 kW per square foot. It will be appreciated that the height of a self-contained system may be adjusted, thereby allowing for more or less computing power to be provided within a given footprint.

It will be appreciated that the dimensions, components, arrangement, and configuration of the disclosed exemplary embodiments may be modified, added to and/or subtracted from to produce a variety of potential embodiments in a variety of form factors.

In some embodiments, a self-contained computing system may comprise a robotic system, such as, for example, a gantry robot 526, configured to remove, replace, and/or install blade servers, power supplies, or other components, e.g., chassis 400. A self-contained system may comprise either a "robot on the inside" or a "robot on the outside" system. In embodiments with smaller footprints, a smaller magazine 718 of replacement components may be used. In some embodiments, the magazine 718 of replacement components may be attached to the exterior of the tank 710 as shown in FIG. 13. In some embodiments, tank 710, rack, computer components, power supplies, replacement magazine 718, and gantry robot 526 may be arranged such that the gantry robot 526 may remove, replace, and/or install components while traveling in substantially only one direction. If the various components are arranged substantially linearly, the gantry robot 526 may be able to travel along a single axis in order to remove, replace, and/or install the desired components without traveling in a second direction. It will be appreciated, that the gantry robot 526 may be able to lift and lower components in addition to traveling in a single linear direction.

Utilizing a compact form factor, such as the embodiment illustrated in FIG. 13 allows the self-contained 2PLIC system to be easily transported. The incorporation of a closed-loop chiller 719 allows for two-phase liquid immersion cooling system to be utilized in remote conditions which may not have access to a practical source of chilled water. Additionally, the elimination of a need for external cooling water creates a self-contained computing system which, in some embodiments, requires only two external connections, a power supply and a data connection.

Figure 14:
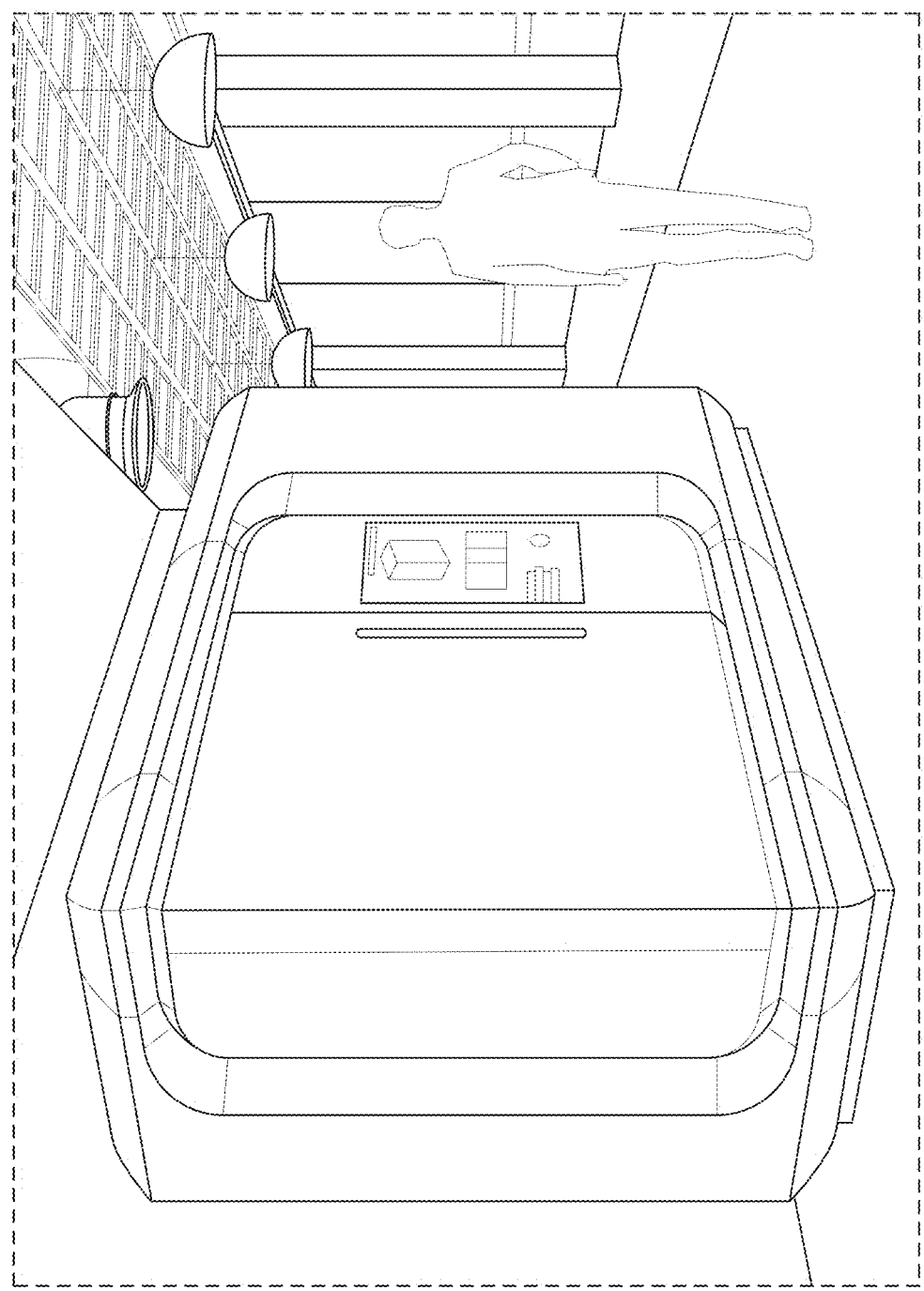
FIG. 14 shows an example of an outer housing for the self-contained vessel.

In some embodiments, the computing system may be contained within an outer housing as shown in FIG. 14. In some embodiments, the components schematically identified in FIG. 13 and/or disclosed herein may be contained within the outer housing. In some embodiments, the volume of the outer housing may be adapted based on the anticipated cooling requirements, configuration of a closed-loop chiller and/or the environment in which the self-contained computing system is expected to be deployed.

The disclosed self-contained, self-healing, compact form factor embodiments may be used as a stand-alone solution to provide significant computing capabilities to almost any location or environment. In some applications, multiple compact computing systems may be positioned near each other and/or linked together to create a cluster. In some embodiments, the outer housing is arranged to allow maintenance and/or service operations to be performed while accessing only one or two sides of the outer housing. This arrangement allows the individual self-contained computing systems to be positioned with reduced or minimal distance between each self-contained system.

In one example embodiment, clusters of four exemplary self-contained computing systems may be positioned strategically to allow for about 240 kW of self-contained computer power in about a 140 square foot footprint. In some embodiments, these units may be in power and/or data communication with each other, thereby allowing for the operation of a multi-unit cluster with only a single external power connection and a single data connection. In some embodiments, a data center may be established using multiple compact computing systems or multiple clusters of such computing systems.

Some disclosed embodiments and/or computing systems disclosed herein may be utilized in modern data centers and/or climate controlled environments, however some embodiments of the disclosed self-contained computing system may be deployed in remote locations and/or harsh environmental conditions. In some embodiments, the outer housing may be weatherized, waterproof, and/or otherwise arranged to tolerate exposure to harsh environments for an extended period of time. Some disclosed embodiments allow for the rapid deployment of significant computing resources to remote or challenging locations. Some self-contained embodiments may be arranged to be operational in substantially any location with access to a power supply and data connection. In some embodiments, an uninterruptable power supply and/or generator may be operably connected to the computing system to provide more reliable or consistent access to electrical power.

Some disclosed self-contained embodiments are designed to be stackable. Some stackable embodiments may be designed with a reduced height. Certain embodiments may be about 5'5" tall, 5'6" deep and 9' wide. The may result in about 60 kW of computer power in a 42 square foot foot-print. Such units may be vertically stacked to provide 120 kW of computer power in the same 42 square foot foot-print.

Embodiments of the disclosed computing system may be stacked and multiple stacks may be positioned adjacent to each other. This reduces the need for isle space between individual computing systems, thereby allowing for an overall higher power density within a data center.

Some embodiments may be designed to be fully operable and maintainable with access to only one side of self-contained computing system. Such embodiments may be advantageous as they facilitate positioning the self-contained systems in very close proximity to each other. Additionally, in some self-contained embodiments, the entire immersion tank may be removed and/or replaced while accessing only one side of the device. In certain embodiments, the tank may be individually modular and/or skid mounted.

In some embodiments, a self-contained computing system may be arranged vertically to utilize an even smaller footprint. A vertically designed embodiment of the disclosed system may provide about 60 kW of computing power in about a 22.9 square foot foot-print. As with some other disclosed embodiments, some vertically oriented self-contained computing systems may be positioned in close proximity to one another. Also as discussed with some other embodiments, some vertically oriented self-contained computing systems may be operated and maintained with access only to one side of the device. In some embodiments, the entire tank may be removed from the outer housing and replaced. This arrangement allows for the rapid replacement of multiple blade servers and/or other computing components.

Mobile Embodiments

Self-contained computing systems which do not require an external source of cooling water allow for novel computing applications. In some embodiments, power may be provided to the system using a generator thereby removing the need to connect the system to a source of external and/or stationary power. In some embodiments, the system may rely on wireless data communication.

In particular self-contained embodiments which do not rely on a stationary power source or wired data communication, a fully mobile computing system may be implemented. Disclosed embodiments include vehicle mounted, self-contained computing systems which may be used to provide significant computing power in nearly any environment. In some embodiments, a truck-mounted, wireless computing system may be driven within wireless communication range of an existing or temporary network and provide a significant amount of computing power with substantially no setup or installation time.

Natural Water Embodiments

In some embodiments, a computing system may be arranged to be utilized on a boat, ship, oil-rig, floating platform, or other vessel or structure which is located in close proximity to a body of water. In such embodiments, the condenser, used to convert dielectric vapor back to a dielectric liquid as discussed herein, may be cooled using water from the body of water. In one exemplary embodiment, a modular computing system may comprise a water intake, water output, and pump or impeller. The pump and/or impeller may cause water to flow from the body of water, through the condenser, and then back into the body of water. Some embodiments may comprise filters and/or process components designed to protect condenser, piping, and other computing system components from potential sources of contamination in the body of water. In some embodiments, the condenser and other components are arranged to endure extended contact with brackish or salty water such as, for example, ocean water.

Horizontal Magazine Swap

In some embodiments, a magazine of replacement components may be stored on the outside of a tank and within an outer housing of a computing system. Replacement components, such as, for example, chassis, servers, blades, and/or power components, may be removed from the magazine and used to replace components within the tank. The magazine may be on a platform which is configured to extend out of the outer housing of the computing system in order to allow components from the magazine to be replaced.

In one non-limiting example, when a blade server within the tank malfunctions, a robotic arm may be used to extract the non-working component from the tank and move the non-working component to a storage slot of a magazine. The robotic arm may then remove a functioning blade server from the magazine and install it where the non-working server was previously installed, thereby replacing the non-working server with a new working server.

Over time, the magazine will accumulate non-working components which may be replaced with new working components in order for the robotic system to continue long term operations. In some embodiments, the magazine is on a platform which may extend to the outside of the outer housing, thereby allowing an operator to access the magazine. In some embodiments, the platform is configured to rotate the magazine from a substantially vertical position to a substantially horizontal position in order to allow components to slide in or out of the magazine.

In some embodiments, an adjustable height cart may be used to move, load, and/or receive components so that a human operator is not required to lift or support the weight of the components while removing or replacing components from the magazine. It will be appreciated that a magazine that is configured to rotate to a substantially horizontal position may also facilitate loading of functioning components into the magazine as well as removing non-functioning components.

Figure 15A:
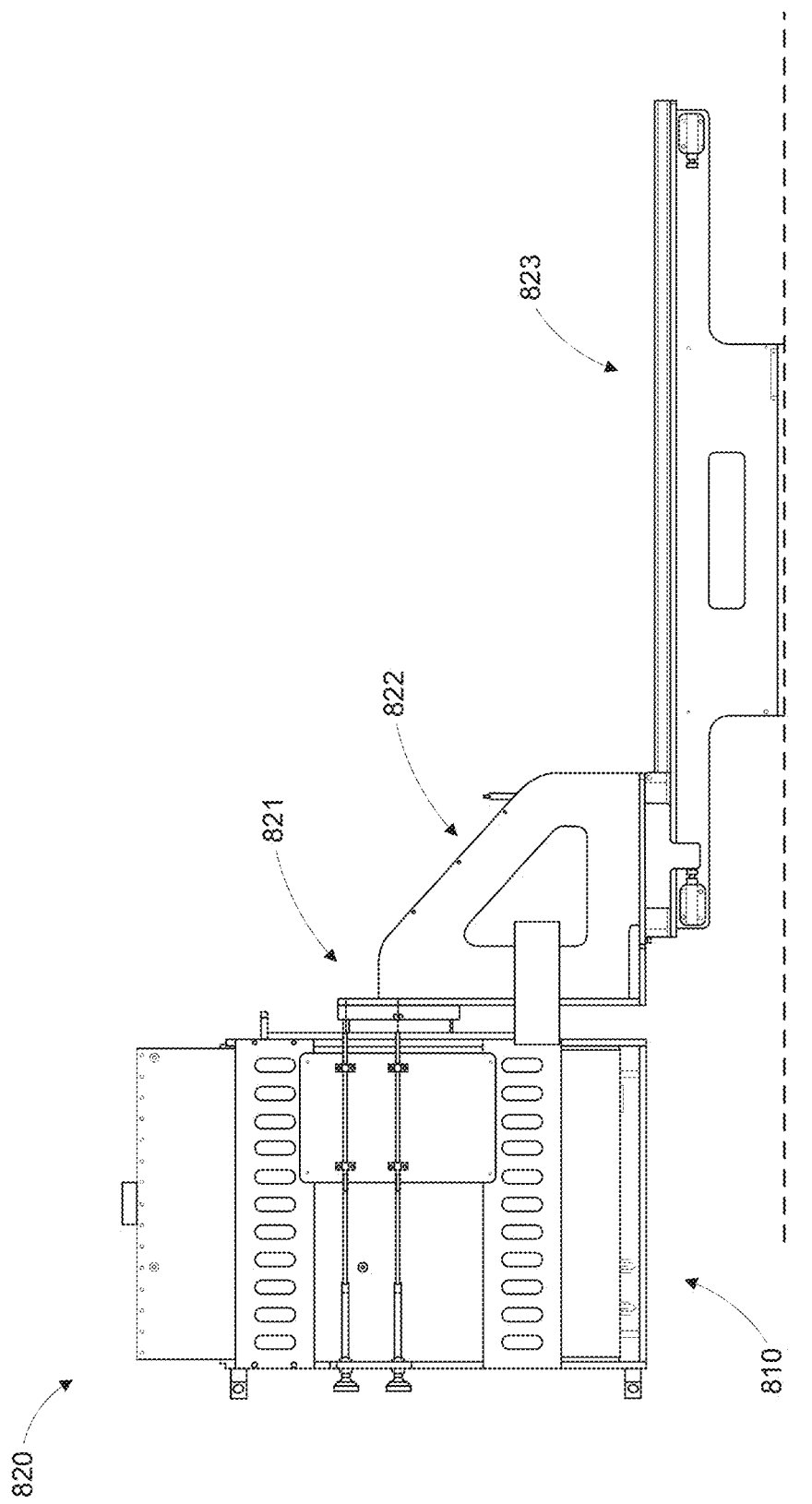
FIGS. 15A-D show an example magazine located on a platform capable of extending out of the vessel.

FIGS. 15A-D show an example magazine 810 located on a platform 820 capable of extending out of the vessel. In FIG. 15A, the magazine 810 may be connected to a platform including a rotating member 821, a supporting member 822 and a rail 823. In some embodiments, the supporting member 822 may be connected to the rail 823 that allows the supporting member 822 to move while supporting the weight of the magazine 810 and any servers or other components stored within the magazine. In the example embodiment of the FIG. 15A, the platform 820 is in an extended position.

Figure 15B:
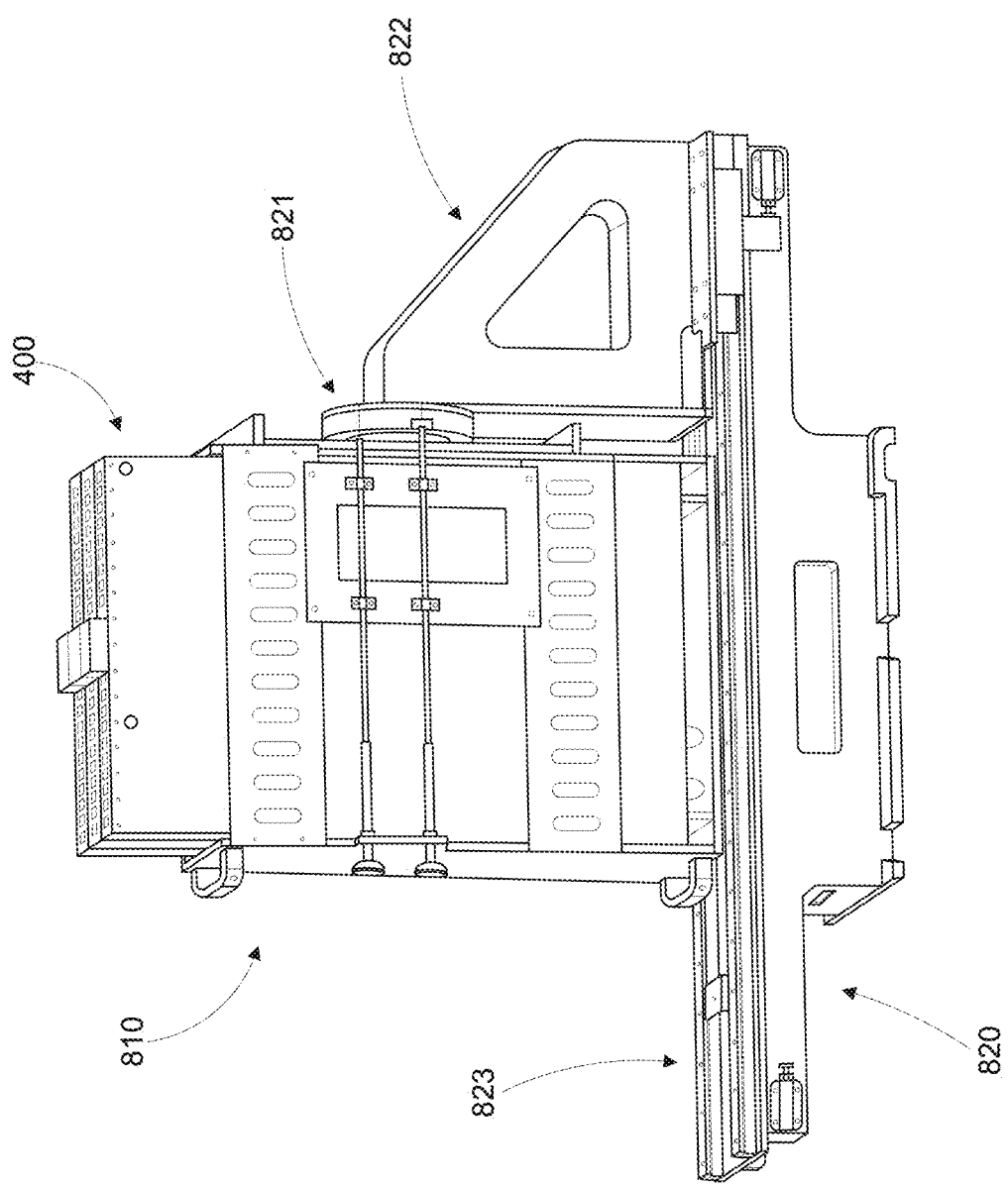

As shown in FIG. 15B, during normal operations, the supporting member 822 may be retracted with respect to the outer housing of the computing system. The magazine 810 may be stored above the rail 823 during normal operations. In some embodiments, the weight of the magazine 823 is supported by the supporting member 822 and rail 823 regardless of the position of the supporting member 822 on the rail 823.

In some embodiments, computer components, such as, for example, servers, utilized with disclosed embodiments may be denser and/or heavier than traditional computer components. In some embodiments, due to the increased cooling capabilities of disclosed embodiments, a blade server may weigh at least as much as about 50 lbs, or at least as much as about 60 lbs, or at least as much as about 70 lbs, or at least as much as about 80 lbs, or at least as much as about 90 lbs, or at least as much as about 100 lbs. In some embodiments, a blade server may weigh at most as much as about 50 lbs, or at most as much as about 60 lbs, or at most as much as about 70 lbs, or at most as much as about 80 lbs, or at most as much as about 90 lbs, or at most as much as about 100 lbs. As shown in FIG. 15B, a magazine 810 can hold a plurality of chassis 400 or blade servers where an individual blade server may weigh about 73 lbs. When the magazine is loaded with three such servers, the combined weight of the magazine 810 and servers may be about 395 lbs.

In some embodiments, the servers used are blade servers mounted on a chassis. The server and/or chassis may contain a backplane system to facilitate the installation and removal of the servers in the computing system. In some embodiments, the servers may be immersion servers which do not include a fan or other air cooling devices. In some embodiments, an individual server board may comprise 16 GPU's and be configured to draw about 6 KW of power. In some embodiments, the servers are 1.5 U servers. Some disclosed servers may be 1 Otto Immersion Unit (OIU) servers. Such servers are 1.5 U tall and configured for liquid immersion cooling. In some embodiments, a single tank within the computing system may be configured to operate ten 1 OIU servers and about 60 KW of power when all ten severs are operating at substantially full power. In some embodiments, the computing system may comprise one or two of such tanks. In some embodiments, the computing system may comprise multiple tanks such as, for example, ten such tanks.

In some embodiments, when a magazine is extracted from the computing system, as shown in FIG. 15A, the supporting member moves along the rail from a storage position and is cantilevered outside of the outer housing of the computing system.

Figure 15C:
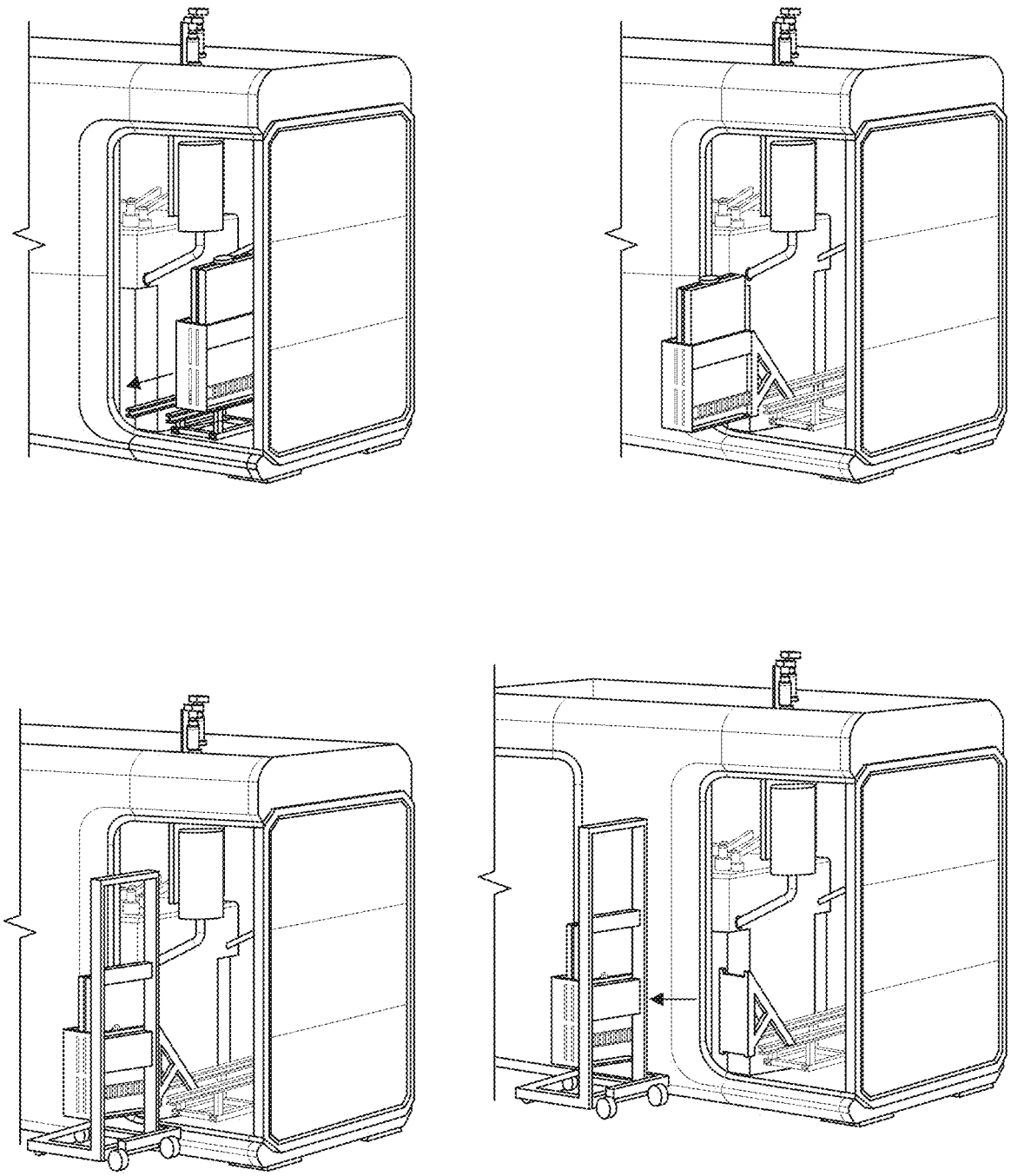
Figure 15D:
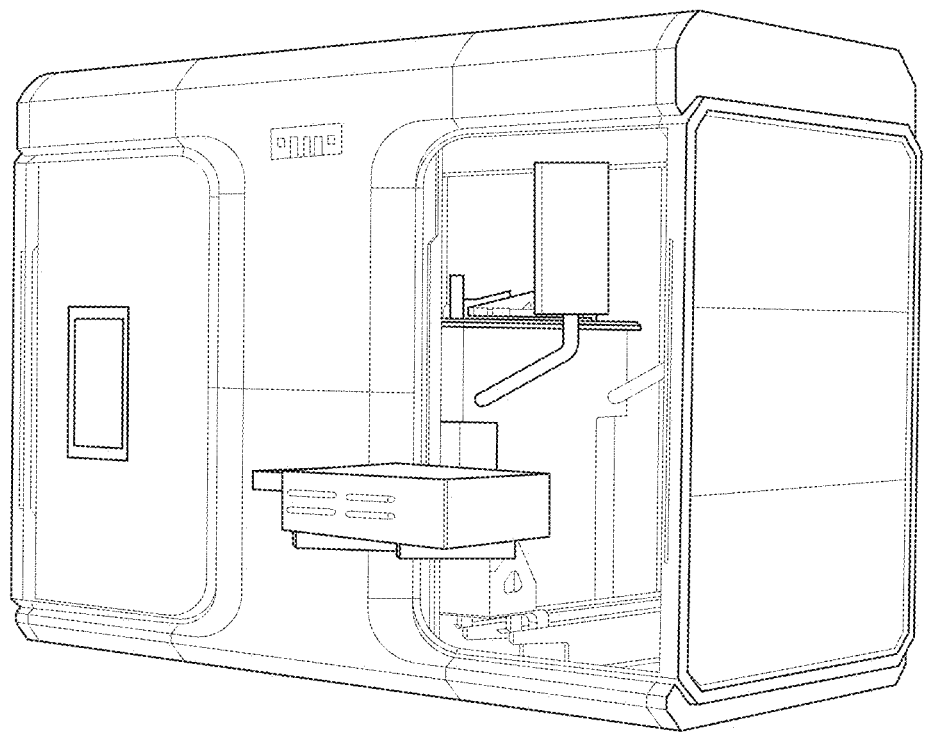
Figure 15D:
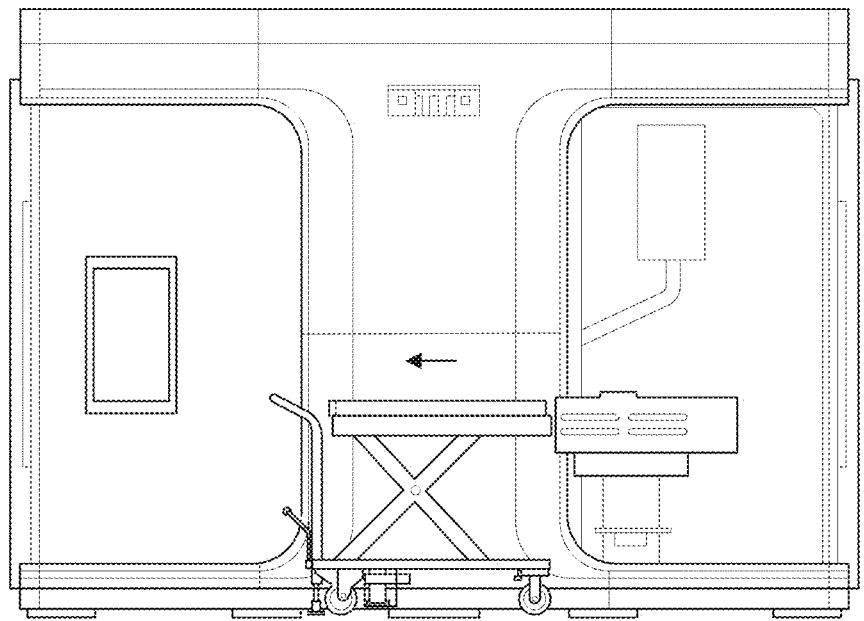

As also shown in FIGS. 15C-D, the magazine may be pulled out or otherwise slide along the rails and be cantilevered outside of the computing system. In some embodiments, as shown in FIGS. 15C-D, a magazine removal tool may be used to remove the entire magazine and the components contained within the magazine. In such embodiments, the magazine removal tool may be used to lift the magazine off of the supporting member and slide rails in order to transport the magazine.

In some embodiments, once the magazine has been moved to the exterior of the computing system, the platform may rotate the magazine to a substantially horizontal position. The servers contained within the magazine may then slide out of the magazine.

FIGS. 15A-D illustrate an exemplary series of steps for removing a server from a magazine according to an exemplary embodiment. In the exemplary embodiment, the magazine may be attached to a linear guide rail system behind an access door. As shown in FIGS. 15C-D, the magazine may be pulled out and cantilevered outside the computing system. The magazine may be pulled out manually or be moved out of the computing system using a motorized or automated system. As shown in FIG. 15D, the magazine may be rotated about 90 degrees to orient the servers and/or other components contained in the magazine in a substantially horizontal position. Once in a substantially horizontal position, the servers and/or other components can slide out of the magazine and onto a cart or other tool configured to receive the servers and/or other components. As shown in FIG. 15C, a scissor-lift cart may be adjusted to a convenient height to receive the servers or other components. An adjustable height cart with a rolling surface may be used to allow the servers to be transferred from the magazine onto the cart without requiring a human operator to support the weight of the servers. As shown in FIG. 15D, once a server is slid onto a cart with a gliding or rolling surface, the server or other component may be transported elsewhere to be replaced or serviced. It will be appreciated that new components may be loaded into the magazine using substantially the same steps in the reverse order.

In some alternative embodiments, the magazine may be supported on a rotating and extendable arm without a rail. In such embodiments, the magazine may be stored in a substantially vertical position within the outer housing of the computing system during normal operations. Once it is determined that the components within the magazine should be replaced, the magazine may be extended outside of the outer housing using the extendable arm. Once the magazine is extended beyond the outer housing, the magazine may be rotated from a substantially vertical position to a substantially horizontal position to allow the components stored within the magazine to be horizontally removed from the magazine.

Bellows

In some embodiments, a bellows and/or vapor collection system may be utilized. Before some disclosed embodiments are initially activated the dielectric fluid, computer components such as servers, and other system components may be at thermal equilibrium. Once a computing system is activated, the computer components, such as servers may begin to generate heat that maybe dissipated into the dielectric fluid. This process causes some of the dielectric fluid to shift from a liquid state to a vapor state. As the temperature of the fluid increases, a greater proportion of the dielectric fluid may shift to a vapor state. In a closed system, the increasing volume of dielectric vapor may result in increased pressure within the system. In some embodiments, the tank containing the dielectric fluid may be in fluid and/or vapor communication with a recovery system.

Figure 16:
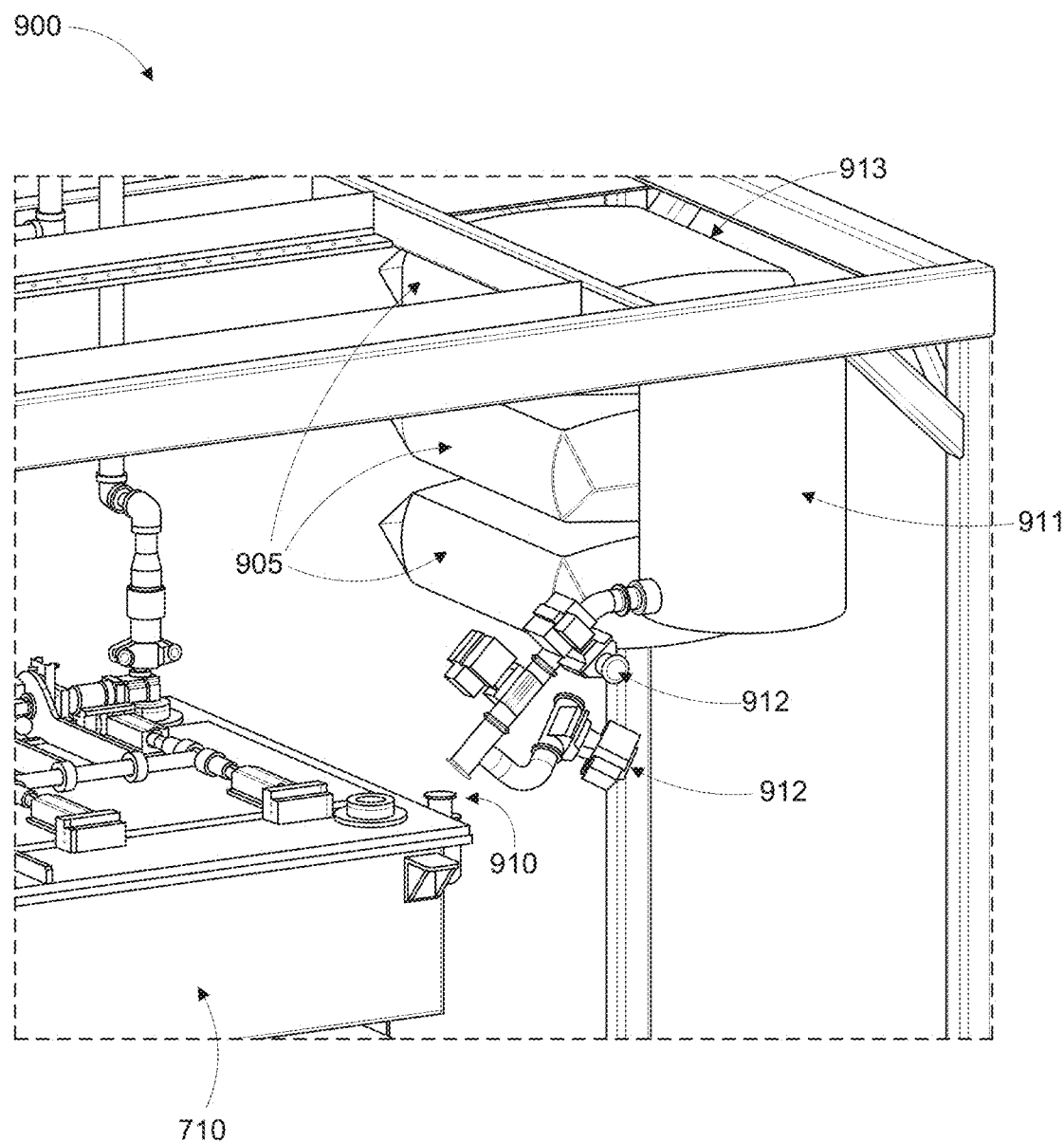
FIG. 16 shows a vapor recovery system according to an exemplary embodiment.

FIG. 16 shows a vapor recovery system 900 according to an exemplary embodiment. The recovery system 900 is connected to the tank 710 containing dielectric vapor. Dielectric vapor may flow from the tank 710 through piping to one or more bellows 905. In some embodiments, the vapor recovery system 900 comprises an expanding and collapsing bellows 905 configured to receive the dielectric vapor, thereby reducing or eliminating any pressure build-up in the tank 710. When the system cools or a portion of the dielectric vapor is condensed to dielectric liquid, the bellows may collapse or contract to substantially maintain a pressure equilibrium within the tank 710.

In some embodiments, the vapor recovery system 900 comprises a valve 912 configured to allow ambient air into the vapor recovery system. In such embodiments, the dielectric vapor may be mixed with ambient air. Mixing dielectric vapor with ambient air may reduce the temperature of the dielectric vapor. In some embodiments, the mixed air/vapor may be directed through a carbon bed 911. The carbon media within the carbon bed 911 may be configured to attract the dielectric vapor while allowing the ambient air to pass through the carbon media and be vented from the system 900, e.g., through an outlet valve 913. In this manner, the heated dielectric vapor may be cooled and captured by the carbon media.

Upon operating for a sufficient period of time, embodiments of the computing system will reach a steady thermal state based on the power capacity of the computing components being utilized. If more or less computing power is utilized, more or less dielectric fluid may be shifted to dielectric vapor. This may cause the bellows 905 to inflate and/or deflate in response to the heat dissipated into the dielectric fluid.

In some embodiments, the bellows 905 may comprise one or more pouches. Each pouch may comprise a metal foil and polymer laminated construction. The bellows pouches may be connected to the vapor recovery system piping and to each other in series or in parallel. In some embodiments, the total volume of the expanded bellows pouches may be at least about 15% of the liquid fluid volume of the tank. In some embodiments, the total volume of the expanded bellows pouches may be at least about 20%, or at least about 23%, or at least about 25%, of the liquid fluid volume of the tank or greater. In some embodiments, the total volume of the expanded bellows pouches may be at most about 40%, or at most about 30%, or at least about 25%, of the liquid fluid volume of the tank or less.

In some embodiments, when the computing system has substantially reached thermal stabilization, the vapor recovery system 900 may be closed to cooling ambient air and a valve allowing the air to be exhausted out of the system may be closed. In some embodiments, the carbon bed may be configured to be opened to only the tank and bellows using valves. In some embodiments, a desorption heater configured to communicate heat to the carbon media may be activated to raise the temperature of the carbon media. As the carbon media temperature increases, any dielectric fluid previously captured by the carbon media may be driven off of the carbon and back into the tank where it can be condensed back to dielectric fluid as previously described.

In some embodiments, when a computing system is powered at less than a previous steady state, the portion of dielectric fluid in the vapor state may be reduced and, in some embodiments, the bellows may contract to accommodate the reduction in dielectric vapor. In some embodiments, a valve that allows ambient air into the bellows may be opened in order to allow air into the bellows and further reduce any pressure differential. In some embodiments, nitrogen, rather than ambient air, may be used to reduce a pressure differential and also avoid introducing any potential contamination from ambient air.

In some embodiments, the bellows and/or vapor recovery system can be completely, or substantially, passive. In some embodiments, the bellows and/or vapor recovery system can be powered and/or automated based on sensor data from temperature, pressure, and/or power sensors positioned throughout the computing system.

In some embodiments, the computing system with vapor recovery system is emission free even if the system is not a closed system. In some embodiments, ambient air or nitrogen may be introduced into the system and exhausted out of the system without releasing any or substantially any dielectric fluid into the surrounding atmosphere.

Exemplary Embodiments

Disclosed embodiments allow for increased density of computer components and/or computing power. In some embodiments comprising two-phase liquid immersion cooled computer components 170 within a pressure controlled vessel 110, components may be separated from each other by less than about 1" or less than about 0.7 inches, or less than about 0.5 inches. In some embodiments, individual components may be separated by more than about 0.3 inches, or more than about 0.5 inches, or more than about 0.7 inches, or more than about 1 inch, or more than about 1.5 inches.

Some disclosed embodiments allow improved power utilization effectiveness (PUE) as compared to a traditional data center. Using disclosed embodiments allows for reduced energy usage for cooling computer components 170, thereby reducing the total energy usage of a data center and bringing the PUE closer to 1.0. Some embodiments relate to data centers comprising two-phase liquid immersion cooled computer components within a pressure controlled vessel 110 wherein the data center has an PUE of less than about 1.15, or less than about 1.10, or less than about 1.08, or less than about 1.05. Some embodiments relate to data centers comprising two-phase liquid immersion cooled computer components within a pressure controlled vessel 110 wherein the data center has an PUE of more than about 1.05, or more than about 1.06, or more than about 1.08, or more than about 1.10.

In some embodiments a thermally conductive condensable dielectric fluid is provided to be used in a two-phase liquid immersion cooling system. Computer components are operated under less than ambient atmospheric pressure which reduces the temperature at which the dielectric fluid vaporizes, thereby maintaining the liquid phase of the dielectric fluid at a lower temperature as compared to standard atmospheric pressure. The computer components generate heat as they operate. The generated heat is transferred to the dielectric liquid in contact with the computer components, causing the dielectric liquid to vaporize into a gas. The gaseous dielectric fluid may be condensed using a condenser. Ambient temperature, or chilled process water is passed through the condenser. When the gaseous dielectric fluid is cooled by the condenser, it condenses back to a liquid phase and falls back into a bath of liquid dielectric fluid.

Some disclosed embodiments relate to high density data centers. Traditional data centers include about 1 megawatt (MW) of computing power dispersed over about 10,000 square feet. High end data centers may include about 1 MW of computing power dispersed over about 6,000 square feet. Disclosed embodiments relate to data centers comprising two-phase liquid immersion cooled computer components 170 within a pressure controlled vessel 110 wherein the data center utilizes about 1 MW of computing power dispersed over about 3,000 square feet, or about 1,500 square feet, or about 1,000 square feet, or about 800 square feet, or about 600 square feet. In some embodiments, multiple pressure controlled vessels containing the disclosed computing system may be arranged in rows and powered by a central power supply. In some embodiments, multiple embodiments of the disclosed computing system may be connected to each other in series.

Disclosed embodiments comprise liquid immersion cooled computer components 170 within a pressure controlled vessel 110, accordingly, the components are insulated from atmospheric contamination by the pressure controlled vessel and by being submerged in dielectric liquid 140. Some disclosed embodiments relate to data centers which operate with minimal air filtration and/or cleaning requirements. In some embodiments, the data center operates in the absence of HEPA filters or the equivalent, or in the absence of MERV 11 filters or the equivalent, or in the absence of MERV 8 filters or the equivalent.

Disclosed embodiments comprise liquid immersion cooled computer components 170 within a pressure controlled vessel 110, accordingly, the components are not cooled by air of gases. Disclosed embodiments include a data center which operates in the absence of cooling fans and/or any other similar device for circulating air.

Disclosed embodiments relate to environmentally friendly data centers. In some embodiments, a data center comprise liquid immersion cooled computer components 170 within a pressure controlled vessel 110 and consume little to no water for cooling processes. Some embodiments utilize a closed circuit dry cooling tower to reduce the temperature of water which is circulated through the disclosed condensing structures 130 in order to cool the condensing structures 130 and condense dielectric fluid vapor into dielectric fluid liquid. Such embodiments operate without significant input or output of water as the closed loop, dry cooling tower does not rely on evaporative cooling or a stream of water for cooling operations. Some data center embodiments utilize and/or discharge less than about 10,000 gallons of water per day, or less than about 1,000 gallons of water per day, or less than about 100 gallons of water per day, or less than about 10 gallons of water per day, or 0 gallons of water per day. Some data center embodiments utilize and/or discharge more than about 100 gallons of water per day, or more than about 1,000 gallons of water per day, or more than about 10,000 gallons of water per day.

Disclosed embodiments relate to a computing system comprising a pressure controlled vessel operably connected to a pressure controller and/or source of vacuum, wherein the pressure controlled vessel has an interior and an exterior and is configured to contain an atmosphere within the interior; a volume of thermally conductive, condensable dielectric fluid; a rack for mounting computer components, wherein the rack is arranged such that the computer components are at least partially submerged within the volume of thermally conductive dielectric fluid when mounted on the rack; and a condensing structure, wherein the volume of thermally conductive dielectric fluid, rack, computer components, and condensing structure are contained within the pressure controlled vessel. Some embodiments relate to a cooling system comprising a pressure controlled vessel comprising an interior wherein said vessel is configured to be operably connected to a pressure controller to reduce the interior pressure below atmospheric, wherein the pressure controlled vessel is configured to comprise a volume of thermally conductive, condensable dielectric fluid in liquid and gas phase; one or more computer components arranged such that the one or more computer components may be at least partially submerged within the liquid phase of a volume of thermally conductive, condensable dielectric fluid; and a condenser for condensing gas phase dielectric fluid to liquid phase dielectric fluid.

In some embodiments, the pressure controlled vessel is mounted within a super structure, the blade server is configured to be swappable without disruption of the computing system, the pressure controlled vessel is operably connected to a power supply, source of water, and networking connections, the pressure controlled vessel comprises an opening on the top and a lid configured to sealably close the opening, the lid is configured to direct rising vapors from the middle of the pressure controlled vessel to the sides of the pressure controlled vessel, the pressure controlled vessel has an interior volume of between about 100 cubic feet and about 300 cubic feet, and/or wherein the pressure controlled vessel contains a ratio of liquid dielectric fluid to gaseous dielectric fluid of between about 1:3 and about 1:8. Some embodiments further comprise a ballast block, a blade server and a blade server chassis, a robotic arm and an airlock, wherein the airlock is configured to allow access to the interior of the pressure controlled vessel without significantly disrupting the atmosphere within the pressure controlled vessel, and/or a purge system, wherein the purge system is configured to remove contaminants from the volume of thermally conductive dielectric fluid. In some embodiments, the purge system is configured to remove a portion of the atmosphere from the pressure controlled vessel, condense any dielectric fluid from the atmosphere, and discard any remaining vapors. In some embodiments, the purge system is configured to condense at least a portion of gaseous dielectric fluid, and discard gaseous contaminants.

Some embodiments relate to a method for cooling computer components, the method comprising: providing a housing, wherein the housing contains a thermally conductive, condensable dielectric fluid and heat-generating computer components, and wherein the housing is configured to withstand at least a slight vacuum; operating computer components, wherein operating the computer components generates heat and wherein the computer components are in contact with the dielectric fluid; and creating a vacuum within the housing, wherein the pressure within the housing is at least below about 1 atmosphere. Some embodiments further comprise maintaining the vacuum within the housing, wherein the pressure within the housing is below about 1 atmosphere while the computer components are operating, vaporizing the dielectric fluid from a liquid state to a gaseous state using the heat generated by the computer components and condensing the dielectric fluid from a gaseous state to a liquid state using a condenser, removing fluids which are not readily condensable from the dielectric fluid. In some embodiments, and/or replacing a portion of the computer components while the system is operating. In certain embodiments removing non-condensable fluids comprises isolating a portion of the gaseous atmosphere from within the housing, condensing any dielectric fluid from the gaseous atmosphere; returning the condensed dielectric fluid to the housing, and discarding any remaining portion of the gaseous atmosphere and/or the housing is configured to generate a convection current.

Some embodiments relate to a method of cooling computer components comprising operating computer components at less than ambient pressure, wherein the computer components are in contact with a thermally conductive, dielectric fluid. Some embodiments further comprise vaporizing the dielectric fluid and condensing the dielectric fluid at less than ambient pressure.

Some embodiments relate to a method for cooling computer components, the method comprising: providing a thermally conductive, condensable dielectric fluid in a liquid and gas phase; and operating computer components at a pressure below ambient atmospheric pressure in the presence of the thermally conductive, condensable dielectric fluid, wherein the computer components are at least partially in contact with the thermally conductive, condensable dielectric fluid in liquid phase. Some embodiments further comprise vaporizing the dielectric fluid from a liquid phase to a gas phase using at least a portion of any heat generated by the operating computer components; condensing at least a portion of the dielectric fluid from a gas phase to a liquid phase; removing at least a portion of non-readily condensable fluids from the dielectric fluid; and/or replacing at least one or more computer components while said computer components are operating.

Some embodiments relate to a method of cooling computer components, the method comprising: operating computer components at least at 1 psi less than ambient pressure, wherein the computer components at least partially in contact with a thermally conductive, dielectric fluid, and wherein the boiling point of the dielectric fluid is below about 80° C. Some embodiments further comprise condensing the dielectric fluid at conditions such that the computer components do not exceed about 80° C.

It will be understood that the various disclosed embodiments may incorporate some or all of the components otherwise described herein. The particular components and the properties thereof may be adjusted based on the properties of each particular embodiment. Modifications may include the use of higher or lower density power, cooling, and network connectivity systems, pressure management systems, vapor management systems and selection of particularized equipment and components.

From the foregoing description, one of ordinary skill in the art can easily ascertain the essential characteristics of this disclosure, and without departing from the spirit and scope thereof: can make various changes and modifications to adapt the disclosure to various usages and conditions. The embodiments described hereinabove are meant to be illustrative only and should not be taken as limiting of the scope of the disclosure.

Heating up and Cooling Down of the Tank in Response to a Shock Event

In one example embodiment, an immersion cooling system or a vessel can include a tank, a computing device, a robot, an absorption unit, a bellows and a management system. The tank can be a pressure controlled tank maintained at the atmospheric pressure (or within a range thereof). The tank can include a bath area and a sump area, and the computing device can be immersed in a dielectric fluid in the bath area of the tank. The computing device can be connected to a network and perform various processing tasks while immersed in the dielectric fluid. The tank can include a lid for accessing the bath area, the computing device and the sump area. The tank can be fluidly coupled to the bellows and the absorption unit, and a plurality of valves can selectively connect or disconnect the tank to and from the bellows and the absorption unit so that dielectric vapor can transfer to the bellows and/or absorption unit, or vice versa. The robot can be a gantry robot, which can lift the computing device from the tank of the vessel when the lid of the tank is open. The robot can place the lifted computing device in a magazine provided for storage of computing devices. The robot can also lift a computing device from the magazine and place it in the place of the lifted computing device from the tank.

Figure 18:
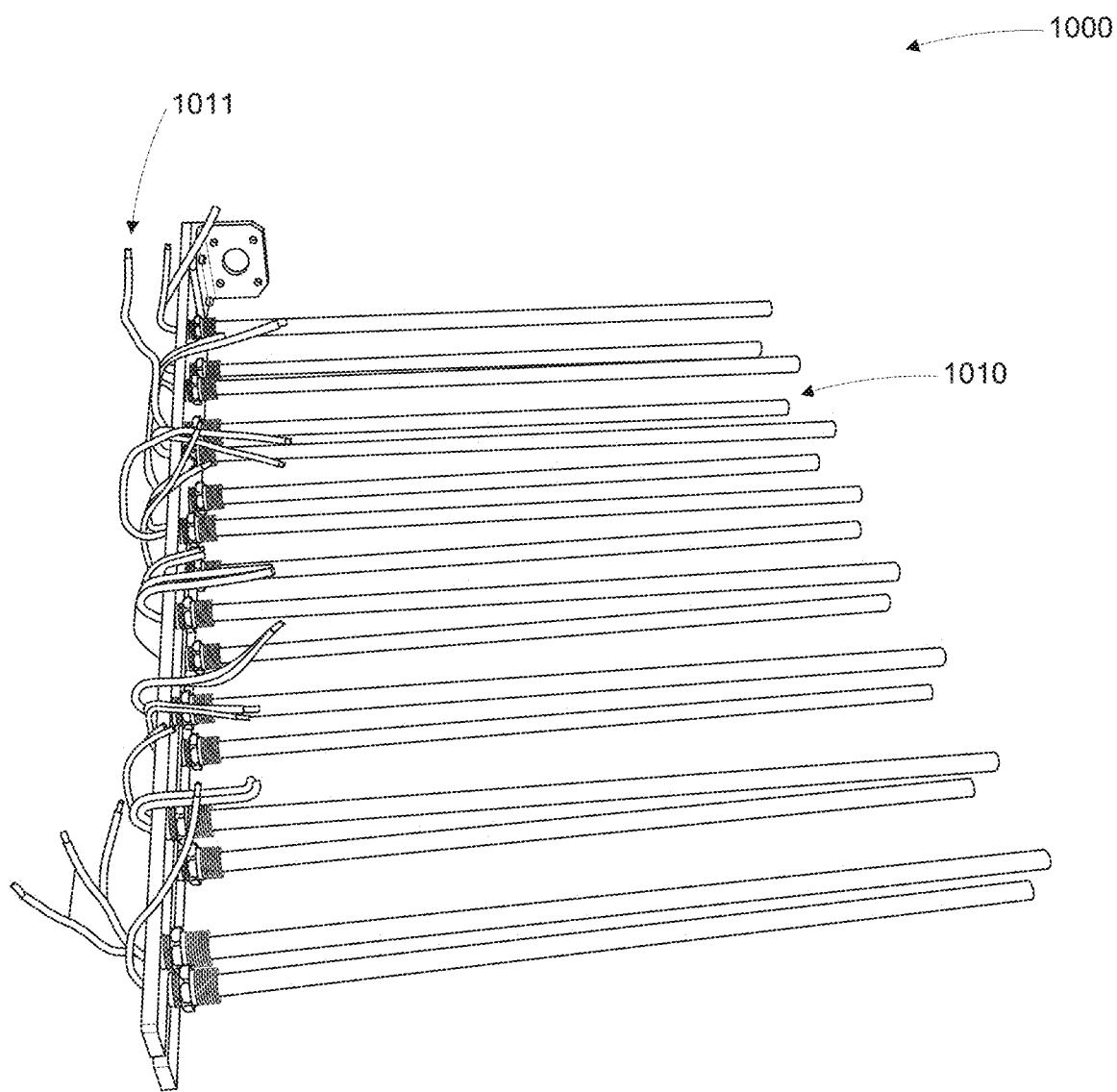
FIG. 18 shows an example of a heating element for an immersion cooling system according to an example embodiment.

In one example embodiment, the tank can include a heating element, e.g., a plurality of heating rods some of which are at least partly immersed in the dielectric fluid. The tank can include a plurality of sensors, e.g., temperature sensors, pressure sensors or sensors which provide operating data relating to the computing device (e.g., current, voltage, workload, etc.). The temperature sensors can be located inside the bath or in an area above the bath. Using data received from the sensors, the management system of the vessel can operate the heating element to regulate or control the temperature or temperature fluctuations of the dielectric fluid (and/or pressure or pressure fluctuations of the dielectric vapor) in the tank. FIG. 18 shows an example of a heating element 1000 for an immersion cooling system according to an example embodiment. The heating element 1000 can include a plurality of heating rods 1010. Each heating rod can include a plurality of wires 1011, which can be connected to a power supply of the tank. A controller of the tank can regulate the heating element 1000 to heat up the bath area of the tank, e.g., during various operations of the tank. In this example embodiment, the heating element 1000 can be mounted in the bath of the tank and fully immersed in the dielectric fluid.

In one example embodiment, the heating element is separate from the computing device and the heating element does not process data. The heating element may be dedicated to only generating heat and no other function. The heating element may be readily controlled particularly during an operation of the tank (e.g., startup operation), a change of components, or other times when control is necessary. The heat generated by the heating element may be adjustable upon evaluating data indicating the size of the bellows and other aspects of the system, e.g., pressure or temperature.

In particular, rapid changes in power consumption or workload of the computing device (e.g., caused by the end user activity or lack thereof) can result in rapid changes to the amount of heat generated by the computing device within the vessel. This in turn can cause a rapid temperature change within the tank or the bath, which can result in a sudden change in the pressure in the tank (because in a closed insulated system, the pressure and temperature are directly related, i.e., PV=nRT). These pressure fluctuations can damage the vessel and introduce contaminant gasses (e.g., air) or particulates (e.g., dust) to the tank. These pressure fluctuations can also cause leakage of the dielectric fluid from the tank. To counter the effects of these pressure fluctuations, it is possible to use the bellows or the absorption unit to remove excessive vapor from the tank or introduce vapor into the tank when the pressure drops. However, by using a heating element, the capacity of the bellows and absorption unit can be reduced, thereby a more space efficient vessel can be designed. If the heating element is not used, in the event of an excessive increase in the pressure, the bellows can burst.

The heating element can allow for modulation in change of temperature within the tank or the bath, thereby facilitating a controlled transition between the various operating load conditions that may be experienced by the computing device during its operation. For example, in the event of a rapid decrease in operational workload of the computing device, the heat generated by the computing device can drop rapidly. This can cause a sudden decrease in the internal pressure of the tank. The heat element can add heat to the tank to allow for a controlled decrease in the temperature of the dielectric fluid, e.g., during a shutdown process. In other words, the heating element can balance the pressure and temperature of the tank in the event of a sudden change in the workload of the computing device, i.e., a shock event. As such, the vessel requires a much smaller bellows and absorption unit to maintain the atmospheric pressure of the tank.

In one example embodiment, the management system of the vessel can decide how much heat to add to the tank in response to a shock event, e.g., an increase or decrease in the internal pressure or temperature of the tank. In one example embodiment, the rate of the drop (or increase) in temperature or pressure can determine how much heat to add to the tank. For example, in the event that the tank's dielectric fluid temperature level decreases more than a certain number of degrees, over a certain number of minutes, the management system can activate the heating element to add a certain amount of heat to the tank (e.g., to maintain the temperature and pressure of the system). This added heat can cause the fall in temperature to stop or the rate at which the temperature is falling to decrease. The management system can stop the heating element from adding heat to the system when the tank is in a steady state, e.g., the rate of fall in pressure or temperature is below a threshold value. In another example embodiment, the actual temperature of the dielectric fluid within the tank when the increase or decrease of the workload of the computing device initiated can determine how much heat to add to the tank.

In one example embodiment, the management system can activate the heating element when a shock event is detected, e.g., before, during or after a startup operation, a boost operation, a slowdown operation, or a shutdown operation. The management system can detect the mode of operation of the vessel (e.g., startup or shutdown) by receiving sensor data (e.g., from the temperature or pressure sensors in the tank) or data from the computing device (e.g., current, voltage, temperature, workload, data transfer, etc.). The heating element can moderate or regulate the change in temperature or pressure within the tank to minimize the deviation of the pressure from an atmospheric pressure. Otherwise, without operation of the heating element according to the techniques disclosed herein, the vessel will have to either absorb or store the excessive gas generated as a result of a rapid heat up of the computing device or the vessel will have to desorb or supply gas to negate a drop in pressure as a result of a rapid drop in heat generation of the computing device.

During a startup operation, a temperature of the tank, e.g., temperature of the dielectric fluid in the bath, is below a threshold value when the computing device starts operating. The startup operation can occur, e.g., when the vessel is just turned on and the tank is cold. Because the computing device can heat up quickly, the computing device can generate a lot of vapor if the dielectric fluid is cold. Therefore, before, during or after the startup operation, the management system can activate the heating element to heat up the dielectric fluid, thereby increasing the temperature of the dielectric fluid in a controlled manner and minimizing the vapor generation by the computing device. For example, the heating element can slowly increase the temperature of the dielectric fluid to a threshold temperature before the computing device is turned on. Otherwise, the vessel will have to accommodate an excessive quantity of vapor to maintain the tank at atmospheric pressure, which can require a large capacity at the bellows and the absorption unit.

During a boost operation, a temperature of the tank, e.g., temperature of the dielectric fluid in the bath, can increase faster than a threshold rate (e.g., when the temperature of the tank is below a threshold value). The boost operation can occur, e.g., when the computing device is operational and the workload of the computing device increases significantly, e.g., due to an increase in consumer demand. A sudden increase in the workload of the computing device can increase the amount of heat generated by the computing device, thereby increasing the amount of vapor generated by the computing device. Therefore, before, during or after the boost operation, the management system can activate the heating element to heat up the dielectric fluid, thereby increasing the temperature of the dielectric fluid in a controlled manner and minimizing the vapor generation by the computing device. Otherwise, the vessel will have to accommodate an excessive quantity of vapor to maintain the tank at atmospheric pressure, which can require a large capacity for storage or absorption at the bellows and the absorption unit.

During a slowdown operation, a temperature of the tank, e.g., temperature of the dielectric fluid in the bath, can decrease faster than a threshold rate (e.g., when the temperature of the tank is above a threshold value). The slowdown operation can occur, e.g., when the computing device is operational and the workload of the computing device decreases significantly, e.g., due to a drop in consumer demand. A sudden decrease in the workload of the computing device can decrease the amount of heat generated by the computing device, thereby suddenly decreasing the pressure in the tank. Therefore, before, during or after the slowdown operation, the management system can activate the heating element to heat up the dielectric fluid, thereby decreasing the temperature of the dielectric fluid in a controlled manner and minimizing the pressure drop in the tank. Otherwise, the vessel will have to generate a large quantity of vapor to maintain the tank at atmospheric pressure, which can require a large storage or desorption capacity at the bellows and the absorption unit.

During a shutdown operation (or a controlled shutdown process), the vessel is ordered to turn off while a temperature of the tank, e.g., temperature of the dielectric fluid in the bath, is above a threshold value. Because the computing device can stop generating heat suddenly, the pressure in the tank can drop rapidly. Therefore, before, during or after the shutdown operation, the management system can activate the heating element to heat up the dielectric fluid, thereby decreasing the temperature of the dielectric fluid in a controlled manner and minimizing the pressure drop. For example, the heating element can slowly heat up the dielectric fluid so that the temperature of the dielectric fluid slowly drops when the computing device is turned off. Otherwise, the vessel will have to generate a large quantity of vapor to maintain the tank at atmospheric pressure, which can require a large storage or desorption capacity at the bellows and the absorption unit.

In one example embodiment, as the vessel responds to a shock event, the management system (or another system) can add vapor or fluid to the tank or remove vapor or fluid from the tank to maintain the pressure of the tank at a pressure close to an atmospheric pressure. For example, as the temperature of the tank increases, vapor or fluid can be removed from the tank and as the temperature of the tank decreases, vapor or fluid can be added to the tank.

The vessel can use various mechanisms for adding vapor or fluid to the tank or removing vapor or fluid from the tank. In one example embodiment, the vessel can use a bellows as the mechanism for adding vapor to the tank or removing vapor from the tank. In another example embodiment, the vessel can use an absorption/desorption unit (hereinafter "absorption unit") for adding vapor to the tank or removing vapor from the tank. Yet in another example embodiment, the vessel can use a pressurized container for adding vapor to the tank or removing vapor from the tank. Yet in another example embodiment, the vessel can use a combination of the above-named mechanisms for adding vapor or fluid to the tank or removing vapor or fluid from the tank. Yet in another example embodiment, the vessel can use a combination of the heating element and one or more of the above-named mechanisms to maintain the pressure of the tank.

For example, during a startup operation, the management system can use a combination of the heating element and the bellows to maintain the pressure of the tank. In one example, before the computing device is turned on, the management system can activate the heating element to heat up the dielectric fluid. At some point (e.g., before, after or during the heating), the management system can open a valve connecting the bellows to the tank, thereby facilitating a transfer of the dielectric vapor to the bellows. This transfer of the dielectric vapor to the bellows can prevent an uncontrolled increase in the pressure of the tank, thereby allowing for the temperature of the dielectric fluid to increase while the pressure of the tank can be maintained (e.g., within a tolerance range).

Similarly, during a startup operation, the management system can use a combination of the heating element and the absorption unit to maintain the pressure of the tank. At some point (e.g., before, after or during the heating), the management system can open a valve connecting the absorption unit to the tank, thereby facilitating a transfer of the dielectric vapor to the absorption unit, which can absorb or maintain the dielectric vapor in the absorption unit, e.g., a carbon bed. Similarly, during a startup operation, the management system can use a combination of the heating element and the pressurized container to maintain the pressure of the tank. At some point (e.g., before, after or during the heating), the management system can open a valve connecting a pump and the pressurized container to the tank, thereby facilitating a transfer of the dielectric vapor to the pressurized container using the pump. The pressurized container can store the dielectric vapor.

As another example, during a shutdown operation, the management system can use a combination of the heating element and the bellows to maintain the pressure of the tank. In one example, after the computing device is turned off, the management system can activate the heating element to heat up the dielectric fluid. At some point (e.g., before, after or during the heating), the management system can open a valve connecting the bellows to the tank, thereby facilitating a transfer of the dielectric vapor to the tank. This transfer of the dielectric vapor to the tank can prevent an uncontrolled decrease in the pressure of the tank, thereby allowing for the temperature of the dielectric fluid to decrease while the pressure of the tank can be maintained (e.g., within a tolerance range).

Similarly, during a shutdown operation, the management system can use a combination of the heating element and the absorption unit to maintain the pressure of the tank. At some point (e.g., before, after or during the heating), the management system can open a valve connecting the absorption unit to the tank, thereby facilitating a transfer of the dielectric vapor to the tank. In the case of a carbon bed as the absorption unit, the management system can activate the carbon bed to release the trapped or absorbed dielectric molecules. The management system can activate the carbon bed by, e.g., transmitting a signal to a switch to turn on a heating device within the carbon bed. In one example, as the pressure of the tank drops, the carbon bed can be heated up to release dielectric vapor and minimize the drop in pressure.

Similarly, during a shutdown operation, the management system can use a combination of the heating element and the pressurized container to maintain the pressure of the tank. At some point (e.g., before, after or during the heating), the management system can open a valve connecting the pressurized container to the tank, thereby facilitating a transfer of the dielectric vapor to the tank.

In one example embodiment, there can be a tradeoff between using the bellows and the absorption unit. The bellows is a passive device, but the absorption unit is an active device. A bellows-based system can be more power efficient than an absorption-unit-based system because the bellows does not require active heating. However, the bellows takes more space than the absorption unit and the absorption-unit-based system provides a greater degree of control and functionality. Some of the design constraints in this regard can be efficiency, control and space.

In one example embodiment, the vessel can experience an uncontrolled shutdown. For example, the vessel can experience an uncontrolled shutdown due to loss of power. In this example embodiment, an emergency shutdown process can be implemented to address possible pressure fluctuations in the tank. For example, the vessel may have a backup or uninterruptible power supply ("UPS") that can supply power to the vessel and its management system (or another system). If the management system receives a signal from the sensors indicating that, as a result of the power loss and cooling down of the system, the pressure inside the tank is dropping below an acceptable threshold, the management system can instruct a bypass valve to open. The bypass valve can connect the tank to the environment outside of the tank. The bypass valve can introduce air to the tank, and therefore, normalize the pressure inside the tank (so that the tank or the bellows would not collapse). Subsequently, during the startup operation, the vessel can purge the air introduced inside the tank.

In one example embodiment, the management system (or another system) can use a table, matrix or map ("map") for determining how to respond to a shock event. In one example embodiment, the map can display a change in temperature as an input and display an output as to how much heat to add to the tank in response to the change in temperature. In one example embodiment, the map can include data relating to a vapor temperature, a tank pressure, a fluid level in the tank or sump area, a fluid pressure in a pump or filter, a differential pressure, a humidity level, and an alumina condition as input. In response to these inputs, the map can provide outputs such as condenser, heating element, pump, bellows valve, carbon intake valve, carbon exhaust valve, and computing device operating parameters. The map can define various states for the operation of the vessel. The management system can receive various data from sensors provided throughout the vessel. Using the map, the management system can convert the data to operating parameters for the devices on the vessel, e.g., the bellows, absorption unit, valves, heating element, pump, condenser, and computing device.

In one example embodiment, the vessel can be operated at a temperature near the boiling point of the dielectric fluid and a pressure near the atmospheric pressure. However, one of ordinary skill in the art recognizes that based on the optimal operating temperature for operating the computing device, the vessel can be operated at other temperature and pressure ranges. In one example embodiment, the optimal operating temperature of the system is about 137° F.±8°. In one example embodiment, the optimal operating pressure of the system is about the atmospheric pressure (e.g., 101,325 Pa)±5,000 Pa. In this example embodiment, during a shock event, the management system will try to maintain the temperature and pressure of the vessel within these ranges.

Although in some example embodiments of this disclosure the management system is designated as the system programmed to carry out various tasks in a shock event, one of ordinary skill in the art recognizes that other systems disclosed in this disclosure can be programmed to perform these tasks.

In one example embodiment, the vessel can operate under three modes of operation. In a first mode of operation, the tank can operate at atmospheric pressure. In a second mode of operation, the tank can operate at pressure ranges that significantly deviate from the atmospheric pressure. In a third mode of operation, the vessel can sometimes operate at atmospheric pressure and sometimes operate at pressure ranges that significantly deviate from the atmospheric pressure. The third mode of operation can be a hybrid of the first mode and the second mode. In one example embodiment, the management system can determine the mode of operation of the vessel. For example, the management system can operate the vessel based on rules defined for the management system, e.g., pressurize the vessel every morning at 5 AM and return to atmospheric pressure at night; pressurize the vessel during peak of workload as determined by sensor data. As another example, the management system can use a machine learning algorithm to predict the mode of operation for the vessel. For example, the machine learning algorithm can use sensor data as well as exogenous data, e.g., weather condition, calendar data, usage data, etc., to predict which mode of operation is more efficient under the circumstances. A user of the system can provide labeled data to the management system, which can extrapolate the data to create a model for predicting the mode of operation.

In one example embodiment, the management system can perform a specific routine before a lid of the tank can be opened. For example, if the vessel is provided with an instruction to open a lid of the tank, the condensing system can cool the system for a period of time before the management system allows for the lid to open. The condensing system can minimize the vapor in the tank so that when the lid is opened, minimal dielectric vapor is lost to environment.

In one example embodiment, the immersion cooling system can be a modular system. For example, each group of components of the system can be mounted on a separate skid, e.g., a condensing skid, a heating skid, a bellows skit, an absorption unit skid, etc. These skids can be movable and deployed for various applications.

Dielectric Fluid Circulation and Filtration

In one example embodiment, the vessel can include a pump for circulating the dielectric fluid through the tank. For example, the tank can include a sump area and a bath area. The bath area can hold the computing device immersed in the dielectric fluid. The sump area can be next to the bath area, or the sump area and can be in fluid communication with the bath area. For example, the sump area can receive an overflow of the dielectric fluid from the bath area, e.g., the dielectric fluid can flow over a wall of the bath area adjacent to the sump area. The pump can draw the dielectric fluid from the sump area and pass the fluid through a filter. After the filter, the dielectric fluid can return to the bath area. The vessel can include various pipes that couple the sump area, the pump, the filter and the bath area.

In one example embodiment, the vessel is provided with an amount of dielectric fluid such that the bath area is full of dielectric fluid and there is an overflow of dielectric fluid in the sump area. A full bath area ensures that the computing device is fully immersed in the dielectric fluid. The pump can draw the dielectric fluid from the sump area and pass it to the bath area, e.g., through the filter. Because there is more dielectric fluid in the tank than the bath area's capacity to hold fluid, when the pump runs, the bath area is always full (particularly when the pump operates). However, depending on the tank's temperature, the level of the dielectric fluid in the sump area can change because dielectric fluid can evaporate from the bath area and dielectric fluid from the sump area can replace the evaporated fluid in the tank.

In one example embodiment, the tank can be the shape of a rectangular box. The dielectric fluid can flow over the top of one of the shorter sides into the sump area, which is adjacent to the shorter side. The pump can draw the dielectric fluid and return or reintroduce it to a location in the tank that can cause minimum disruption or turbulence to the fluid in the bath as disruption or turbulence can cause cavitation in the fluid. In particular, the longer the distance between the overflow area to the reintroduction point, the less the turbulence associated with the reintroduction of the fluid into the tank. For example, if the dielectric fluid overflows from the top of a first side of the bath, the pump can return the dielectric fluid to the bottom of a side opposite to the first side. The pump can return the dielectric fluid to a corner of the bottom side, which minimizes disruption or turbulence to the fluid in the bath.

In one example embodiment, the vessel can include two pumps. Each pump can independently draw fluid from the sump area and pass it to the bath area. Providing the vessel with two separate and independent pumps can enhance the service life of the vessel. Additionally, if one of the pumps fails for any reason, the vessel can continue its operations without disruption until the failed pump is exchanged.

In one example embodiment, the vessel can include a filter. The filter can include one or more cores. Each core can filter the dielectric fluid for a different type(s) of contaminant, particle, substance, diluent or solute. In one example embodiment, the cores can be chosen based on the properties of the dielectric fluid and the contaminants likely to be introduced into the dielectric fluid. For example, the contaminants can include solder and resin, which are used during the manufacturing process of electronic boards used in the computing device. The dielectric fluid can act as a cleaning agent for resin, solder, dust, dirt or anything else in the system. Solder and resin (or other substances) can wash off from these electronic boards after they are immersed in the dielectric fluid. The filter can remove solder and resin (or other substances) from the dielectric fluid. If these substances are not removed from the dielectric fluid, when the dielectric fluid vaporizes, these substances will deposit as a layer on the heat generating components of the computing device, e.g., processors. As a result, the layer thermally isolates or insulates the heat generating components from the dielectric fluid, thereby reducing the efficiency of heat transfer from these components to the dielectric fluid. Thus, the components can heat up and break down more frequently.

In one example embodiment, the filter can include two cores, one core including activated carbon (charcoal) and one core including activated aluminum. For example, the ratio of activated carbon to activated aluminum can be 3 to 1. As another example, the filter can include four cores, three cores including activated carbon and one core including activated aluminum.

In one example embodiment, the filter can include a stripe for testing acidity of the dielectric fluid. The stripe can be a PH indicator, litmus paper or other indicator. In some instances, the dielectric fluid can become acidic after interaction with certain components of the tank. The stripe can be in contact with the dielectric fluid and change color if the dielectric fluid becomes acidic. The filter can include a color detection sensor, which can detect a change in color in the stripe and transmit a signal to the management system (or another system) if a change in color of the stripe is detected. In one example embodiment, the stripe can be disposed in a container or chamber including a glass shield. As such, a change in color of the stripe can be visible outside of the container. A camera can be disposed within a vicinity of the container. The camera can take a photo of the stripe (behind the glass shield) and transmit the photo to the management system. If the management system (or a user of the system) detects a change in the color of the stripe (using data provided by the camera or the color sensor), the management system can trigger remedial action, e.g., notify a maintenance system or shutdown the system.

In one example embodiment, the camera can be a pan-tilt-zoom camera. A filter lid can be mounted on top of the sump area. The filter lid can be installed next to other lids which provide access to the bath area. The filter lid can include the filter and the camera can be installed on the filter lid. In one embodiment, the camera can be installed immediately below the filter lid. As such, when the camera rotates, the camera can take images of the stripe, the sump area (the area below the camera) and the area over the bath area.

Figure 19A:
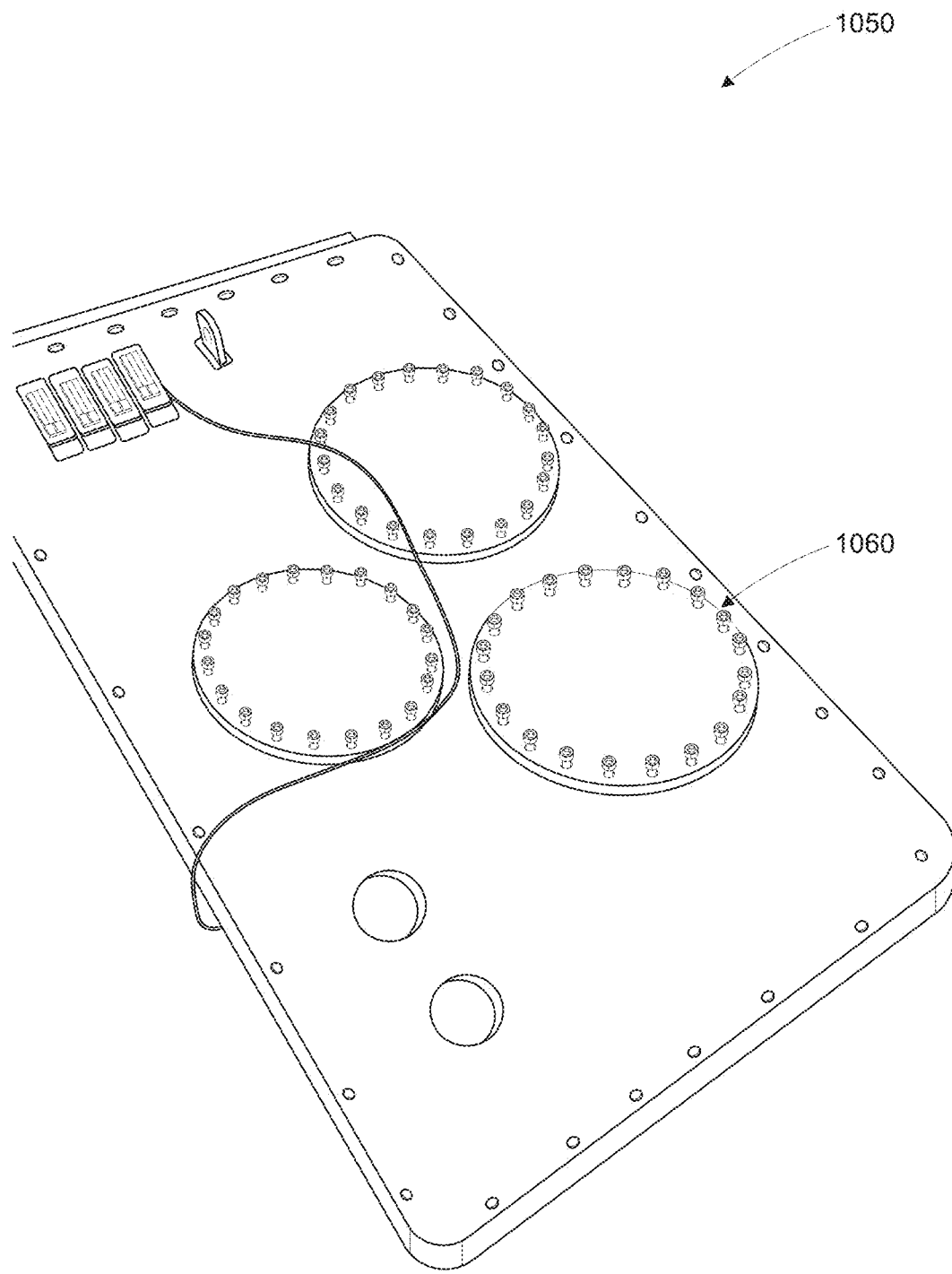
FIGS. 19A-B show a filter including three cores according to an example embodiment.
Figure 19B:
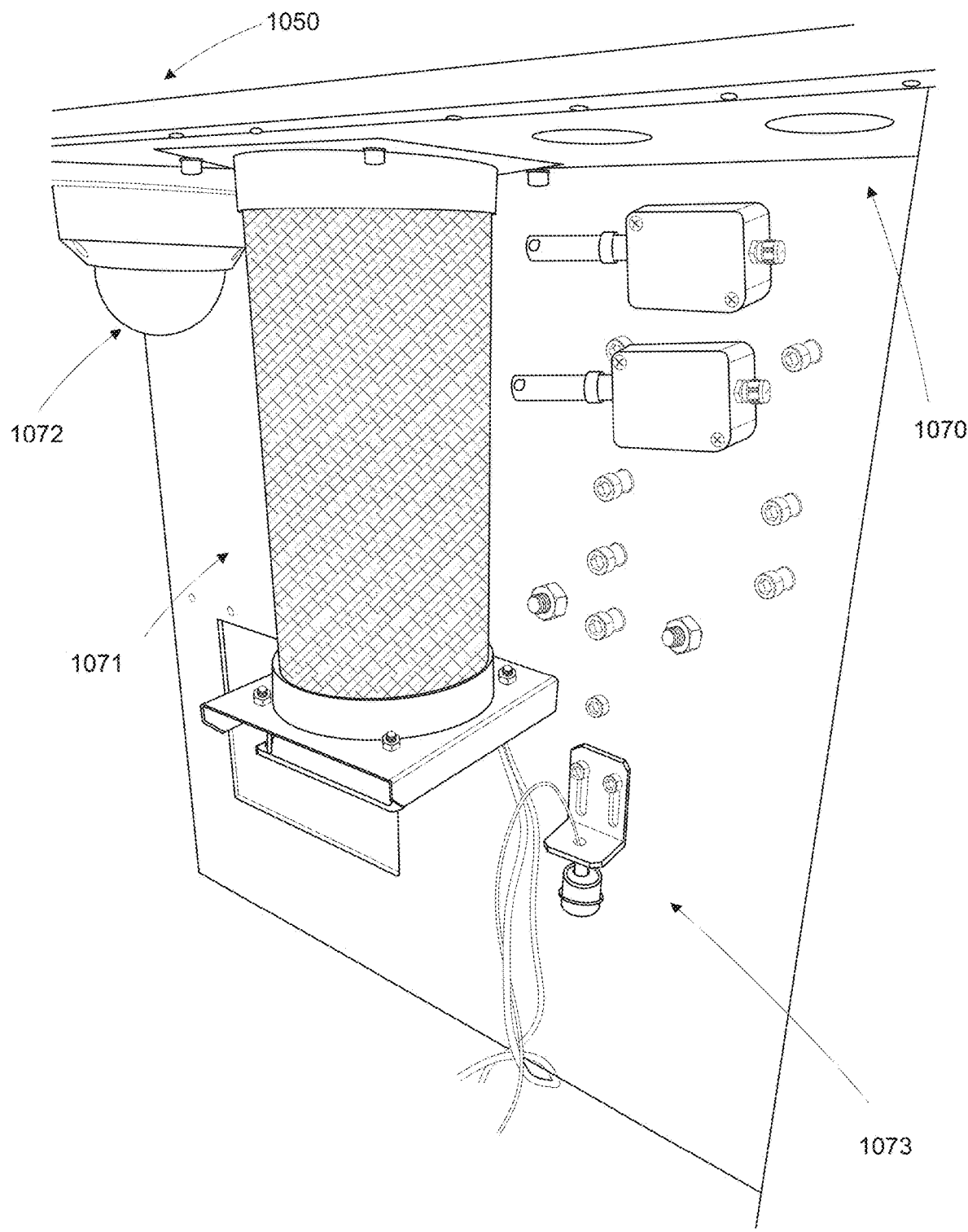

FIGS. 19A-B show a filter including three cores according to an example embodiment. As shown in FIG. 19A, the filter can include a lid 1050 which can be mounted on the tank, e.g., next to other lids which provide access to the computing device installed within the tank. Each core of the filter can be connected to the lid 1050. The lid 1050 can include three caps 1060, each cap providing access to one of the cores. FIG. 19B shows a structure 1070 mounted to the lid 1050. The structure 1070 can support various filter cores and other components, e.g., filter core 1071, camera 1072 and electromechanical valve 1073. On the other side of the structure 1070, there can be two other filter cores (not show in FIG. 19B).

In this example filter, there is a camera and two color sensors attached to the lid. The camera and the color sensors can obtain data relating to the acidity of the dielectric fluid (based on the color of the stripe) and convey the data to the management system.

In one example embodiment, the filter can be mounted on a chassis removable by a robot. The chassis can include a connection interface for detachably connecting the chassis (and the filter provided therein) to various pipes provided in the tank. As such, when the management system determines that the filter needs to be replaced, the robot can lift the chassis out of the tank, and place the filter in the magazine.

In one example embodiment, the management system can notify a user when the filter needs to be serviced or replaced. For example, the management system can include a timer or counter which is activated when the filter is installed on the vessel. If the management system determines that the filter has been in operation for more than a threshold time, the management system can transmit a notification to the user (or other entity). As another example, the management system can activate the timer or the counter only when the vessel is in operation, the pump is active or the dielectric fluid passes through the filter (as determined by a fluid sensor in the filter). If the management system determines that the filter has been in operation for more than a threshold time, the management system can transmit a notification to the user. As yet another example, the management system can determine a pressure differential for the filter, and the management system can notify the user to service or replace the filter if the pressure differential exceeds a threshold pressure. In particular, the filter can include an input pipe and an output pipe, and there can be a pressure sensor on the input pipe and a pressure sensor on the output pipe. Each pressure sensor can transmit a pressure reading to the management system. If the pressure differential between the readings of the pressure sensors exceeds a threshold pressure, the management sensor can determine that the filter is clogged. Therefore, the management system can notify the user to service or exchange the filter. As yet another example, the filter can include a sensor which indicates that flow rate for the filter. The management system can use the flow rate to determine if the filter needs service. As yet another example, the management system can use a machine learning model to determine when to replace the filter. The model can receive training data from a central server indicating operational data for filters for a plurality of vessels connected to the server.

In one example embodiment, the sump area and/or bath area can include one or more fluid level sensors. During startup or a rapid increase in the workload, as the dielectric fluid vaporizes in the bath area, the fluid level drops in the sump area. However, because the pump circulates the dielectric fluid, the fluid level in the bath area remains the same, i.e., the computing device remains immersed. Conversely, during shutdown or a rapid decline in the workload, the fluid level can decrease in the sump area.

The fluid level sensors can provide data to the management system regarding the fluid level in the sump area and the bath area. If after the startup of the vessel (or while the vessel is operating in a steady state) the fluid level in the sump area decreases, there can be a leak in the tank. Similarly, if at some point the fluid level in the bath area drops, there can be a problem with the fluid circulation system, e.g., the pumps have failed. As such, the management system can continuously monitor the fluid level data provided by fluid level sensors and notify the user if there is an unexpected drop in fluid level in the sump area or the bath area.

In one example embodiment, the pump can draw fluid from the sump area (or bath area) and provide the fluid to a drain valve connected to the tank body. When the valve is open, the pump can drain the sump area (or the bath area) or provide a sample to a user of the vessel. The sample can be provided to a lab for testing. In one example embodiment, the user can instruct the vessel, using the management system, to drain the tank. In response, the management system can open the drain valve and the pump can direct the fluid from the sump area (or even the bath area, e.g., when a connection is provided to the bath area) to the drain valve. For example, there can be a valve connection between the bath area and the sump area, and in the event a draining instruction is received, the valve connection can connect the bath area to the sump area so that the bath area drains the dielectric fluid into the sump area, and the pump drains the sump area. In one example embodiment, the pump can draw the dielectric fluid directly from the tank area.

The Robotic System

In one example embodiment, the vessel can include a robotic system, e.g., a gantry robot configured to lift the computing device from the bath area of the tank or a magazine placed near the tank. The gantry robot can also place the computing device in the bath area or the magazine.

The gantry robot (or the robot) can include a series of linear actuators. For example, the robot can include an actuator for movement in each of a plurality of directions, e.g., horizontal and vertical. The management system (or another system) can control how much or how fast each one of these actuators move. In one example embodiment, the actuators can be configured to move on one or more tracks. Actuator-based or track-based systems can lose their precision over time (e.g., due to drifting or wear and tear). As such, in this example embodiment, in order to detect the exact relative position of the robot, the tank (or various components thereof) can include one or more calibration zones or flags. For example, one or more of the key components or locations of the vessel with which the robot interacts, e.g., the magazine, the first server rack, the second server rack, or the home position, can include a flag, which can be detected by the robot once the robot reaches the position of the key component or location. The flag can notify the robot about the exact location of the robot relative to the key component or location.

In one example embodiment, the flag can be a physical object, an RFID tag, a color, an alphanumerical code, a QR code, etc. In one example embodiment, the sensor detecting the flag can be a motion sensor, an RFID detector, a camera, etc. In one example embodiment, the camera can determine a distance between the robot and various objects and provide a feedback to the robot regarding the distance. In one example embodiment, the camera can provide video data to the management system, and based on the video data, the management system can determine the exact location of the robot within the vessel. In one example embodiment, the management system can determine the location of the robot by, e.g., scanning a QR code, counting the components in the tank, etc. In one example embodiment, the images from the camera can be used to determine the proximity of the robot to an object or whether the robot has properly grabbed or placed a chassis. In one example embodiment, the management system can use an object recognition technique to determine the location of the robot. In one example embodiment, the management system can use an artificial intelligence technique to determine the location of the robot. The management system can use the object recognition technique or the artificial intelligence to calibrate the robot.

In one example embodiment, the vessel can include a home position, a magazine and two racks. The management system (or another system) can instruct the robot to lift a computing device from, e.g., the second rack. The robot can move from the home position to the magazine and then to the first and second racks. As the robot approaches each of these locations or components, a sensor of the robot can detect the associated flag for the location or component. The benefit of the flag system is that the robot can still detect the robot's position relative to a key component or location even if other components or locations have been removed from the vessel. This is because the flags are always located at the same position relative to each key components or locations the flags are associated wtih. For example, even if the first rack is removed from the vessel, the robot can find the flag for the second rack, calibrate the robot's position relative to the second rack and remove the computing device from the second rack. Similarly, even if the second rack is slightly moved from its position in the vessel, the robot can find the flag for the second rack, calibrate the robot's position relative to the second rack and remove the computing device from the second rack.

In one example embodiment, the gantry robot can receive instructions to remove or replace various components of the vessel, e.g., computing device, filter, etc. In one example embodiment, the instructions can be provided by the management system (or another system). The management system can provide the instructions in response to a determination by the management system (or another system), the user of the vessel or a system external to the vessel. For example, the management system can receive and monitor various data points relating to operation of the computing device, e.g., voltage levels, temperatures and other operating properties. If the computing device exceeds the thresholds determined or predetermined for the computing device, the management system is programmed to instruct the robot to replace the computing device.

As another example, the user of the vessel can direct the management system to provide the instruction to the robot to remove the computing device. As yet another example, the management system an include an application programming interface (API) for receiving instructions from a system external to the vessel. For example, the vessel can be in communication with a top-level orchestration and management platform which can instruct the management system (through the API) to remove the computing device from the tank.

In one example embodiment, the robot can lift a computing device from the tank or the magazine. In this example embodiment, the computing device can be located in a chassis including a connection plate. The robot can include a guide pin and a linkage mechanism which can interface with the connection plate. The robot can also include one or more load cells measuring the positive or negative force or pressure exerted on the robot.

The robot can start at its home position and move toward the tank (or the rack including the computing device). At the tank, the robot can detect the flag associated with the tank, which can inform the robot that it is at the tank. Then, the robot can move a predetermined distance from the flag so that the robot is located exactly (or substantially) over the computing device. Once the robot is on top of the computing device, the robot can rapidly drop from its top most position to a position a few inches away from the computing device (or a position equal to or longer than the length of the guide pin, e.g., 50% longer than the guide pin). At that point (i.e., a few inches away from the computing device), the robot can approach the computing device slower so that the guide pin of the robot makes an initial contact with the connection plate. Once the robot makes the initial contact, the robot will continue moving down with the same slow speed until the robot presses the connection plate (of the chassis) by more than a threshold pressure. At that point, the linkage mechanism of the robot can activate (e.g., the fingers can open) to interconnect the robot to the computing device. The linkage mechanism can be an armature-based linkage mechanism including a plurality of fingers. Once the linkage mechanism closes, the robot can provide feedback to the management system, i.e., that the linkage system is closed. The management system can instruct the robot to lift the computing device. The robot can slowly pull up the chassis for a few inches, to make sure that it has a good grip on the chassis. Then, the robot can rapidly move up to its top most position. At that point, the robot can move to any position instructed by the management system, e.g., the magazine or another rack.

In one example embodiment, the robot can place a computing device in the tank or the magazine. For example, while holding a chassis, the robot can move over a slot of the tank (or one of its racks) to drop or place the chassis inside the tank (or the magazine). Once the robot is over the tank, the robot begins to move down rapidly, until it gets to a few inches above the first alignment point (or mating point) between the chassis and the tank (or the rack). The design of the chassis and the tank can determine the distance from above the tank at which the robot should slow down. In particular, the robot can slow down one or two inches above the alignment point (where the guide rails of the chassis contact the grooves of the rack). The robot can move slowly toward the tank so that grooves of the rack can move in the guide rails of the chassis. The management system can receive and monitor data from the load cell and other sensor to ensure that the chassis is not misaligned. For example, an excessive amount of force feedback on a load cell can indicate a misalignment between the grooves and the guide rails. The management system can abort the drop operation if a misalignment is detected.

In one example embodiment, in addition to the grooves and the guide rails, the chassis and the rack can include additional alignment mechanisms. For example, after the initial mating between the chassis and the rack using the groove and the guide rails, a guide pin mechanism can be provided on the rack and the chassis which can further align the rack and the chassis. The guide pin mechanism can include a pin on the rack and a mating hole on the chassis. After the initial mating, the robot can again move down rapidly until it reaches the second alignment mechanism (or a few inches thereof, e.g., two inches more than the size of the guide pin). Here, the second alignment mechanism can be the guide pin mechanism. The robot slowly moves down so that the pin on the rack can connect with the mating hole on the chassis. The robot continues to move down slowly until the load cell provides a feedback indicating that the chassis has been inserted, e.g., the load cell detects a positive pressure. At this point, the linkage mechanism can deactivate, and the robot can move up (slowly for a few inches to ensure proper placement and then rapidly) and back to its home position.

In one example embodiment, the chassis or the rack can include a presence detection pin. When the presence detection pin mates with the corresponding receiver, the management system can receive a signal from the receiver. The signal can indicate that the chassis is properly placed in the position. In this example embodiment, the robot can deactivate the linkage mechanism only after the receiver provides the signal to the management system.

During the lift or drop operations, the management system can receive and monitor the data received from the load cells as well as other sensors (e.g., a motion sensor, a tile sensor, a rotation sensor, an accelerometer, etc.). This data can ensure that the chassis is not stuck or misaligned, or that the robot has a good grip of the chassis. If the management system determines that the chassis is somehow stuck or misaligned, or that the robot is tilting or rotating (e.g., because of the robot's poor connection with the chassis), the management system can abort the lift or drop operation.

Figure 20A:
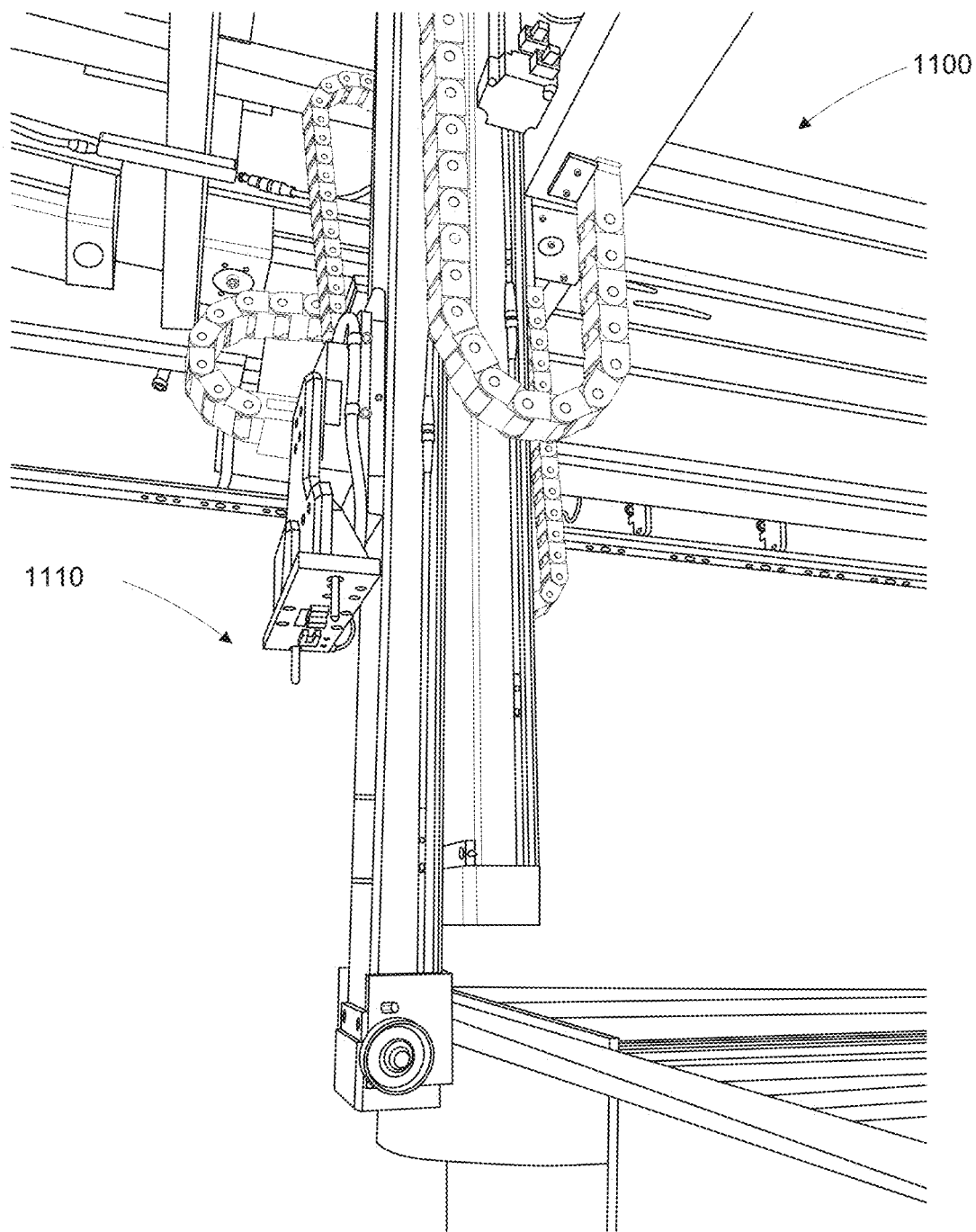
FIGS. 20A-B show an example robotic system.
Figure 20B:
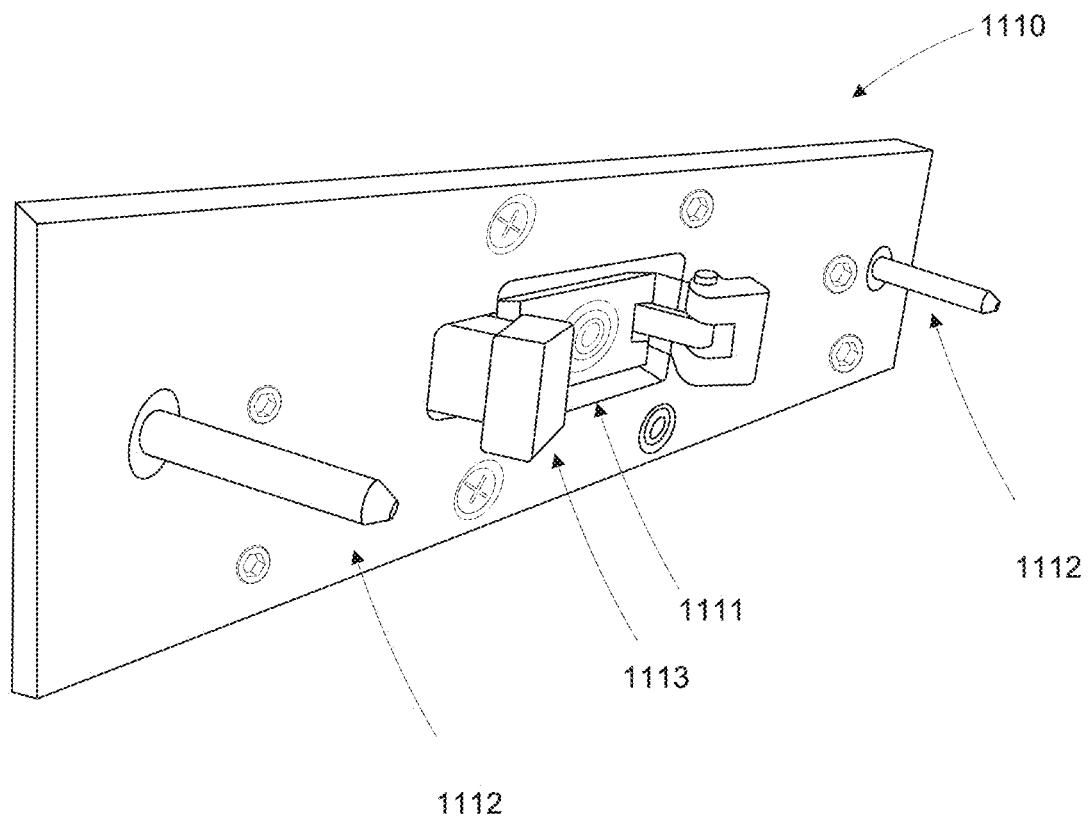

FIGS. 20A-B show an example robotic system 1100. FIG. 20A shows the robotic system 1100, which can be a gantry robot including a plate 1110. The gantry robot can move within the tank and lift the computing device using the plate 1110. FIG. 20B shows the plate 1110 which can include a linkage mechanism 1111 and a guide pin 1112. The linkage mechanism 1111 can include a plurality of fingers 1113, which are mechanically coupled to one or more armatures. Once the linkage mechanism is placed in a connection plate of a chassis, the armature can activate and move the fingers to hold the connection plate.

Figure 21A:
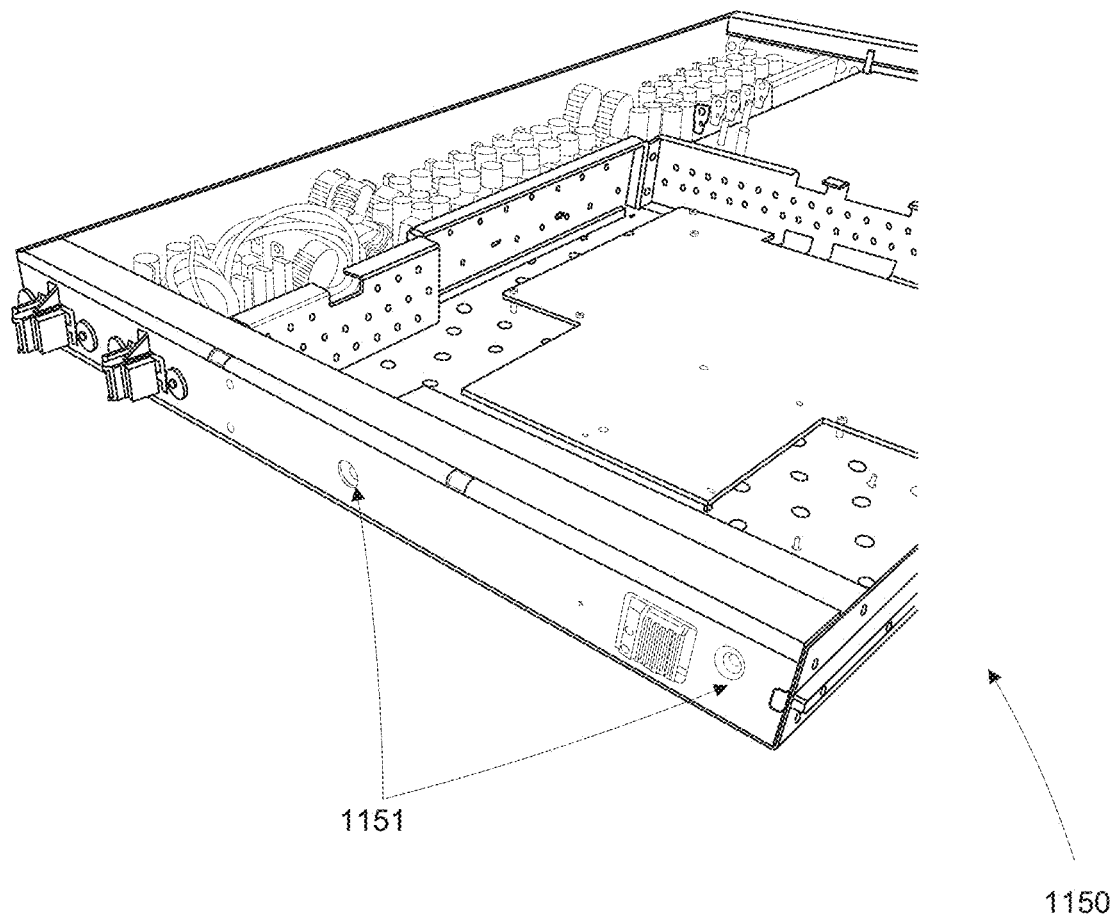
FIGS. 21A-B show an example guide pin mechanism between a chassis and a rack.
Figure 21B:
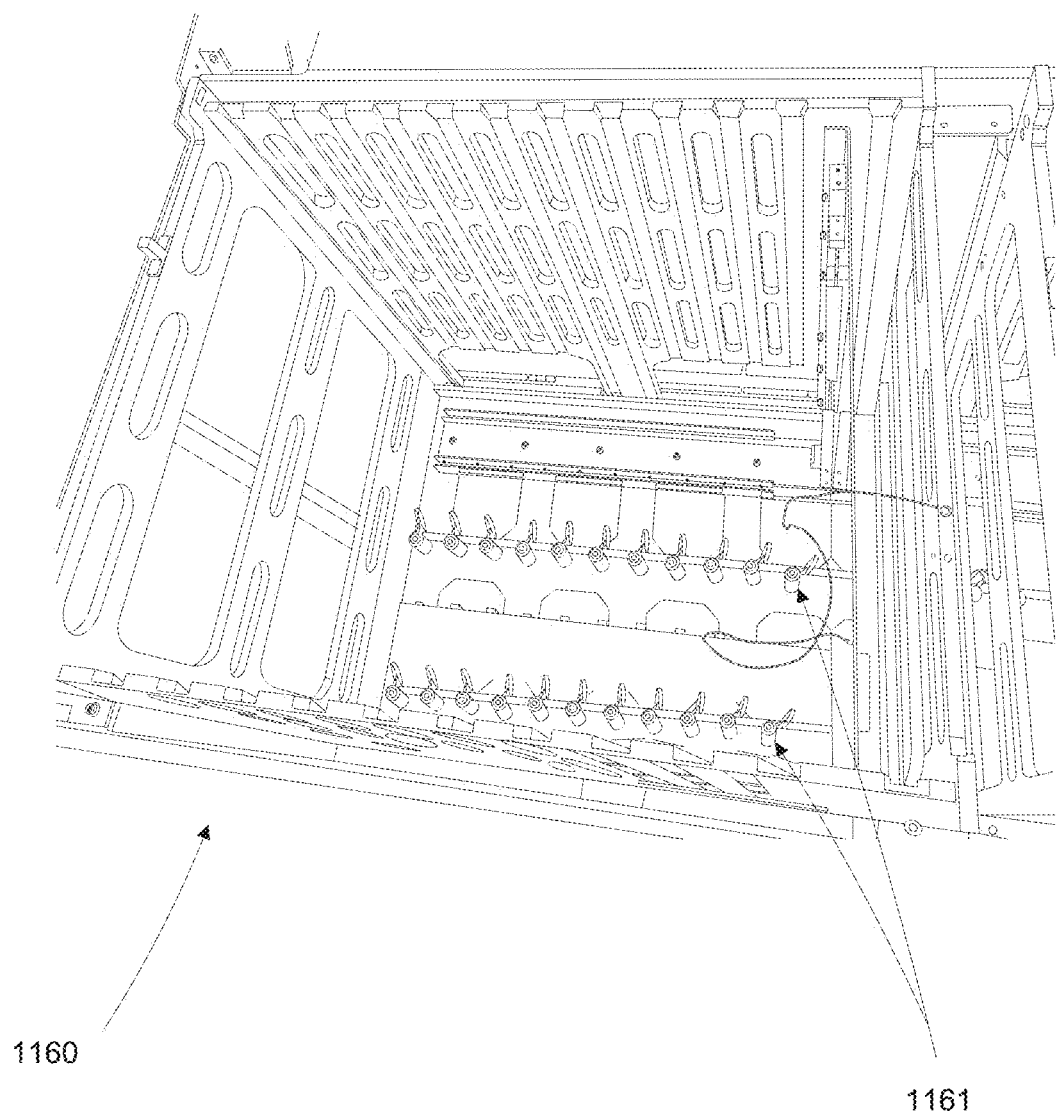

FIGS. 21A-B show an example guide pin mechanism between a chassis 1150 and a rack 1160. In this example embodiment, the rack 1160 can include two guide pins 1161 (for each chassis 1150) and the chassis 1150 can include two mating holes 1151 configured to receive the guide pins 1161. When a robot drops the chassis 1150 over a rack 1160, the guide pin mechanism ensures proper electrical connection between the chassis 1150 and the rack 1160.

In one example embodiment, the robot is a robotic arm. The robotic arm can move on a rail provided on a side of the tank. In one example embodiment, each chassis can be pulled up using a piston and connect to a channel located on top of the piston. The channel can deliver the chassis to the magazine, e.g., using a rail system.

In one example embodiment, the robot can include a calibration system, which can include a plurality of sensors. The calibration system can determine if the robot is exceeding its normal range of operation. For example, a tilt sensor can inform the robot if the robot is not balanced or tilted. As another example, a load cell can provide a signal to the robot if the robot is not moving freely, e.g., hits an object.

In one example embodiment, the robot can use an artificial intelligence or machine learning technique to provide for hot swapping or as a failsafe mechanism.

In one example embodiment, the vessel can include a plurality of cameras. In this example, one camera can be mounted on the robot and another one can be mounted on a vessel wall. The cameras can be mounted in a way that the user always has visibility into the moving components of the vessel. The vessel can also include a user interface displayed on a display device, e.g., monitor. When the robot is lifting or dropping a chassis, the user interface can display video feed from the cameras. This way, the user can take action if anything goes wrong with the robot's operation.

In one example embodiment, the robotic system can be a vision-based system that is tied to active control. The active control allows a reference points to be sent back through logic that will determine proximity with a proximity switching. In one example embodiment, the robotic system can be an AI robotic system. In one example embodiment, the robotic system can be an auto correcting system. In one embodiment, the robotic system can be a logic controlled active loop based system, that is preprogramed and can calibrate based on distances from its resting state to its active state.

The Absorption/Desorption Unit

In one example embodiment, the absorption unit can be a carbon-bed-based system. The absorption unit can be a round circular drum. Inside the absorption unit there can be an aluminum framework which allows for inclusion of copper ribbon heating elements that are spread throughout the framework. The height and radius of the absorption unit can be designed based on the size of the vessel and the volume of fluid in the tank.

The absorption unit can be sealed and include activated carbon within the framework. The absorption unit can include an inlet and an outlet. In one embodiment, the absorption unit can include a cooling system, e.g., cool air can flow through the center of the absorption unit without making contact with the carbon. This system allows for cooling the carbon through convection.

In one example embodiment, the activated carbon allows for absorption or adhesion of the dielectric vapor. When necessary to balance the tank (e.g., to create pressure or vacuum), the management system can connect the absorption unit to the tank by opening a valve. The management system can activate or initiate power to the copper heating ribbon elements, which can heat up the carbon. The carbon then releases the dielectric fluid molecules as vapor, which can return to the tank.

In one example embodiment, there can be pressure and temperature sensors in the carbon bed to prevent a pressure or temperature over condition.

In one example embodiment, the absorption unit can include a control loop bypass for pressure release (or pressurization) in emergencies. This is a safety feature of the vessel. The absorption unit has a valve which disconnects it from the tank. If the valve fails, there can be an over-pressurization condition. For example, the management system can open the bypass valve if an outlet of the absorption unit is clogged. If the bypass valve is opened, the dielectric vapor can go to the atmosphere, thereby preventing an explosion of the absorption unit. If there was a vacuum condition within the tank, the valve can open to allow for air to come in the tank to prevent the tank from collapsing.

In one example embodiment, the vessel can include a plurality of safety bypass valves. For example, during a startup operation, the computing device can generate an excessive amount of vapor. The valve allowing the vapor to exit the tank to the absorption unit might fail. As such, there can be an over pressurization condition in the tank which the bellows cannot handle. An emergency bypass valve can be opened to release some of the vapor into the atmosphere.

As another example, during the startup operation, an excessive amount of vapor can enter the absorption unit. This can create an over-pressurization condition in the absorption unit. As such, the bypass valve of the absorption unit can be opened to release the vapor to the atmosphere.

In one example embodiment, in addition to pressure and temperature, the management system can receive and monitor data from the absorption unit relating to electrical power of the absorption unit. The management system ensures that current is running through the absorption unit. The management system can shutdown the absorption unit if there is an overcurrent issue or if there is an over-pressurization condition.

Self-Alignment of the Chassis

In one example embodiment, the chassis can include a self-alignment feature. The self-alignment feature can include a plate which can be movable (i.e., floats) relative to the chassis. There can be one or more input or output ports (or connectors) on the plate. The chassis (and the plate) can include a mating hole, which can receive a guiding pin to align the plate for receiving the ports. In one example embodiment, the port can be an ExaMAX® connector.

In one example embodiment, the self-alignment feature can include several alignment mechanisms. For example, as a first self-alignment mechanism, the rack and the chassis can have grooves and guide rails. As a second self-alignment mechanism, the rack can include a pin that is tapered and rounded in the end. The pin can go into a catch hole in the chassis. As the pin is inserted in the mating hole (or catch hole), it makes the final precision alignment between the connector on the chassis and the interface on the rack (i.e., the backplane). By the time the connector is ready to pair with its mate, the alignment pin has caused the floating pair to be perfectly matched up with the relative orientation of the connector to which it is going to be inserted.

In one example embodiment, the connectors of the chassis and the rack can include their own alignment mechanism, e.g., the pins can be part of the connectors.

In one example embodiment, the connectors can include multistage mechanisms for self-alignment, including a gross outer alignment catch, and then a finer inner alignment catch.

In one example embodiment, the plate can be on the backplane of the rack.

Figure 22:
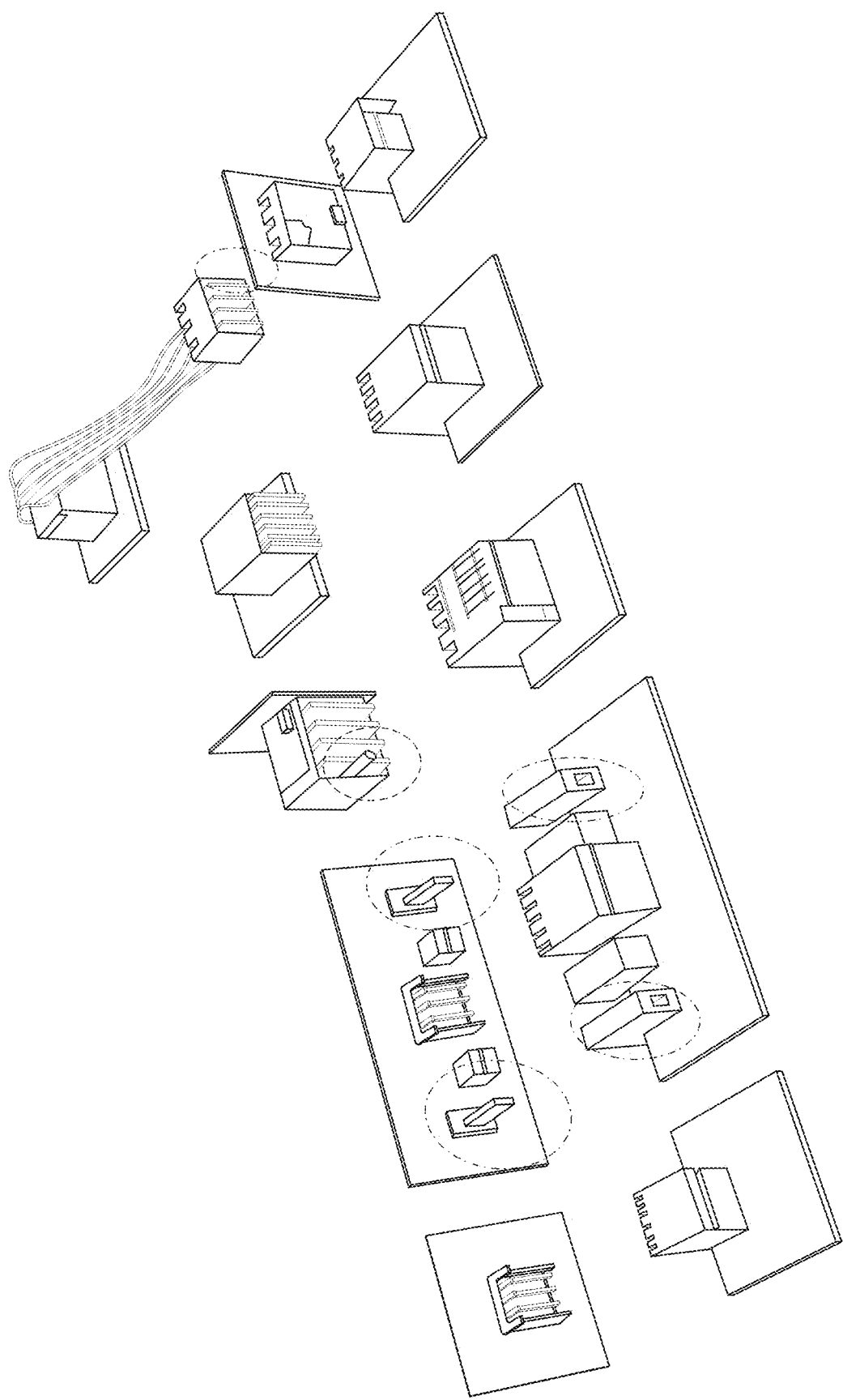
FIG. 22 shows example connectors with self-alignment features.

FIG. 22 shows example connectors with self-alignment features. These connectors can include guide pins and other guiding features to ensure proper connection between the pairs An Exemplary Embodiment of Absorption/Desorption Unit In one example embodiment, an immersion cooling system or a vessel can include a tank, a computing device, a robot, an absorption unit, and a management system. The tank can be a pressure controlled tank maintained at the atmospheric pressure (or within a range thereof). The tank can include a bath area and a sump area, and the computing device can be immersed in a dielectric fluid in the bath area of the tank. The computing device can be connected to a network and perform various processing tasks while immersed in the dielectric fluid. The tank can include a lid for accessing the bath area, the computing device and the sump area. The tank can be fluidly coupled to the absorption unit, and a plurality of valves can selectively connect or disconnect the tank to and from the absorption unit so that dielectric vapor can transfer to the absorption unit, or vice versa. The robot can be a gantry robot, which can lift the computing device from the tank of the vessel when the lid of the tank is open.

In one example embodiment, the management system can activate the absorption unit to cause a change in the pressure of the tank. In one example, the management system can activate the absorption unit to control, moderate or regulate a change in the pressure within the tank, e.g., minimize the deviation of the pressure from an atmospheric pressure (or another predetermined pressure). For example, the management system can activate the absorption unit when a shock event is detected, e.g., before, during or after a startup operation, a boost operation, a slowdown operation, or a shutdown operation. The management system can detect the mode of operation of the vessel (e.g., startup or shutdown) by receiving sensor data (e.g., from the temperature or pressure sensors in the tank) or data from the computing device (e.g., current, voltage, temperature, workload, data transfer, etc.). In one example embodiment, the management system can respond to a shock event by, e.g., instructing the absorption unit to add vapor or fluid to the tank or remove vapor or fluid from the tank to maintain the pressure of the tank at a pressure close to an atmospheric pressure (or another predetermined pressure). For example, as the temperature of the tank increases, vapor or fluid can be removed from the tank and as the temperature of the tank decreases, vapor or fluid can be added to the tank.

The management system can use various mechanisms for adding vapor or fluid to the tank or removing vapor or fluid from the tank. In one example embodiment, the management system can use an absorption/desorption unit (hereinafter the "absorption unit") for adding vapor to the tank or removing vapor from the tank. In another example embodiment, the management system can use another mechanism(s). Yet another example embodiment, the management system can use another mechanism(s) in conjunction with the absorption unit.

Figure 23:
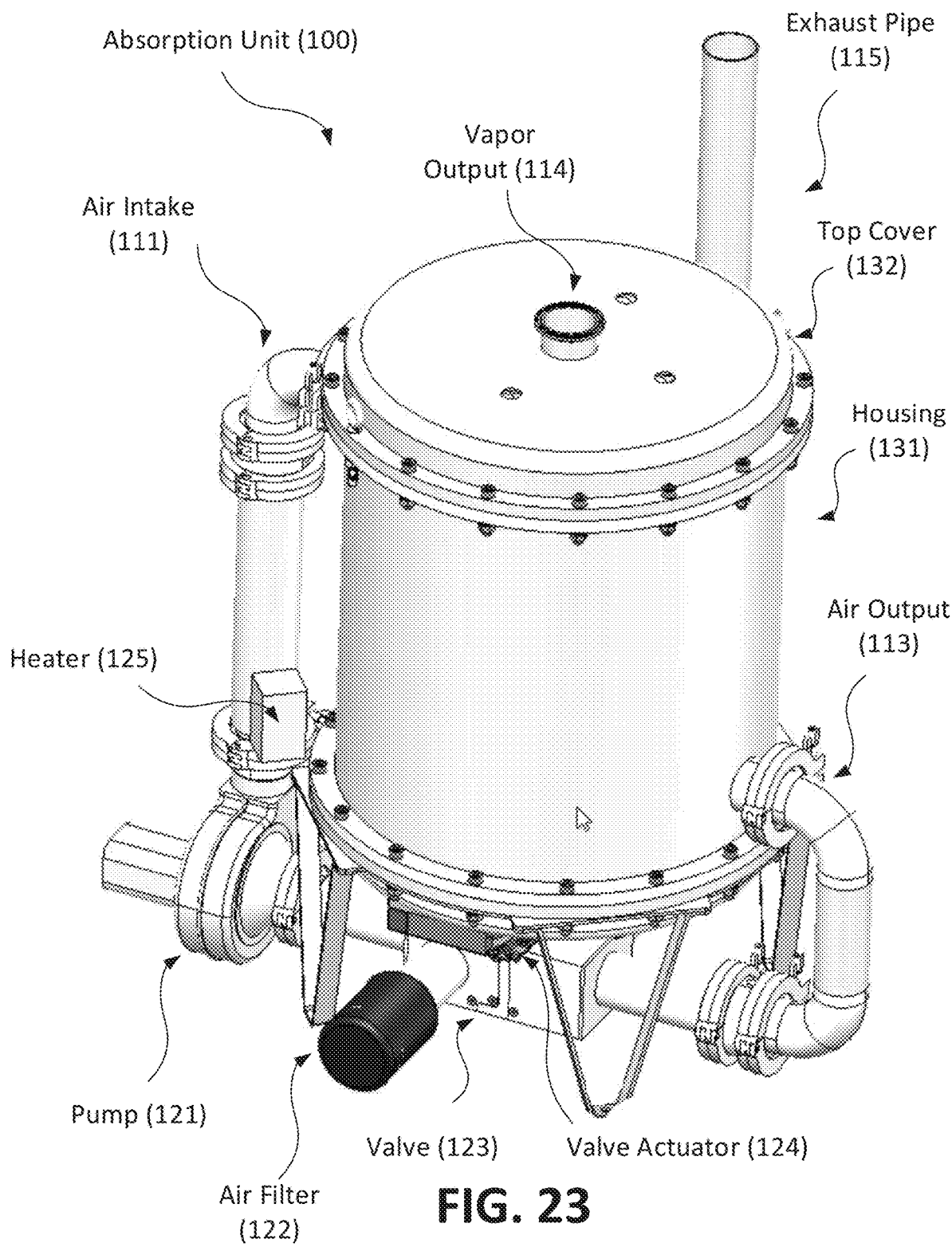
FIG. 23 shows an exemplary absorption unit.
Figure 24:
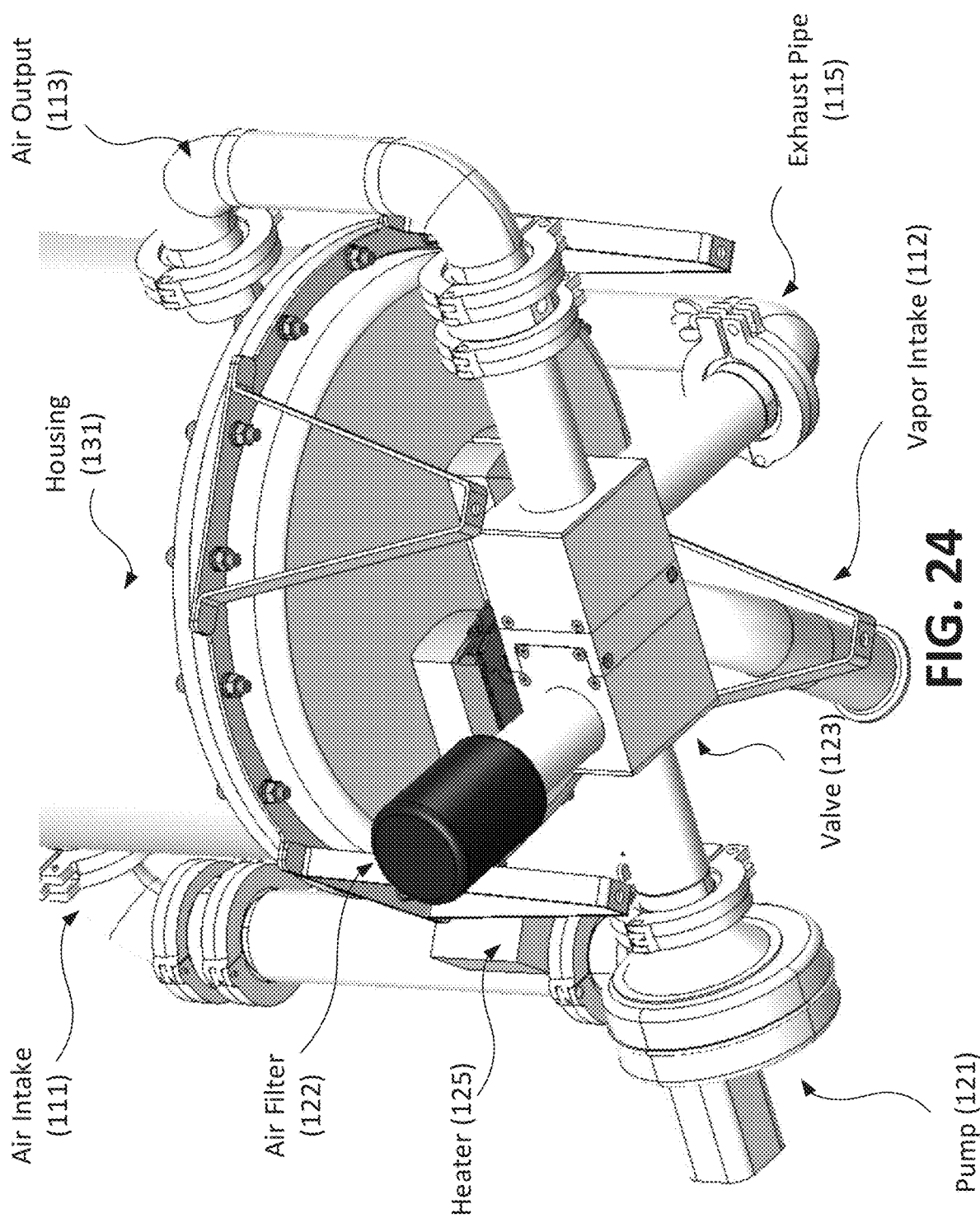
FIG. 24 shows lowers aspects of an exemplary absorption unit.
Figure 25:
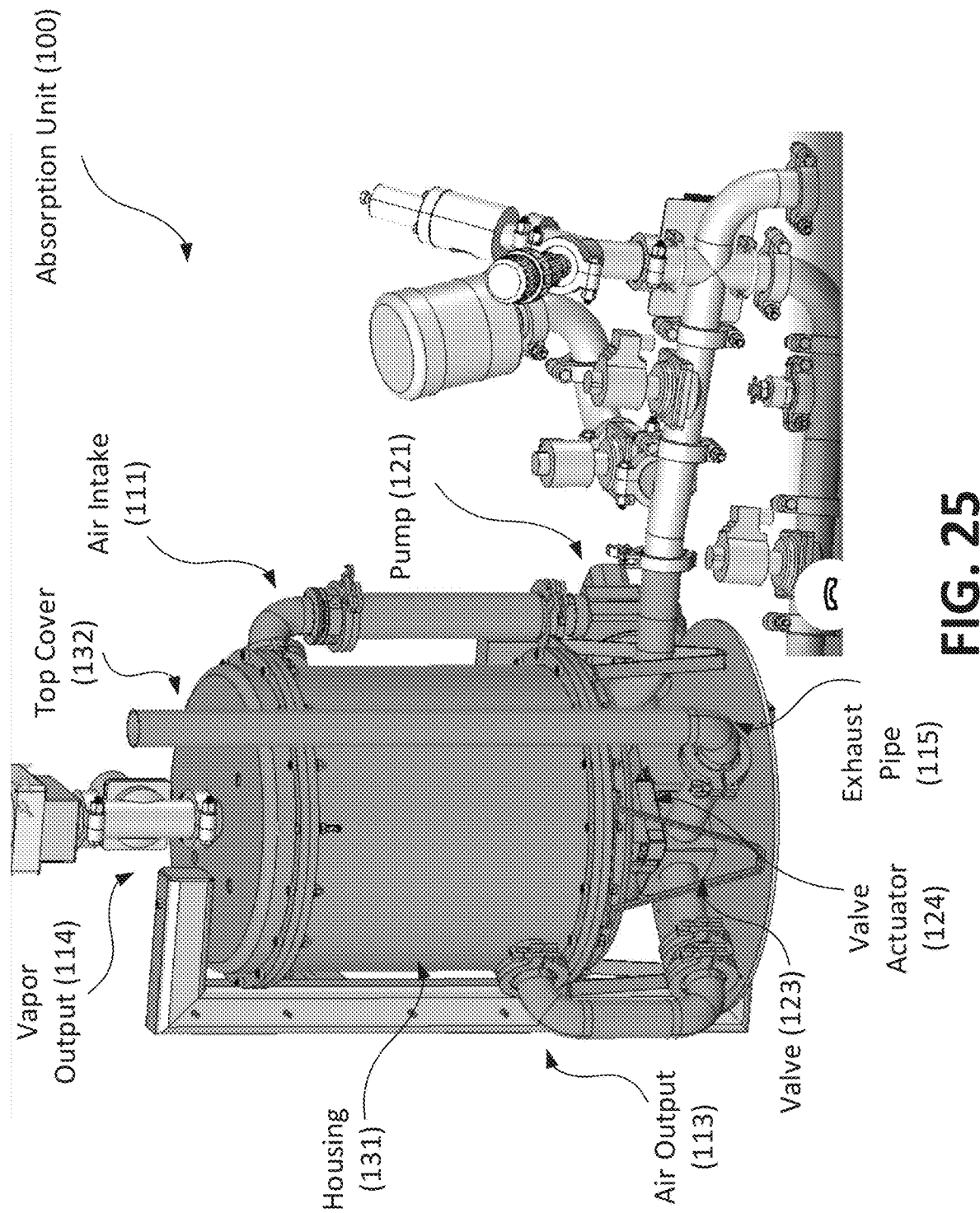
FIG. 25 shows additional features of an exemplary absorption unit.

The absorption unit may have different designs and advantageously do not require a bellows in some embodiments making for a smaller footprint and other advantages of the absorption unit. FIGS. 23-25 show an example design for an absorption unit for an immersion cooling system. In this example embodiment, the absorption unit 100 can have a housing 131, which can be the shape of, e.g., a round circular drum (or any other shape). The housing 131 can have a top cover 132 which seals the absorption unit against the surrounding environment. The absorption unit 100 can include an air intake 111, an air output 113, a vapor intake 112 and a vapor output 114. In one example embodiment, the absorption unit 100 can also include an exhaust pipe 115, a pump 121 (or rotary fan 121), an air filter 122 and a valve 123 (including a valve actuator 124).

Figure 28:
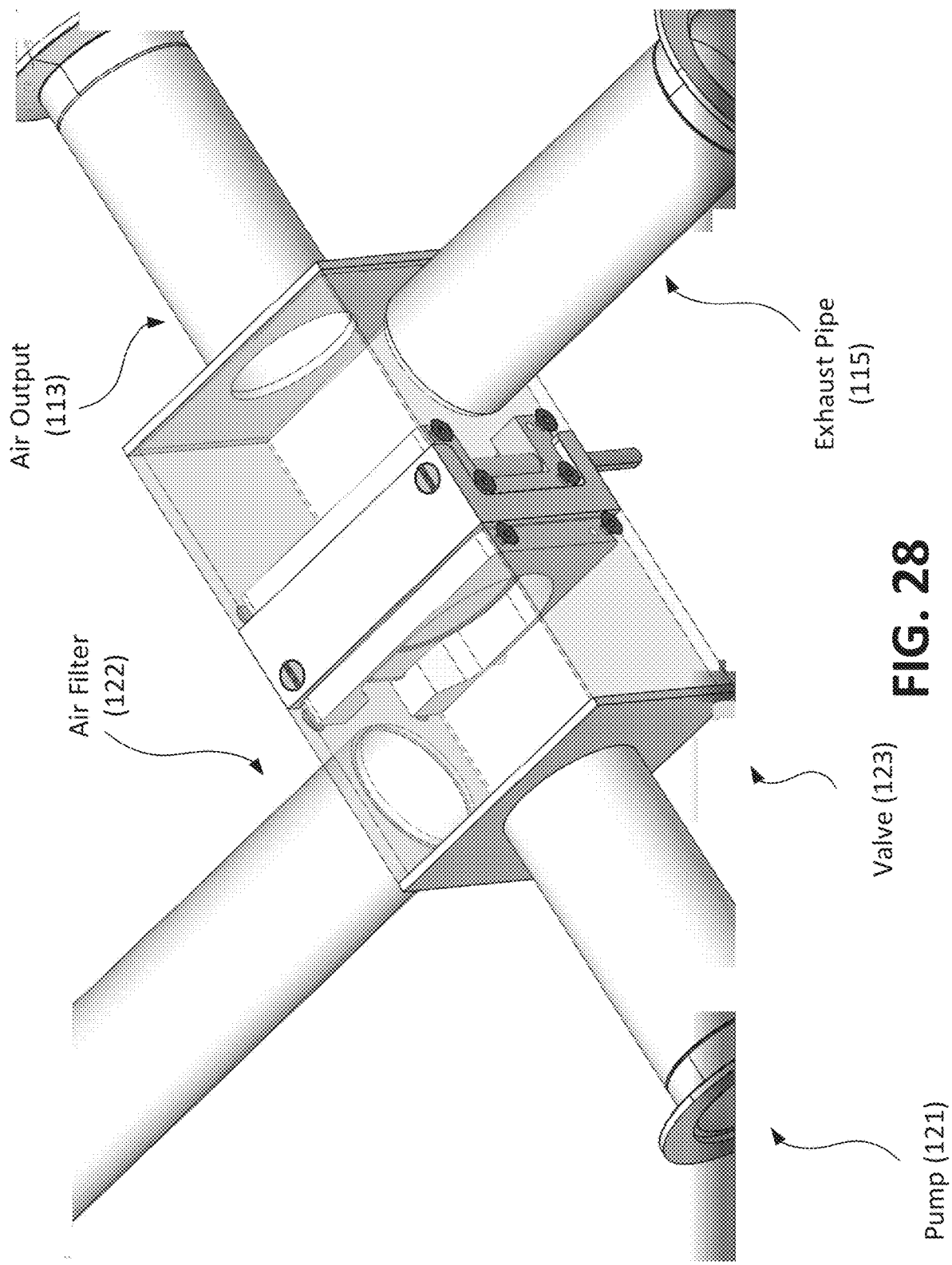
FIG. 28 shows representative connections pertaining to an exemplary absorption unit.

In one example embodiment, the valve 123 can be a four-way valve connecting the air filter 122, the pump 121, the air output 113 and the exhaust pipe 115. FIG. 28 shows an example four-way valve according to an example embodiment. The valve 123 can include 2 or more modes of operation. In a first mode of operation of the valve 123, the air filter 122 can be fluidly coupled to the pump 121. Additionally, the output 113 can be fluidly coupled to the exhaust pipe 115. In a second mode of operation, the pump 121 can be fluidly coupled to the air output 113. Additionally, the air filter 122 and the exhaust pipe 115 can be disconnected.

In one example, when the valve 123 is in the first mode of operation, the pump 121 can draw air from the filter 122. The pump 121 can push the air through a pipe to the air intake 111. By pushing the air to the housing 131 through the air intake 111, the internal pressure of the housing 131 can increase, and thus, air can flow out of the air output 113, and back to the valve 123. Because the air output 113 is fluidly coupled to the exhaust pipe 115, the air will exit from the exhaust pipe 115 into the surrounding environment. In another example, when the valve 123 is in the second mode of operation, the pump 121 can draw air from the air output 113. The pump 121 can push the air through a pipe to the air intake 111. By pushing the air to the housing 131 through the air intake 111, the internal pressure of the housing 131 can increase, and thus, air can flow out of the air output 113, and back to the valve 123. Because the air output 113 is fluidly coupled to the pump 121, the air will recirculate within the housing 131. The recirculation mode can be beneficial when, e.g., the temperature of the recirculated air is more consistent with the absorption unit's operation than the temperature of the incoming air from the air filter 122.

In one example embodiment, the absorption unit 100 can include a heater 125. The heater 125 can be located on a pipe that connects the pump 121 to the air intake 111. The heater 125 can heat up the air that enters the housing 131. By heating the incoming air, the incoming air from the air intake 111 can heat up the absorption unit 100. Although the heater 125 is described as being located on a pipe connected to the air intake 111, one of ordinary skill in the art recognizes that the heater (or heaters) 125 can be located on other components, e.g., a pipe connecting the air output 113 to the valve 123, the valve 123, a pipe connected to the air filter 122, or within the housing 131. In one example embodiment, a cooling unit can be attached to the absorption unit 100. The cooling unit can chill the incoming air to or outgoing air from the housing 131.

Figure 26:
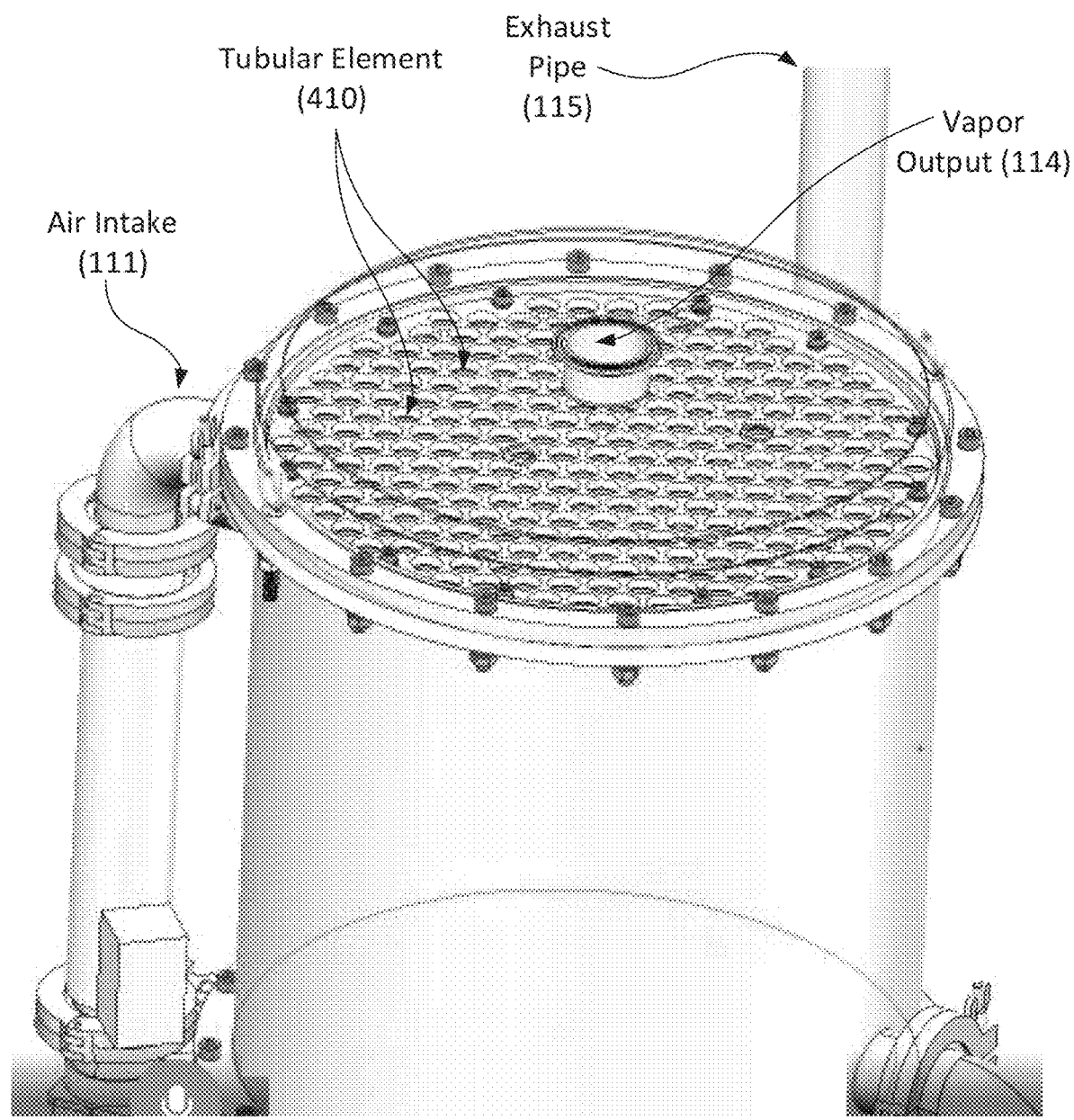
FIG. 26 shows upper aspects of an exemplary absorption unit.
Figure 27:
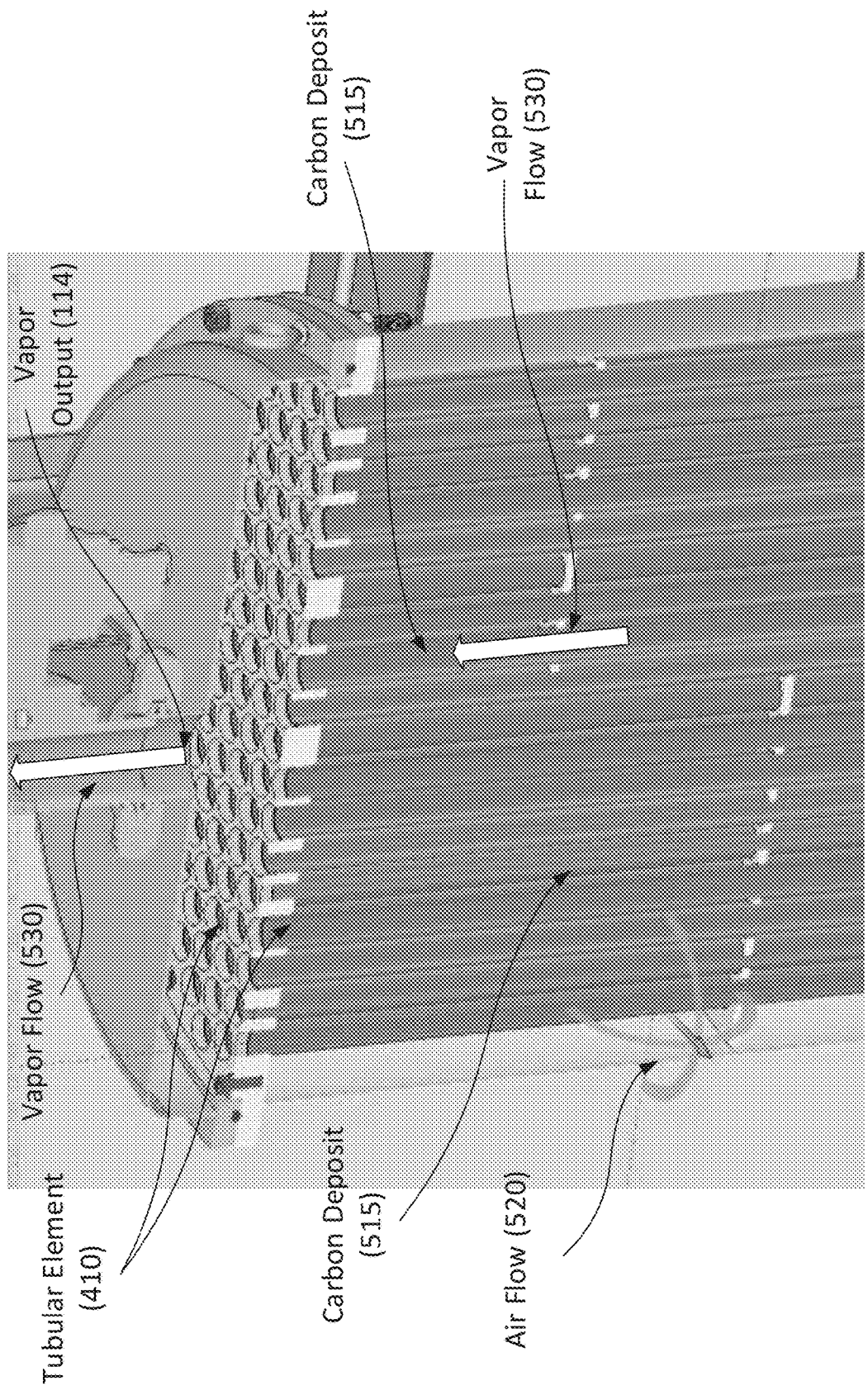
FIG. 27 shows a cut-away of an exemplary absorption unit.

FIGS. 26-27 show an example design for elements inside the absorption unit for an immersion cooling system. In one example embodiment, the housing 131 can include a plurality of tubular elements 410. One of ordinary skill in the art recognizes that the elements 410 can be designed to be tubular or any other shape. The tubular elements 410 can form two isolated channels for transfer of fluids. The first channel can run inside the tubular elements 410 and the second channel can run outside the tubular elements 410 (but within the housing 131). In one example embodiment, the first channel can be connected to the vapor intake 112 and the vapor output 114. Accordingly, vapor flow 530 can enter into the tubular elements 410 from the vapor intake 112 and exit the housing 131 from the vapor output 114. The second channel can be connected to the air intake 111 and air output 113. Accordingly, air flow 520 can enter the housing 131 from air intake 111 and flow outside of the tubular elements 410, but ultimately exit from the air output 113. Although in this example embodiment, the vapor flow 530 is running inside the tubular elements 410 and the air flow 520 runs outside of the tubular elements 410, one of ordinary skill in the art recognizes that there can be other arrangements for flow of fluids, e.g., one can connect the vapor intake 112 and the vapor output 114 to the second channel and the air intake 111 and air output 113 to the first channel.

In one example embodiment, one or more tubular elements 410 can include a layer of carbon or carbon deposit. The carbon deposits can trap or absorb dielectric molecules, thereby reducing the pressure within the tank. In one example embodiment, the carbon deposit can be on the inside of the one or more tubular elements 410. In another example embodiment, the carbon deposit can be on the outside of the one or more tubular elements 410.

In one example embodiment, the absorption unit 100 can include a plurality of modes of operation. In one mode of operation, the management system of the immersion cooling system detects an undesired increase in the pressure of the tank, e.g., a spike in the computing demand of the computing device. The management system determines that the pressure has to be decreased. As such, the management system can direct vapor from the tank to the absorption unit (e.g., opening valves connecting the absorption unit 100 to the tank) to decrease the pressure of the tank. In this mode of operation of the absorption unit 100, the pump 121 can direct cool air (or ambient air) at the tubular elements 410 so that the carbon deposit on these tubular elements 410 captures the excess vapor.

In one example, the carbon deposit 515 is on the inside of the tubular elements 410. In the mode of operation in which the absorption unit 100 intends to capture the excess vapor (and thereby reduce the pressure of the tank), the valve 123 can connect the air filter 122 to the pump 121. The valve 123 can also connect the air output 113 to the exhaust pipe 115. The management system can direct the excess vapor from the tank to the vapor intake 112, and thus, the vapor can travel in one or more of the tubular elements 410 as the vapor flow 530. As the vapor flow 530 travels in the tubular elements 410 (or even before or after the vapor flow 530 enters the tubular elements 410), the pump 121 can circulate the air flow 520 to cool the tubular elements 410, and thus, facilitate absorption of the vapor molecules by the carbon deposit 515. For example, the pump 121 can draw air from the air filter 122. The pump 121 can cause the air to flow into the air intake 111 and travel on the outside (i.e., in between) the tubular elements 410 as the air flow 520. When the air flow 520 travels in between the tubular elements 410, the air flow 520 can reduce the temperature of the tubular elements 410, and thus, accelerate absorption of the vapor molecules by the carbon deposit 515. This system allows for cooling the carbon through convection and/or conduction. Once the air flow 520 exits the housing 131 via the air output 113, it can go to the valve 123, which connects the air output 113 to the exhaust pipe 115. Thus, the air flow 520 can exit the system and enter into the ambient air.

In one example, if the ambient air drawn from the air filter 122 is warm, a cooler can chill the air before it enters the housing 131. The management system can receive the temperature of the incoming air and determine whether any cooling is needed. For example, there can be one or more temperature sensors located, e.g., at the air filter 122, before or after the pump 121, or before or after the air intake 111, which can detect the temperature of the incoming air and provide the temperature to the management system. The management system can activate the cooler if reducing the temperature of the incoming air can improve vapor absorption by the carbon deposit 515. For example, the management system can activate the cooler if the received temperature exceeds a predetermined threshold.

In one example embodiment, the management system can instruct the valve 123 to cause recirculation of the air based on the temperature of the incoming air and the temperature of the air coming out of the air output 113. For example, if the temperature of the air flowing out of the air output 113 is below the ambient temperature, it would be wasteful for the absorption unit to send the air to the exhaust pipe 115 because the incoming air is warmer than the air coming out of the output 113. The management system can receive the temperature of the incoming air and the temperature of the air coming out of the air output 113 from temperature sensors located on the absorption unit 100, e.g., on the air first, pump, air intake 111, air output 113, etc.

In another mode of operation, the management system of the immersion cooling system detects an undesired decrease in the pressure of the tank, e.g., a drop in the computing demand of the computing device. The management system determines that the pressure has to be increased. As such, the management system can direct vapor from the absorption unit to the tank (e.g., opening valves connecting the absorption unit 100 to the tank) to increase the pressure of the tank. In this mode of operation of the absorption unit 100, the pump 121 can direct warm air at the tubular elements 410 so that the dielectric molecules captured by the carbon deposit on these tubular elements 410 vaporizes.

In one example, the carbon deposit 515 is on the inside of the tubular elements 410. In the mode of operation in which the absorption unit 100 intends to vaporize captured dielectric fluid molecules (and thereby increase the pressure of the tank), the valve 123 can connect the air output 113 to the pump 121. The valve 123 can disconnect the air filter 122 and the exhaust pipe 115. The management system can direct the heater 125 to warm the air flow. The management system can also direct the pump 121 to circulate the air flow 520 to warm the tubular elements 410, and thus, facilitate desorption of the vapor molecules by the carbon deposit 515. For example, the pump 121 can cause the air to flow into the air intake 111 and travel on the outside (i.e., in between) the tubular elements 410 as the air flow 520. When the air flow 520 travels in between the tubular elements 410, the air flow 520 can increase the temperature of the tubular elements 410, and thus, accelerate desorption of the vapor molecules captured by the carbon deposit 515. Once the air flow 520 exits the housing 131 via the air output 113, it can go to the valve 123, which connects the air output 113 to the pump 121 again. Thus, the air flow 520 can recirculate in the absorption unit and vaporize the dielectric fluid. The management system can direct the vaporized fluid (i.e., vapor flow 530) to the tank, and thus, the vapor can increase the pressure of the tank.

In one example, if the ambient air is warm enough, the management system can direct the value 123 (and the actuator 124) to draw air from the ambient environment surrounding the absorption unit 100 using the air filter 122.

In one example embodiment, the air circulation system of the absorption unit 100 can operate at atmospheric pressure. For example, the absorption unit 100 can include one or more pressure sensors, e.g., at the air filter 122, before or after the pump 121, before or after the air intake 111, before or after the air output 113, or at the valve 123. The pressure sensors can measure the pressure within the path of the air being circulated within the system. If the air pressure increases over atmospheric pressure (±a threshold tolerance), the management system can direct the valve 123 to release the air within the system. Specifically, the management system can receive a pressure reading from one or more of the pressure sensors. If the reading exceeds an allowable threshold range, the management system can direct the valve 123 to open the exhaust pipe 115 so that the system can be balanced again.

In one example embodiment, an immersion cooling system can include a plurality of absorption units 100. In one example, each absorption unit can operate the same function (e.g., absorb or desorb vapor at the same time). In another example, the absorption units can be complementary, e.g., one can be an absorption unit (some of the time or all the time) and the other one can be a desorption unit (some of the time or all the time).

In one example embodiment, an immersion cooling system can use air-heated absorption units to maintain or control the pressure within a tank. Air-heated absorption units can be more consistent for distributing the heat within the housing of the absorption unit. Additionally, air-heated absorption units can last longer, and in case they fail, it is easier to replace the heating element because the heating element is not located within the housing of the absorption unit.

In one example embodiment, the absorption unit can include a bypass valve for pressure release in emergencies. This is a safety feature of the absorption unit. The absorption unit can have a valve which disconnects it from the tank. Additionally or alternatively, the absorption unit can have a bypass valve which can connect the vapor channel of the absorption unit to the surrounding environment. The bypass valve can be located, e.g., before the vapor intake 112 or after the vapor output 114. In the event there is an over-pressurization condition in the absorption unit, the valve can release the vapor to the surrounding environment. Similarly, in the event there is an under-pressurization condition in the absorption unit, the valve can receive air from outside to normalize the condition within the absorption unit. The management system can receive sensor data from sensors placed at various locations in the absorption unit (e.g., pressure or temperature sensors placed before or after the vapor intake 112 or the vapor output 114). The data can indicate whether there is a pressure condition within the tank. Based on the sensor data, the management system can order the bypass valve to open and/or normalize the pressure.

In one example embodiment, in addition to pressure and temperature, the management system can receive and monitor data from the absorption unit relating to electrical power of the absorption unit. The management system ensures that current is running through the absorption unit. The management system can shutdown the absorption unit if there is an overcurrent issue or if there is an over-pressurization condition.

In one example, the height and radius of the absorption unit can be designed based on the size of the vessel and the volume of fluid in the tank.

In one example embodiment, the management system can determine whether the air filter 122 needs to be replaced. For example, the absorption unit 100 can include a pressure sensor before or after the air filter 122. In the event the pressure reading of the pressure sensor deviates from a normal reading by more than a predetermined tolerance range, the management system can determine that the air filter 122 needs to be replaced. The management system can cause the immersion cooling system to notify an operator of the system to replace the air filter. The air filter 122 can filter dust and particulates.

Predictive Model

In one example embodiment, the management system can activate the absorption unit based on a classification by a machine learning model or a predictive model. For example, the immersion cooling system can receive the machine learning or predictive model from a central server or the immersion cooling system can train the model based on data that it collects over time. The predictive model can be developed by machine learning algorithms. In an embodiment, the machine learning algorithms employed can include at least one selected from the group of gradient boosting machine, logistic regression, neural networks, and a combination thereof, however, it is understood that other machine learning algorithms can be utilized. In an embodiment, the predictive model can be developed using foundational testing data generated by the immersion cooling system and/or the central server. The foundational testing data can be stored in one or more databases.

The predictive model can include continuous learning capabilities. In some examples, the database(s) can be continuously updated as new data is collected, e.g., each time the predictive model makes a prediction, the operator of the system can confirm or reject the model's prediction in a user interface of the immersion cooling system. The central server can aggregate and provide the data to all the immersion cooling system that communicate with the central server. The new data can be incorporated into the training of the predictive model, so that the predictive model reflects training based on data from various points in time and by various operators.

Initially, there may not be sufficient foundational testing data available to develop the predictive model. Accordingly, the initial model development can be performed using predetermined classifications as a proxy target and data available from other sources as features (e.g., data collected from other operators). By doing so, the predictive model can begin to form its understanding of conditions that require intervention by the absorption unit. The results of this initial modeling can support the initial status of the predictive model, and the model can be continuously improved as data from operators becomes available. Once trained, the predictive model can be utilized to predict when the absorption unit manage a pressure condition for the tank.

In some examples, the predictive model can be stored on the immersion cooling system. Locally storing the model can realize the benefit of reduced response times where predictions and trigger signals can be more quickly issued. In other examples, the predictive model can be stored on the cloud or the central server, which can allow for centralized maintenance of the predictive model and greater accessibility of the model for training. In examples where the predictive model is locally stored, the predictive model can be trained on the cloud and synchronized across the local computing devices. Alternatively, the predictive model can be trained continuously when locally stored and synchronized across computing devices.

In one example embodiment, the training data for the predictive model can include temperature and pressure data. These data points can be collected by various sensors placed within and/or outside of the immersion cooling system. For example, the sensors can be located within the absorption unit (e.g., to measure the pressure and/or temperature within the unit), within the tank (e.g., to measure the pressure and/or temperature within the tank), within the vessel and outside of the vessel. In one example embodiment, the training data can include an identification of an event in connection with the immersion cooling system, e.g., startup, shutdown, hot swap, a spike or drop in the processing demand. In one example embodiment, the training data can include a type of compute, e.g., GPU processing, CPU processing or storage of data. In one example embodiment, the management system can receive data from other entities and make the prediction based on data received from these entities. For example, the management system can receive data relating to the current weather, a weather forecast, a news feed (e.g., stock prices, cryptocurrency prices, market conditions and metrics for cryptocurrencies, etc.).

In one example embodiment, the management system can feed various types of data to the predictive model to determine whether the absorption unit needs to be activated to address a predicted pressure condition. For example, the management system can provide the model with data such as the current reading of the pressure and temperature sensors, a requested event, a current type of compute, a weather forecast, and a volatility level in the cryptocurrency market. Based on these types of data, the predictive model can predict whether the absorption unit needs to start addressing a predicted future pressure condition. For example, when there is volatility in the cryptocurrency market, users place more orders, and thus, the demand for processing compute increases. In such conditions, the vapor pressure can increase in the tank, and thus, the absorption unit will have to remove some of the excess vapor. The predictions by the prediction model can result in the absorption unit addressing a pressure condition before the condition actually occurs, and thus, can reduce the response time for the absorption unit.

Process of Immersion Cooling

1. A method comprising:
    at least partially submerging a computer component in a thermally conductive, condensable dielectric fluid, wherein:
        the computer component is mounted in a chassis comprising a backplane for receiving power from a rack; and
        the computer component is configured to dissipate heat in the dielectric fluid when the computer component operates;
    condensing, using a condenser, a gas phase of the dielectric fluid to a liquid phase of the dielectric fluid;
    wherein the rack is within a tank comprising a pressure controller to reduce or increase an interior pressure of the tank.

2. The method of embodiment 1, wherein the tank has a computing power density of at least 300 W of computing power dispersed over each square foot of space.

3. The method of embodiment 1, further comprising removing the chassis from the rack using a robot, wherein the robot is located within the tank.

4. The method of embodiment 3, further comprising delivering, using the robot, the chassis to an airlock, wherein the airlock is configured to allow access to an interior of the tank without significantly disrupting a pressure within the tank.

5. The method of embodiment 4, further comprising:
    opening an inner door of the airlock;
    placing the chassis in the airlock;
    closing the inner door of the airlock;
    equalizing a pressure of the airlock with an atmospheric pressure; and
    opening the outer door of the airlock.

6. The method of embodiment 3, further comprising storing, using the robot, the chassis in a magazine.
7. The method of embodiment 6, wherein the magazine is located on a platform including a supporting member, a rotating member and a rail.
8. The method of embodiment 3, wherein the robot is a gantry robot configured to remove, replace, or install the chassis.
9. The method of embodiment 8, wherein the gantry robot is configured to move on a horizontal plane and drop down vertically.
10. The device of embodiment 9, wherein the robot is configured to remove, replace, or install a component of a power distribution system.
11. The method of embodiment 10, wherein the robot includes a gripping tool for grabbing the chassis.
12. The method of embodiment 1, wherein the tank is mounted within a super structure which includes a plurality of tanks.
13. The method of embodiment 1, further comprising removing contaminants from the dielectric fluid.
14. The method of embodiment 1, further comprising removing gaseous contaminants.
15. The method of embodiment 1, further comprising providing power, network connection and process fluid to the tank.
16. The method of embodiment 1, wherein the tank comprises an opening on the top and a removable lid.
17. The method of embodiment 1, wherein the tank comprises an interior volume of between about 100 cubic feet and about 300 cubic feet.
18. The method of embodiment 1, wherein the chassis does not include a heat sink and a fan.
19. The method of embodiment 1, wherein the chassis includes a blade server, a processor, a power supply or an interface card.
20. The device of embodiment 19, wherein the backplane is electrically connected to an interface card, which is a Cat6A or a Cat? compatible RJ45 interface for connection to a 1G or a 10G Ethernet interface.

Vessel Design and Configurations for Immersion Cooling
1. A device comprising:
    a tank configured to hold thermally conductive, condensable dielectric fluid;
    a pressure controller to reduce or increase an interior pressure of the tank;
    a rack at least partially submerged within the dielectric fluid;
    a condenser for condensing a gas phase of the dielectric fluid; and
    a robot configured to move a chassis within the rack.
2. The device of embodiment 1, wherein the device comprises a modular skid comprising a plurality of forklift tubes.
3. The device of embodiment 1, wherein the tank has a computing power density of at least 300 W of computing power dispersed over each square foot of space.
4. The device of embodiment 1, wherein an exterior of the device includes a power input and a communication input.
5. The device of embodiment 4, wherein:
    the power input and the communication input are electrically connected to a box; and
    the box, using a plurality of wires, distributes the power input and the communication input to the rack.
6. The device of embodiment 5, wherein the rack includes a backplane receiver configured to distribute power and a communication signal to the chassis.
7. The device of embodiment 6, wherein the chassis includes a backplane configured to:
    receive the power and the communication signal from the backplane receiver of the rack; and
    distribute the power and the communication signal to a computer component within the chassis.
8. The device of embodiment 5, wherein the plurality of wires do not include plastic insulation.
9. The device of embodiment 5, wherein the rack includes a transofrmer.
10. The device of embodiment 1, wherein the device is stackable.
11. The device of embodiment 1, wherein the device comprises a magazine for storage of replacement components.
12. The device of embodiment 11, wherein the robot is configured to remove the chassis from the rack and place the chassis in the magazine.
13. The device of embodiment 12, wherein the magazine is located on a platform which includes a rotating member, a supporting member and a rail.
14. The device of embodiment 13, wherein the platform is configured to guide the magazine outside of the device.
15. The device of embodiment 1, wherein the device includes a desiccant configured to remove water vapor contamination from the device.
16. The device of embodiment 1, further comprising:
    a sump area;
    a pump; and
    a filter;
    wherein the pump is configured to remove the dielectric fluid from the sump area and pass the dielectric fluid through the filter before delivering the dielectric fluid to a bath portion of the tank.
17. The device of embodiment 1, wherein the dielectric fluid has a boiling point within a range of 20° C. to 100° C.
18. The device of embodiment 1, wherein the dielectric fluid comprises a chemical with a formula of, (CF3)2CFCF2OCH3, C4F9OCH3, CF3CF2CF2CF2OCH3, hydrofluoro ethers or methoxy-nonaflurobutane.
19. The device of embodiment 1, further comprising a lock that precludes the device from operating if any of a lid or a door of the device is not secured.
20. The device of embodiment 1, further comprising a controller configured to power down the device in the event of an unauthorized access to the lid or the door.

Robotics and Automation for Immersion Cooling
1. A device comprising:
    a tank configured to hold a thermally conductive, condensable dielectric fluid;
    a pressure controller to reduce or increase an interior pressure of the tank;
    a computer component at least partially submerged within the dielectric fluid;
    a condenser for condensing a gas phase of the dielectric fluid; and
    a robot configured to pick up the computer component.
2. The device of embodiment 1, further comprising an airlock.
3. The device of embodiment 2, wherein the airlock includes an inner door and an outer door.
4. The device of embodiment 3, wherein the airlock is configured to receive an inert gas to purge the gas phase of the dielectric fluid before the outer door is opened.
5. The device of embodiment 3, wherein the robot is located outside the tank.
6. The device of embodiment 3, wherein the robot is located within the tank.

7. The device of embodiment 6, wherein the robot is configured to remove the computer component from a rack and deliver the computer component to the airlock.
8. The device of embodiment 7, wherein the robot is further configured to:
   open the inner door of the airlock;
   place the computer component in the airlock;
   close the inner door of the airlock;
   equalize a pressure of the airlock with an atmospheric pressure; and
   open the outer door of the airlock.
9. The device of embodiment 8, further comprising a second robot located outside of the tank.
10. The device of embodiment 9, wherein the second robot is configured to remove the computer component from the airlock when the outer door is open.
11. The device of embodiment 9, wherein the second robot is configured to place the computer component within a storage slot.
12. The device of embodiment 9, wherein the airlock is configured to equalize the pressure of the airlock after the outer door is closed.
13. The device of embodiment 1, wherein the device is configured to receive instructions from a server located outside of the device.
14. The device of embodiment 1, wherein the computer component is located within a chassis showing an asset tag.
15. The device of embodiment 14, wherein the robot is configured to scan the asset tag and relay the asset tag to a management system.
16. The device of embodiment 1, wherein the robot is a gantry robot configured to remove, replace, or install the computer component.
17. The device of embodiment 16, wherein the gantry robot is configured to move horizontally and vertically.
18. The device of embodiment 1, wherein the robot is configured to remove, replace, or install a component of a power distribution system.
19. The device of embodiment 18, wherein the component of the power distribution system is a transformer or a power supply.
20. The device of embodiment 1, wherein the robot includes a gripping tool for gripping the computer component.

Ballast Blocks for Immersion Cooling

1. A device comprising:
   a tank comprising:
   a bath portion for holding thermally conductive, condensable dielectric fluid and a computer component; and
   a shelf portion configured to hold at least one ballast block;
   a pressure controller to reduce or increase an interior pressure of the tank;
   a condenser for condensing a gas phase of the dielectric fluid; and
   a robot configured to pick up the computer component.
2. The device of embodiment 1, wherein a bottom point of the bath portion has a lower height than a height of the shelf portion.
3. The device of embodiment 1, wherein the bath portion is configured for the computer component to be at least partially submerged in the dielectric fluid.
4. The device of embodiment 3, wherein the computer component is a blade server, a processor, a power supply, or a transformer.
5. The device of embodiment 1, wherein a level of the dielectric fluid is high enough to cover at least part of the shelf portion.
6. The device of embodiment 1, wherein the shelf portion is next to the condenser.
7. The device of embodiment 6, wherein the shelf portion is configured to receive condensed dielectric fluid from the condenser.
8. The device of embodiment 1, wherein the ballast block is configured to occupy a volume of the tank above the shelf to displace the dielectric fluid from the shelf to an area over the bath portion.
9. The device of embodiment 1, wherein the ballast block includes a plurality of riser feet for allowing the dielectric fluid to flow underneath the ballast block.
10. The device of embodiment 1, wherein the ballast block is not soluble in the dielectric fluid.
11. The device of embodiment 1, wherein the ballast block is made from a metal, a rubber, a silicone, or a polymer.
12. The device of embodiment 1, wherein the ballast block is denser than the dielectric fluid.
13. The device of embodiment 1, wherein the ballast block has a handle, cut out or a plate for removal or replacement of the ballast block.
14. The device of embodiment 13, wherein the robot is configured to lift the ballast block using the handle, the cut out or the plate.
15. The device of embodiment 1, wherein the ballast block is configured to interlock with another ballast block from a top side or a bottom side of the ballast block.
16. The device of embodiment 15, wherein the interlocking prevents the other ballast block from sliding.
17. The device of embodiment 15, wherein the other ballast block is configured to be on the top side or the bottom side of the ballast block.
18. The device of embodiment 15, wherein the ballast block comprises recessed portions on the top side of the ballast block such that a riser feet of the other ballast block is configured to lock in one of the recessed portions of the ballast block.
19. The device of embodiment 1, wherein the ballast block is configured to span at least 40% of an entire length of the shelf portion.
20. The device of embodiment 1, wherein the ballast block has an outer dimensions of about 2 feet long, about 8 inches wide and about 1 inch tall.

Server Case for Immersion Cooling

1. A device comprising:
   a tank configured to hold thermally conductive, condensable dielectric fluid;
   a pressure controller to reduce or increase an interior pressure of the tank;
   a chassis at least partially submerged within the dielectric fluid;
   a condenser for condensing a gas phase of the dielectric fluid; and
   a robot configured to pick up the chassis.
2. The device of embodiment 1, wherein the chassis does not require a heat sink or a fan.
3. The device of embodiment 1, wherein the chassis includes a blade server.
4. The device of embodiment 1, wherein the chassis includes a processor, a power supply or an interface card.
5. The device of embodiment 4, wherein the interface card is a Cat6A or a Cat7 compatible RJ45 interface for connection to a 1G or a 10G Ethernet interface.
6. The device of embodiment 1, wherein the chassis is removably attached to a rack.

7. The device of embodiment 6, wherein the chassis includes a backplane to provide a slot-in interface between the chassis and the rack.

8. The device of embodiment 7, wherein the backplane is configured to distribute power and signals received from the rack within the chassis.

9. The device of embodiment 8, wherein the backplane is configured to transmit power and data to a blade server via a cable.

10. The device of embodiment 1, wherein the chassis is a substantially rectangular box comprising a back wall and two sidewalls, wherein the back wall has a plurality of holes to facilitate circulation of the dielectric fluid within the chassis.

11. The device of embodiment 10, wherein the chassis comprises a guide rail on each of the two sidewalls.

12. The device of embodiment 1, wherein the chassis comprises a mounting interface for holding computer components.

13. The device of embodiment 1, wherein the chassis comprises a plate and the robot is configured to lift the chassis using the plate.

14. The device of embodiment 1, wherein the chassis includes a microcontroller.

15. The device of embodiment 14, wherein the microcontroller is configured to:
receive sensor data from a sensor mounted on the chassis, the sensor data indicating whether the chassis is properly placed in a rack; and
transmit the sensor data to a management system.

16. The device of embodiment 14, wherein the microcontroller is configured to:
receive a power signal from a management system; and
transmit the power signal to a switch configured to cutoff the power within the chassis.

17. The device of embodiment 14, wherein the microcontroller is configured to:
receive operation data from a computer component mounted within the chassis; and
transmit the operation data to the management system.

18. The device of embodiment 14, wherein the microcontroller is configured to control electrical and communication facilities of a blade server.

19. The device of embodiment 1, wherein the chassis comprises an RFID tag.

20. The device of embodiment 19, wherein the robot is configured to scan the RFID tag and transmit a signal to a management system.

Vapor Management for Immersion Cooling Using Bellows

1. A device comprising:
a tank configured to hold thermally conductive, condensable dielectric fluid and a computer component;
a pressure controller to reduce or increase an interior pressure of the tank;
a vapor management system for condensing a gas phase of the dielectric fluid; and
a robot configured to pick up the computer component.

2. The device of embodiment 1, wherein the vapor management system includes a condensing structure within the tank.

3. The device of embodiment 2, wherein the condensing structure includes a thermally conductive tube, a coil or radiator fins.

4. The device of embodiment 2, wherein the condensing structure is configured to be coupled to a source of cooling liquid so that the cooling liquid passes through the condensing structure.

5. The device of embodiment 2, wherein the device is configured to chill the cooling liquid using evaporative cooling or dry cooling towers.

6. The device of embodiment 2, wherein the vapor management system includes an incoming pipe and an outgoing pipe.

7. The device of embodiment 6, wherein the incoming pipe is configured to receive cooling liquid from a chilled cooling liquid source and guide the cooling liquid through the condensing structure.

8. The device of embodiment 6, wherein the outgoing pipe is configured to receive cooling liquid from the condensing structure and return the cooling liquid to the chilled cooling liquid source.

9. The device of embodiment 1, wherein the vapor management system includes a storage unit for storage of the dielectric fluid.

10. The device of embodiment 9, wherein the vapor management system is configured to direct the dielectric fluid in the tank from the storage unit.

11. The device of embodiment 1, wherein the vapor management system includes a vapor storage unit for storage of vapor of the dielectric fluid.

12. The device of embodiment 11, wherein the vapor storage unit is a bellows.

13. The device of embodiment 12, wherein the bellows are configured to inflate or deflate to maintain the interior pressure of the tank.

14. The device of embodiment 12, wherein the bellows comprises one or more pouches.

15. The device of embodiment 11, wherein the vapor storage unit comprises a valve for allowing air into the vapor management system to reduce a temperature of the vapor of the dielectric fluid.

16. The device of embodiment 15, wherein the vapor storage unit is operably connected to a carbon bed to separate the vapor of the dielectric fluid from air.

17. The device of embodiment 16, wherein the carbon bed comprises a desorption heater configured to heat the carbon bed to raise the temperature of the carbon bed.

18. The device of embodiment 1, wherein the vapor management system comprises a filter.

19. The device of embodiment 17, wherein the filter is configured to remove air and water vapor.

20. The device of embodiment 1, wherein the vapor management system:
comprises an inert gas storage unit; and
is configured to introduce an inert gas from the inert gas storage unit into the tank during a startup operation or a shutdown operation.

What is claimed is:

1. A system comprising: a tank configured to hold a thermally conductive, condensable dielectric fluid; a pressure controller to reduce or increase an interior pressure of the tank; a computer component in a rack wherein the computer component is at least partially submerged within the dielectric fluid; a condenser for condensing a gas phase of the dielectric fluid; a robot configured to pick up the computer component from the rack within the tank and deliver the computer component to a slot within a magazine and the magazine is cantilevered outside the tank; and wherein the magazine comprising the computer component from the robot in a substantially vertical position, is configured to rotate to a substantially horizontal position for transport by a magazine removal tool.

2. The system of claim 1, wherein the robot is located inside the tank.

3. The system of claim 1, wherein the robot is mounted on a movable base.

4. The system of claim 1, wherein the robot is configured to detect a location of the robot relative to the tank by detecting a flag.

5. The system of claim 4, wherein the flag is an RFID tag, a QR code, a colored surface or an alphanumerical code.

6. The system of claim 4, wherein the robot uses a sensor to detect the flag.

7. The system of claim 4, wherein the sensor is a motion sensor, an RFID detector, a camera, a rotation sensor, or an accelerometer.

8. The system of claim 1, wherein the computer component is located within a chassis.

9. The system of claim 8, wherein a gripping tool of the robot is configured to couple with a component of the chassis.

10. The system of claim 9, wherein the gripping tool includes a linkage mechanism or a pin.

11. The system of claim 9, wherein the component is a handle.

12. The system of claim 1, wherein the robot is configured to remove, replace, or install the computer component or a component of a power distribution system.

13. The system of claim 1, wherein the robot is controlled using an artificial intelligence system.

\* \* \* \* \*